United States Patent [19]

Ayata et al.

[11] Patent Number: 5,365,342
[45] Date of Patent: Nov. 15, 1994

[54] ALIGNMENT AND EXPOSURE APPARATUS AND METHOD FOR MANUFACTURE OF INTEGRATED CIRCUITS

[75] Inventors: Naoki Ayata, Machida; Mitsugu Yamamura, Yokohama; Bunei Hamasaki, Yokohama; Masao Kosugi, Yokohama; Kazuo Takahashi, Kawasaki; Mitsuaki Seki, Machida, all of Japan

[73] Assignee: Canon Kabushiki Kaisha, Tokyo, Japan

[21] Appl. No.: 29,363

[22] Filed: Mar. 10, 1993

Related U.S. Application Data

[60] Continuation of Ser. No. 685,449, Apr. 15, 1991, abandoned, which is a division of Ser. No. 542,653, Jun. 25, 1990, Pat. No. 5,050,111, which is a continuation of Ser. No. 271,360, Nov. 16, 1988, abandoned, which is a continuation of Ser. No. 788,494, Oct. 17, 1985, abandoned.

[30] Foreign Application Priority Data

| | | | |
|---|---|---|---|
| Oct. 18, 1984 | [JP] | Japan | 59-217307 |
| Nov. 30, 1984 | [JP] | Japan | 59-251924 |
| Nov. 30, 1984 | [JP] | Japan | 59-251925 |
| Nov. 30, 1984 | [JP] | Japan | 59-251926 |
| Nov. 30, 1984 | [JP] | Japan | 59-251927 |
| Nov. 30, 1984 | [JP] | Japan | 59-251928 |
| Nov. 30, 1984 | [JP] | Japan | 59-251929 |
| Nov. 30, 1984 | [JP] | Japan | 59-251930 |
| Dec. 20, 1984 | [JP] | Japan | 59-267454 |
| May 13, 1985 | [JP] | Japan | 60-99512 |
| May 13, 1985 | [JP] | Japan | 60-99513 |

[51] Int. Cl.$^5$ ............................................. G01B 11/00
[52] U.S. Cl. ........................................ 356/401; 355/53
[58] Field of Search .............................. 356/399–401; 250/548, 561; 355/53

[56] References Cited

U.S. PATENT DOCUMENTS 4,153,371  5/1979  Koizumi et al. ................ 356/400
4,629,313  12/1986  Tanimoto ........................ 355/53

Primary Examiner—Richard A. Rosenberger
Assistant Examiner—K. P. Hantis
Attorney, Agent, or Firm—Fitzpatrick, Cella, Harper & Scinto

[57] ABSTRACT

An alignment apparatus includes a first off-axis alignment optical system having a magnification, and a second off-axis alignment optical system having a magnification higher than that of the first off-axis alignment optical system, wherein the apparatus is operable in a global alignment mode using the second off-axis alignment optical system. In another aspect, an alignment apparatus which includes a first off-axis alignment optical system having a magnification, a second off-axis alignment optical system having a magnification higher than that of the first off-axis alignment optical system, and a TTL alignment optical system, wherein the alignment apparatus is operable in a global alignment mode using the second off-axis alignment optical system and is operable in another global alignment mode using the TTL optical alignment system.

21 Claims, 48 Drawing Sheets

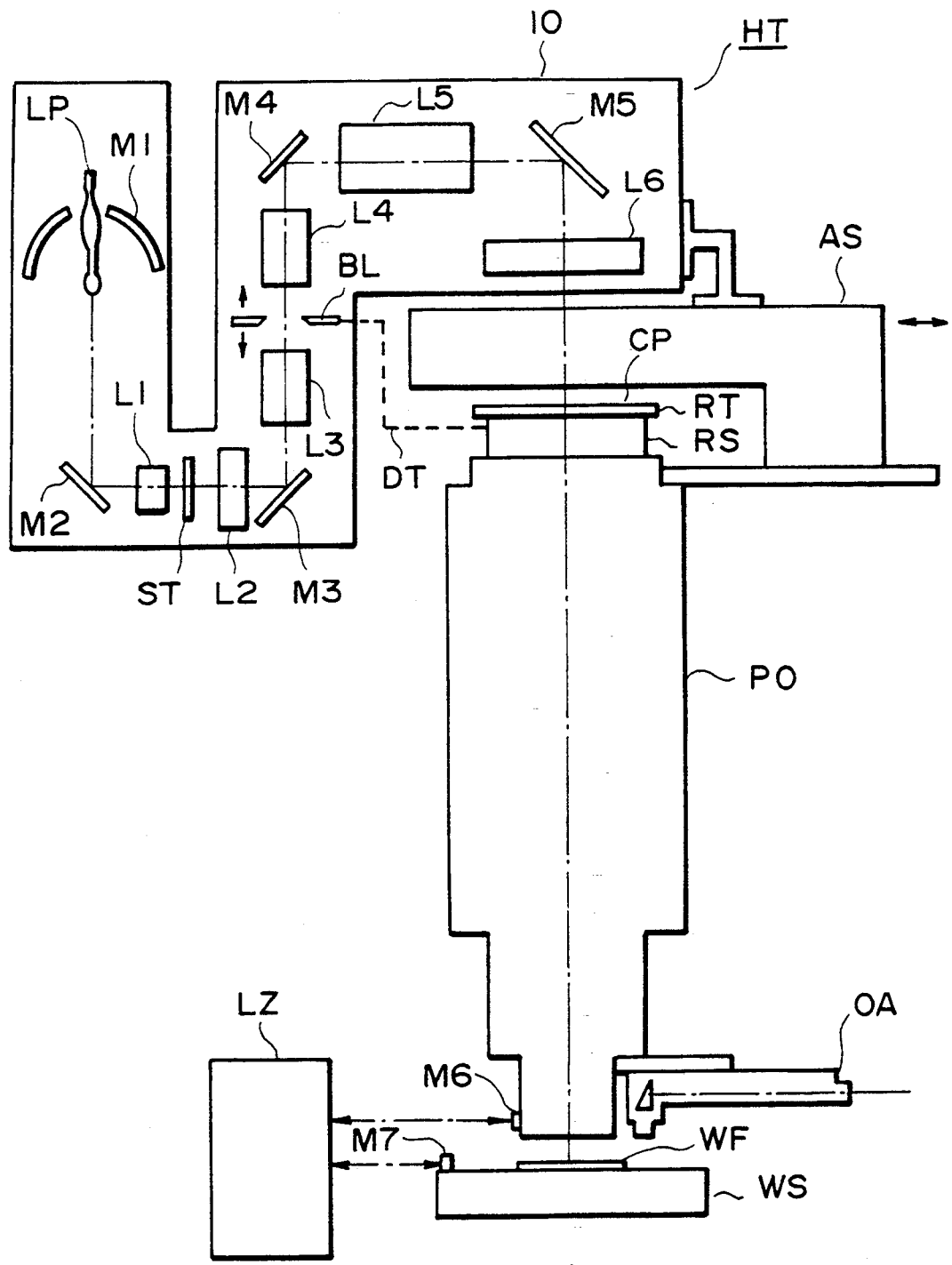
F I G. 1

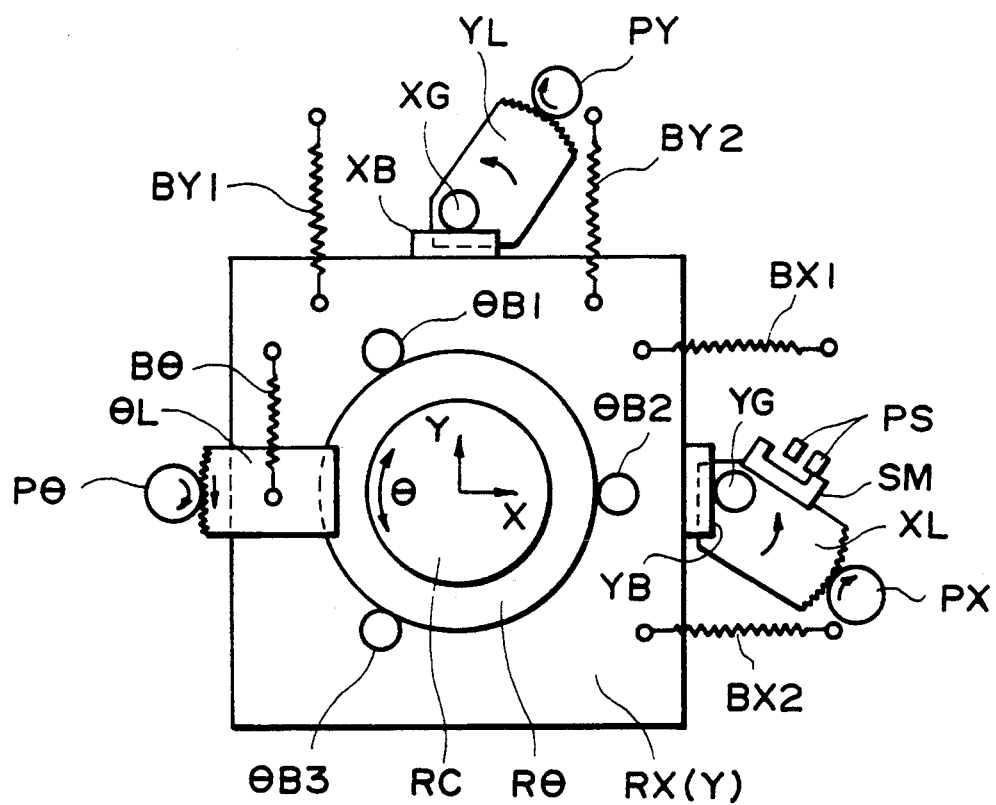
F I G. 4

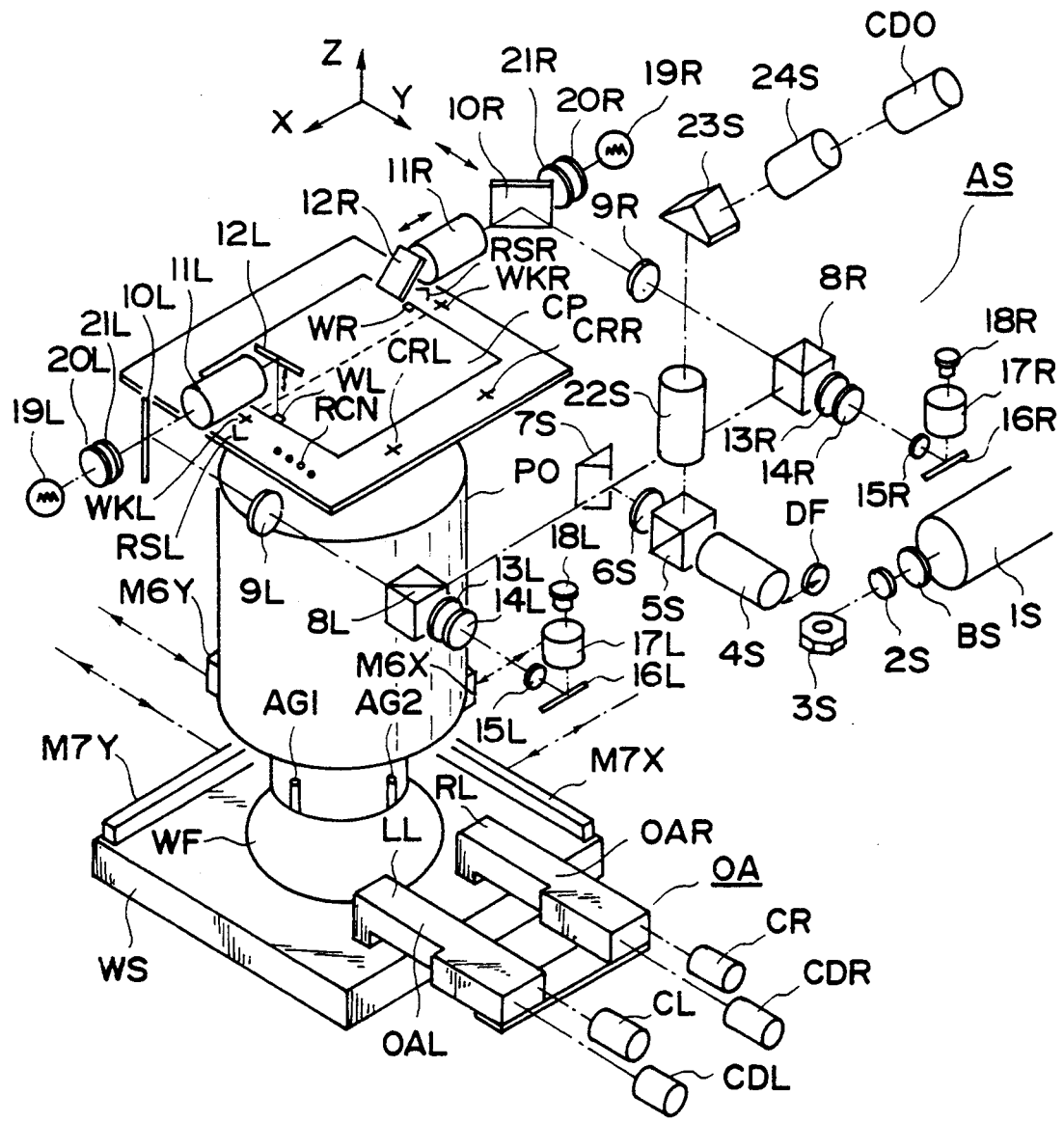
F I G. 5

| ITEM / ACCESS | RAM ADDRESS | | | | SET DATA | NAME OF STORING CKT |
|---|---|---|---|---|---|---|
| | A3 | A2 | A1 | A0 | | |
| POINT A START (PHASE 1) | O | - | 0 | 0 | ZERO SPEED | PCV |
| | | | 0 | 1 | MAX. SPEED | CLV |
| | | | 1 | 0 | GRADIENT OF ACCEL A-B | FG |
| | | | 1 | 1 | DISPL TO POINT C | RPL |
| POINT C CHANGEOVER TO SP DOWN (PHASE 2) | - | O | 0 | 0 | MAX. SPEED | PCV |
| | | | 0 | 1 | MIN. SPEED | CLV |
| | | | 1 | 0 | GRADIENT OF DECEL C-D | FG |
| | | | 1 | 1 | DISPL TO POINT E | RPL |
| POINT E CHANGEOVER TO SP DOWN (PHASE 3) | - | - | 0 | 0 | DISPL TO POINT E | PCV |
| | | | 0 | 1 | TARGET POSITION P | CLV |
| | | | 1 | 0 | GRADIENT OF POS SERVO E-F | FG |
| | | | 1 | 1 | TARGE STOP POINT P | RPL |

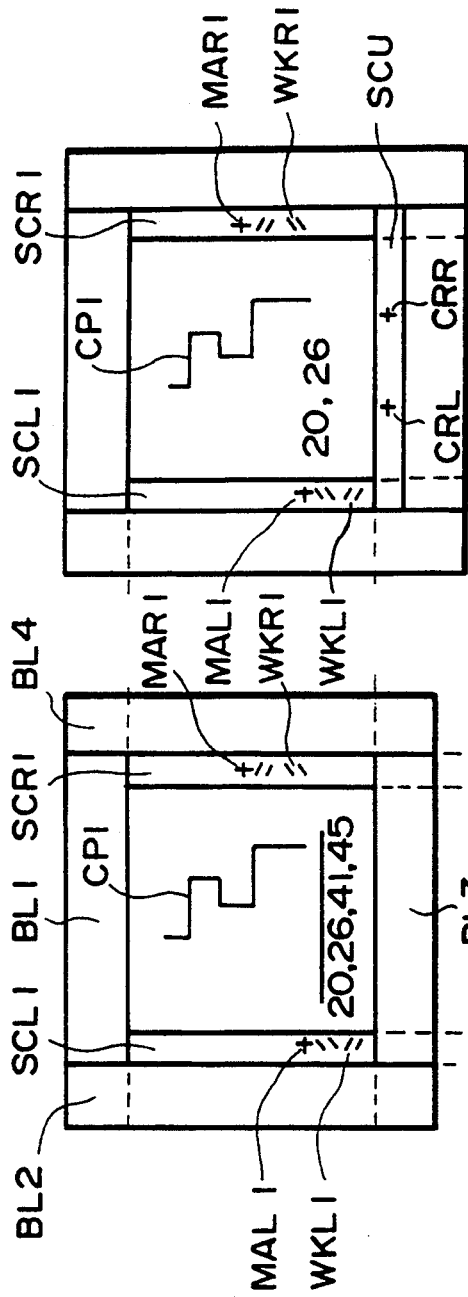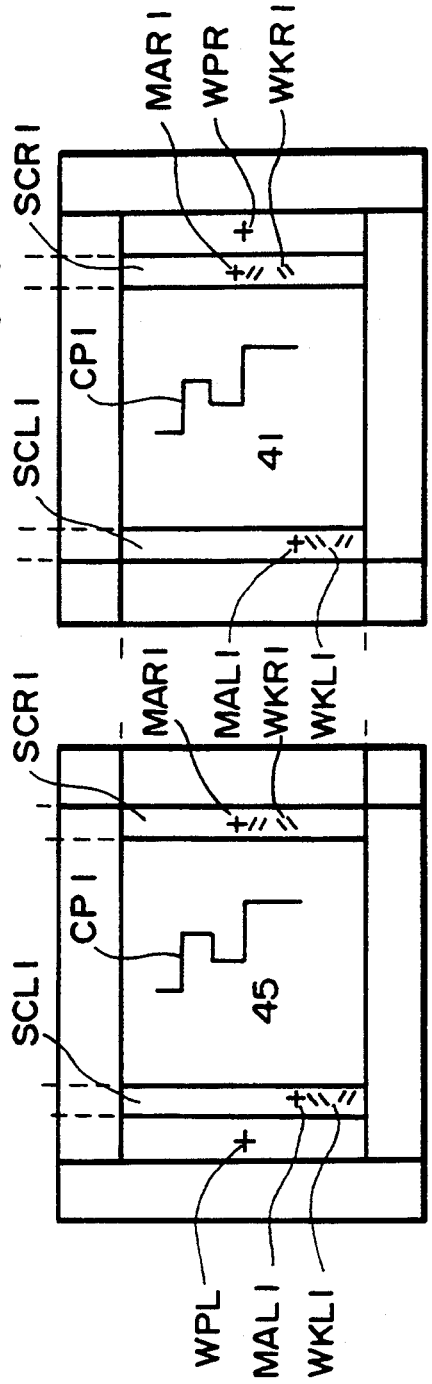

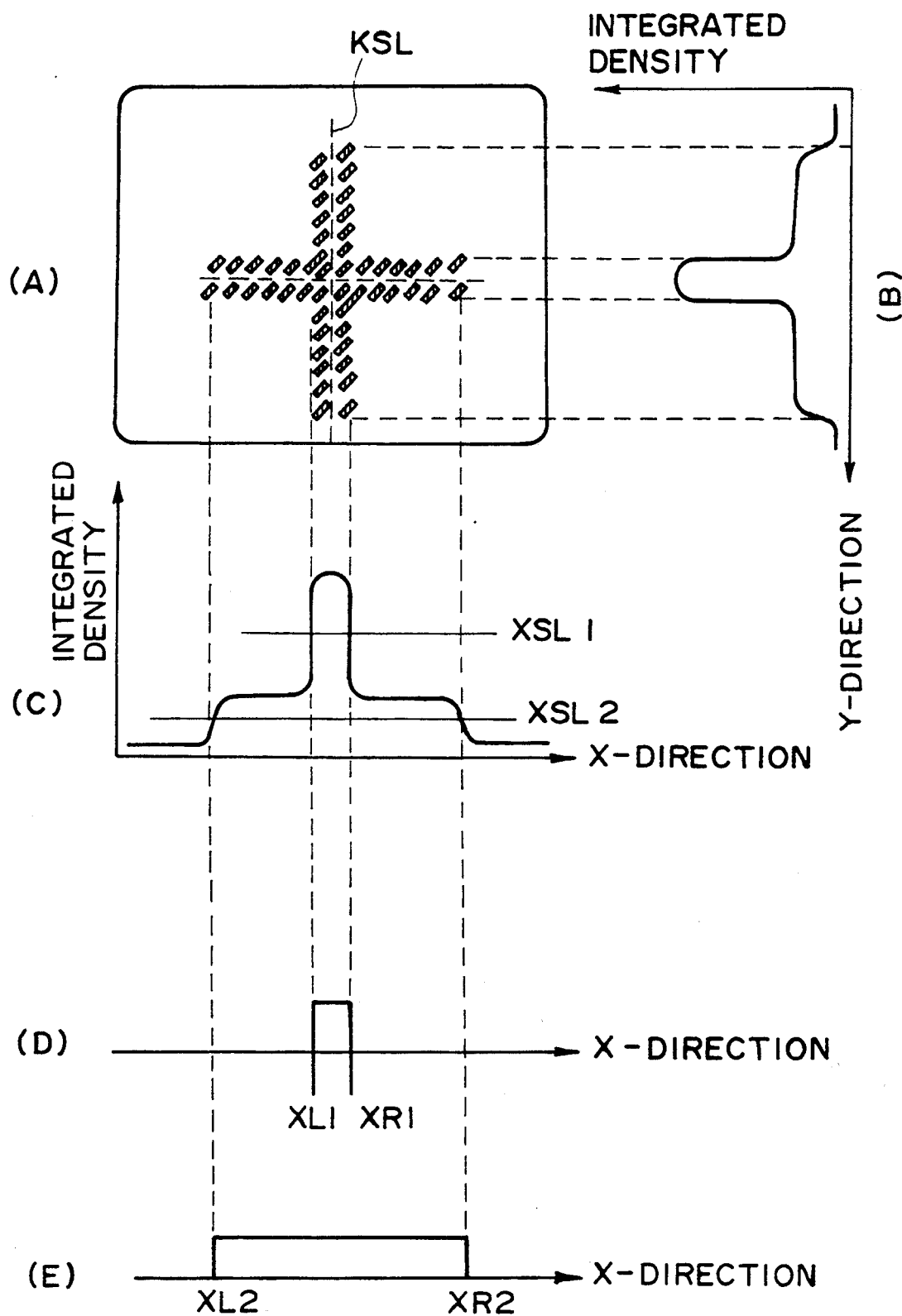
F I G. 19

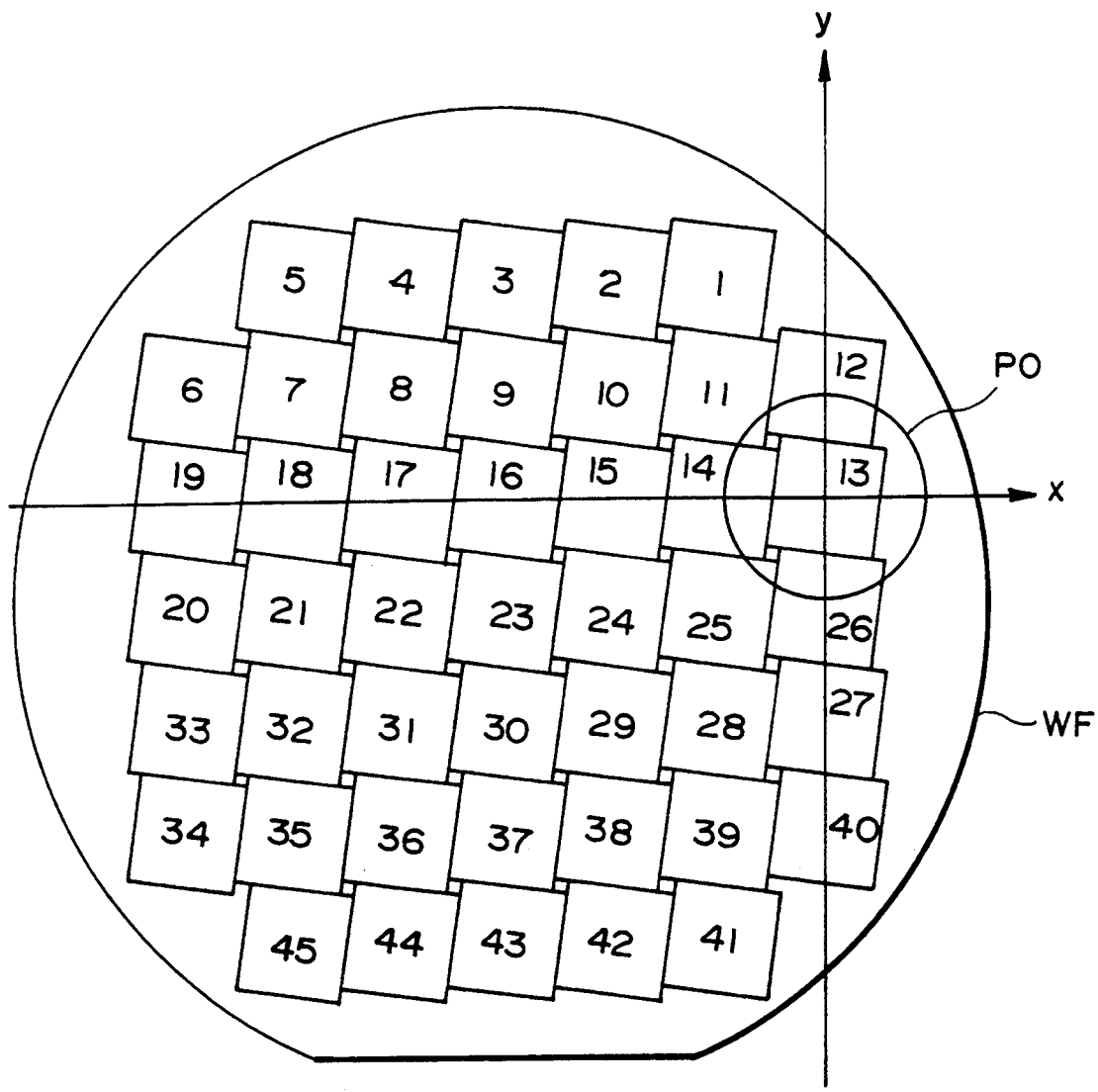
F I G. 27A

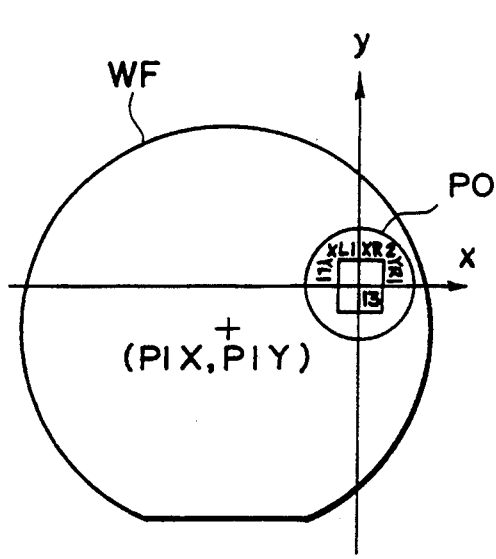
FIG. 28(A)
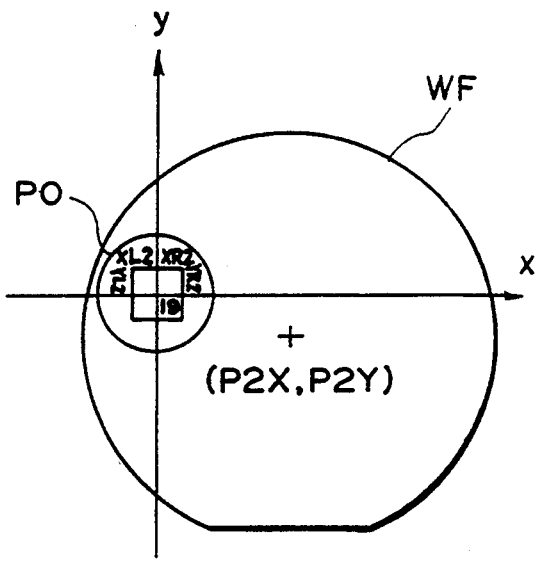
FIG. 28(B)
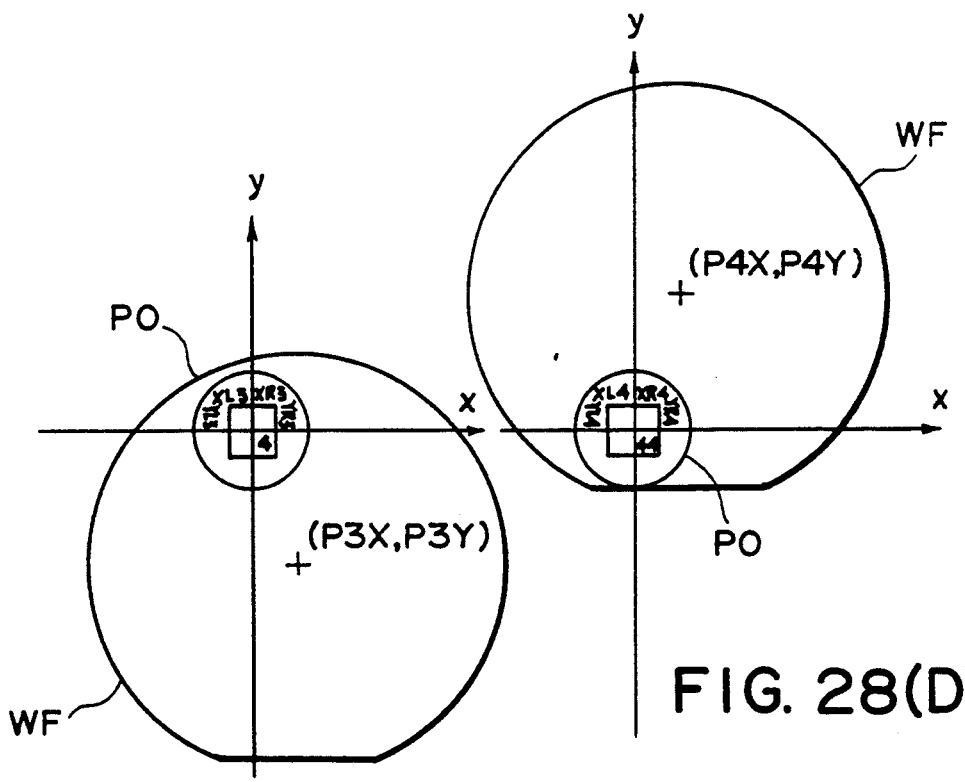
FIG. 28(C)
FIG. 28(D)

ALIGNMENT AND EXPOSURE APPARATUS AND METHOD FOR MANUFACTURE OF INTEGRATED CIRCUITS

This application is a continuation of application Ser. No. 07/685,449 filed Apr. 15, 1991 now abandoned, which is a divisional of application Ser. No. 07/542,653 filed Jun. 25, 1990, which is now U.S. Pat. No. 5,050,111 issued Sep. 17, 1991, which is a continuation of application Ser. No. 07/271,360 filed Nov. 16, 1988 now abandoned, which is a continuation of application Ser. No. 06/788,494 filed Oct. 17, 1985 now abandoned.

FIELD OF THE INVENTION AND RELATED ART

This invention relates to an alignment and exposure apparatus and a method for use in the manufacture of semiconductor devices such as integrated circuits.

In the field of manufacture of semiconductor devices, various types of alignment and exposure apparatuses have already been developed. In view of, however, recent dramatic improvements in the semiconductor devices themselves, it is still desired to develop alignment and exposure apparatuses which are further improved in respect to pattern overlay accuracies (alignment accuracies), yield adaptability with other semiconductor-manufacturing apparatuses, compactness in size of the apparatus, etc.

SUMMARY OF THE INVENTION

It is accordingly a primary object of the present invention to provide an improved alignment and exposure apparatus and method which assure high pattern overlay accuracies.

It is another object of the present invention to provide an improved alignment and exposure apparatus and method which assure a high yield.

It is a further object of the present invention to provide an improved alignment and exposure apparatus and method which assure a high adaptability with other semiconductor-manufacturing apparatuses.

It is a still further object of the present invention to provide an improved alignment and exposure apparatus and method which assure, with a simple structure, high pattern overlay accuracies, high yield, a high adaptability with other semiconductor-manufacturing apparatus, etc.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a sectional view schematically showing an alignment and exposure apparatus according to an embodiment of the present invention.

FIG. 4 is a plan view of the reticle stage of FIG. 3.

FIG. 5 is a perspective view schematically showing an optical arrangement of the alignment and exposure apparatus of FIG. 1.

FIG. 11 shows the content of a random access memory of the system of FIG. 9.

FIGS. 17(a–d) are schematic views showing the positional relation between the reticle and a light-transmitting aperture of the edge-masking device.

FIG. 19 is a schematic view showing the integration of density and the setting of slice level.

FIGS. 27A and 27B are plan views, respectively, schematically showing an example of alignment operation, according to the present invention.

FIGS. 28(a–d) are schematic views showing another example of alignment operation according to the present invention.

DESCRIPTION OF THE PREFERRED EMBODIMENTS

Figure 2:
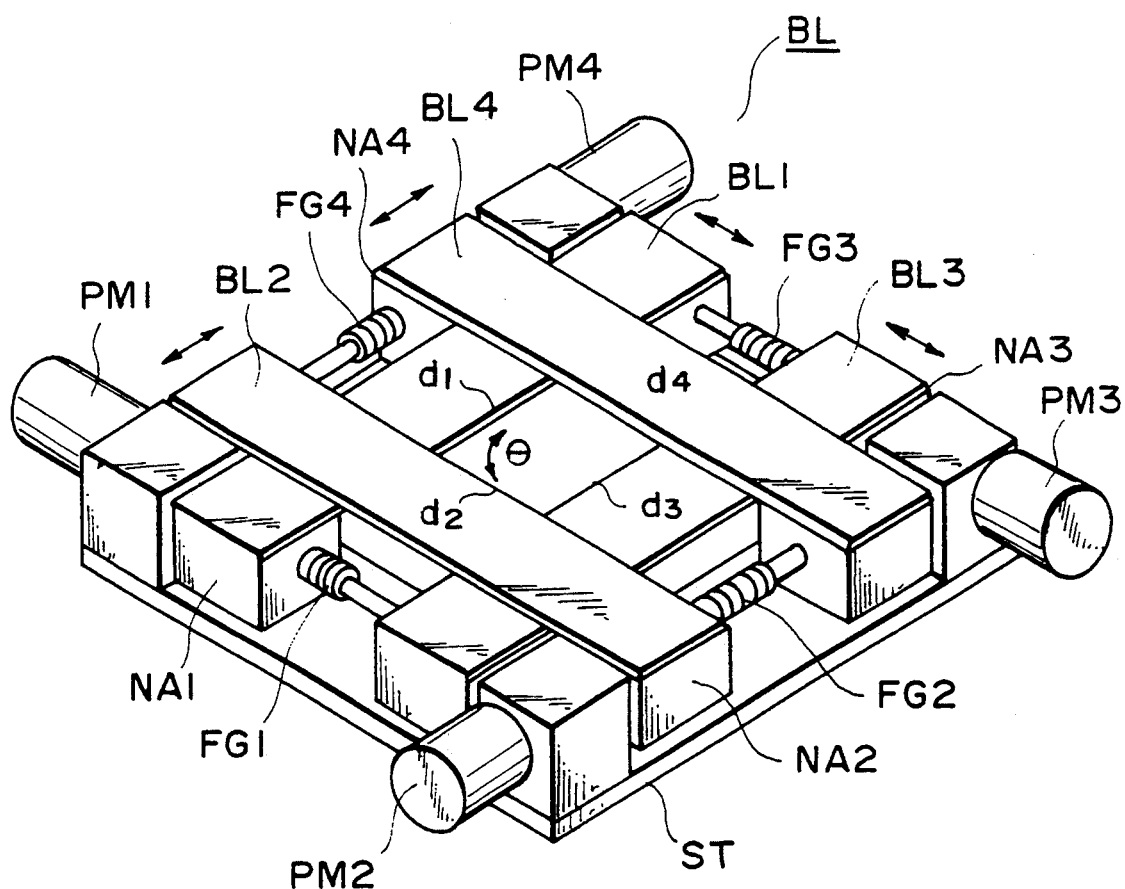
FIG. 2 is a perspective view of an edge-masking device used in the embodiment of FIG. 1.

The invention in one aspect relates to an apparatus for aligning an object including an alignment system for automatically aligning the object. Storing means stores a plurality of automatic alignment modes in accordance with each alignment system which is operable to effect automatic alignment of the object. Selecting means selects one of the automatic alignment modes and causes the alignment system to effect automatic alignment in accordance with the selected alignment mode. In addition, a reading means reads an alignment mark on the object and discriminating means responsive to the reading means discriminates ineffectiveness of the automatic alignment by the alignment system in accordance with the selected alignment mode, wherein the discriminating means is operable to cause the selecting means to select another automatic alignment mode when the automatic alignment in accordance with the previously selected alignment mode is discriminated as being ineffective.

Referring first to FIG. 1, there is shown an alignment and exposure apparatus, according to an embodiment of the present invention, for use in the manufacture of semiconductor devices. As will be described later in detail, the alignment and exposure apparatus is arranged to align a reticle RT with a wafer WF and to transfer a circuit pattern CP formed on the reticle RT onto the surface of the wafer WF.

The alignment and exposure apparatus includes an illumination optical system IO which comprises a light source LP such as a super Hg lamp for supplying a light beam to be used for the sake of exposure of the wafer WF relative to the circuit pattern CP of the reticle RT. Disposed in the vicinity of the lamp LP is an elliptical mirror M1 for effectively collecting the rays emitted from the lamp LP. The illumination optical system IO further includes, along the path of light, a cold mirror M2 effective to transmit infrared rays but to reflect ultraviolet rays, an integrator lens system L1 for making uniform the distribution of the light beam, a shutter ST, a lens system L2, a reflecting mirror M3, a lens system L3, a light-intercepting device or edge-masking device BL, a lens system L4, a reflecting mirror M4, a lens system L5, a reflecting mirror M5 and a lens system L6. The light emerging from the lens system L6 is incident on the reticle RT. Each of the reflecting mirrors M3, M4 and M5 is provided in order to deflect the optical path at a right angle to thereby reduce the size of the apparatus. The lens system L3 is provided to condense the light beam from the light source LP to illuminate the light-intercepting device BL uniformly.

The alignment and exposure apparatus further includes a TTL (Through The Lens) alignment optical system AS, a reticle stage RS for carrying thereon the reticle RT movably in the directions of X, Y and $\theta$, a projection lens system PO of reduction imaging type having a reduction ratio of 1:5–1:10, an off-axis alignment optical system OA and a wafer stage WS for carrying thereon the wafer WF movably in the directions of X, Y, Z and $\theta$. The term "TTL alignment" referred to in this Specification means to align or position a wafer on the basis of the result of detection of the position of the wafer "through" a projection lens system. Also, the term "off-axis alignment" referred to in this Specification means to align or position a wafer on the basis of the result of detection of the position of the wafer through an optical system provided outside a projection lens system. Denoted in FIG. 1 by reference LZ is a laser interferometer which is provided to control the movement of the wafer stage WS, in cooperation with a mirror M6 mounted on the projection lens system PO and a mirror M7 mounted on the wafer stage WS.

FIG. 2 is a perspective view showing details of the light-intercepting device BL. Owing to the provision of the lens systems L4, L5 and L6 in FIG. 1, the light-interception plane of the device BL is disposed so as to be optically conjugate with the plane of the circuit pattern CP of the reticle RT. The light-intercepting device BL is movable in the direction of the optical axis, so that, if the reticle RT is replaced by another reticle whose glass substrate has a different thickness, the light-interception plane can be displaced in the direction of the optical axis so as to compensate for the change in the optical path length due to the change in the refracting power, to thereby maintain the optically conjugate relation. Also, the light-intercepting device BL is rotationally movable by means of an unshown driving mechanism in the direction of $\theta$ (FIG. 2), in association with the rotational movement of the reticle RT, in order to allow alignment with the wafer WF, disposed below the reticle RT, with respect to the rotational direction.

The light-intercepting device BL includes four pulse motors PM1–PM4; four feed screws FG1–FG4 coupled to rotational shafts of the pulse motors PM1–PM4, respectively, for rotation therewith; four feed nuts NA1–NA4 each of which is in mesh-engagement with an associated one of the feed screws FG1–FG4 so as to be moved in one direction by the rotation of the feed screw; and four light-blocking blades BL1–BL4 having keen side edges d1–d4 of knife-edge shape, respectively. These four knife-edges d1–d4 of the blades BL1–BL4 cooperate to define a light-transmitting aperture of rectangular shape, such as shown in FIG. 2. All the above-described elements of the light-intercepting device BL are supported by a base plate ST.

When, in operation, the shutter ST shown in FIG. 1 is opened, the light beam emitted from the light source LP, after reflection or refraction by the optical elements M1–M4, uniformly illuminates the light-intercepting device BL. The rays impinging on the portion of the light-intercepting device BL outside the light-transmitting aperture are blocked by the four light-blocking blades BL1–BL4, while the rays entering into the aperture are transmitted so that they illuminate the plane of the circuit pattern CP of the reticle RT, such as shown by solid line in FIG. 1. Since the light-interception plane of the light-intercepting device BL is optically conjugate with the plane of the circuit pattern CP of the reticle RT, the edges of the blades BL1–BL4, defining the light-transmitting aperture, are sharply imaged on the plane of the circuit pattern CP. In other words, a sharp image of the light-transmitting aperture of the light-intercepting device BL is formed on the plane of the circuit pattern CP. As a result, the area on the reticle RT outside the circuit pattern CP area can be completely blocked against the incidence of light.

The light-intercepting device BL is rotationally movable in the $\theta$ direction (FIG. 2) for the purpose of alignment, in the rotational direction, with the circuit pattern CP area of the reticle RT and is also movable in the direction of the optical axis, such as denoted by arrows in FIG. 1. In order to maintain the optically conjugate relation with the plane of the circuit pattern PC of the reticle RT, as described hereinbefore. In addition, the position and area of the light-transmitting aperture of the light-intercepting device BL can be changed in a plane perpendicular to the optical axis. For this purpose, each of the light-blocking blades BL1–BL4 is movable independently from the others, such as denoted by double-headed arrows in FIG. 2, by the movement of an associated one of the feed nuts NA1–NA4 caused by the rotation of corresponding one of the feed screws FG1–FG4. The drive of each of the pulse motors PM1–PM4, for rotating an associated one of the feed screws FG1–FG4 connected thereto, is controlled by a signal supplied thereto from an electronic processing unit of the alignment and exposure apparatus. Such movement and adjustment of the four light-blocking blades BL1–BL4 can be achieved at one time. Thus, the illumination area on the reticle RT to be exposed to the light can be controlled, as desired.

Figure 3:
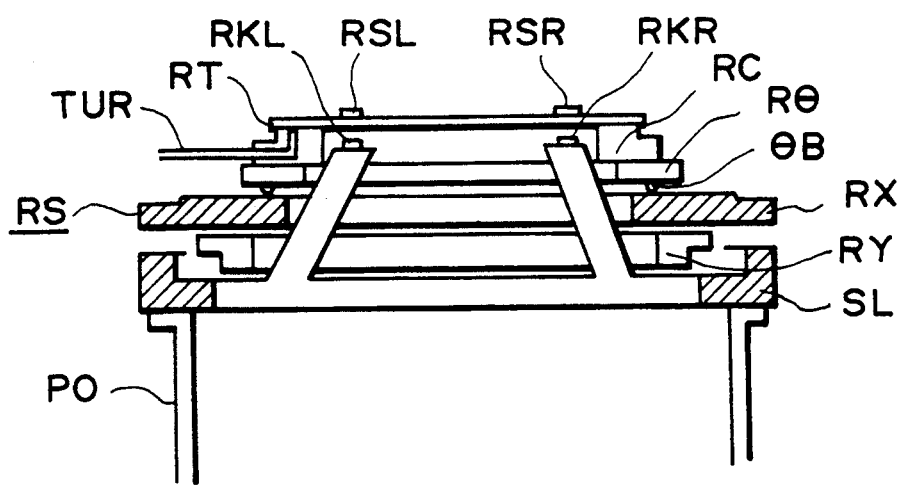
FIG. 3 is a sectional view schematically showing a reticle stage of the embodiment of FIG. 1.

FIG. 3 is a sectional view showing the reticle stage RS of FIG. 1, while FIG. 4 is a plan view thereof. As shown in FIG. 3, the reticle stage RS includes a base SL fixedly secured to the projection lens system PO and having upwardly protruding portions. Formed on the upper surfaces of the upward protrusions of the base SL are reticle reference marks RKR and RKL which serve as the references for the positioning of reticle set marks RSR and RSL, formed on the reticle RT, for the sake of alignment of the reticle RT.

The reticle stage RS further includes a Y-stage RY for moving the reticle RT in the Y direction; an X-stage RX for moving the reticle RT in the X direction; a $\theta$-stage R$\theta$ for moving the reticle RT in the $\theta$ direction (rotational direction); guide bearings $\theta$B ($\theta$B1, $\theta$B2 and $\theta$3) for guiding the rotational movement of the $\theta$-stage R$\theta$; a reticle chuck RC for fixedly holding thereon the reticle RT by vacuum suction supplied thereto via a tube TUR; pulse motors PX, PY and P$\theta$ for driving the stages RX, RY and R$\theta$, respectively; drive transmitting lever gears XL, YL and $\theta$L; cantilevered springs BX1, BX2, BY1, BY2 and B$\theta$ each for producing a force acting against the drive of associated one of the motors PX, PY and P$\theta$; and guide block XB and YB cooperative with guide bearings XG and YG, respectively. By the rotations of the motors PX, PY and P$\theta$, the stages RX, RY and R$\theta$ are moved in the directions of X, Y and $\theta$, respectively, through desired amounts, respectively. For example, when the pulse motor PX rotates in the direction of an arrow, the lever XL is rotationally moved in the direction of an arrow so that its leftward end urges and presses the X-stage RX in the leftward direction. By this, the X-stage RX is moved leftwardly against the biases of the springs BX1 and BX2. The movement of the X-stage RX is guided by the guide block XB and the guide bearings XG, such that the X-stage RX is displaced accurately in the X direction. Photosensors PS and a light-blocking plate SM cooperate with each other to provide a detection system which is effective to detect the limits of displacement of the reticle stage RS and to assist the alignment of the center of the reticle stage RS with the optical axis of the projection lens system PO.

When the pulse motor P$\theta$ is driven to rotate the $\theta$-stage R$\theta$, the base plate ST of the light-intercepting device BL shown in FIG. 2 is also rotationally moved in the $\theta$ direction with the rotational movement of the $\theta$-stage R$\theta$, the rotational drive being transmitted thereto by way of a rotational drive transmitting system DT schematically shown by a broken line in FIG. 1.

FIG. 5 is a perspective view showing the optical arrangements of the TTL alignment optical system AS and the off-axis alignment optical system OA of the FIG. 1 embodiment. As shown in FIG. 5, the TTL alignment optical system AS includes a laser source 1S for supplying a laser beam; a condensing lens 2S for focusing the laser beam emitted by the laser source 1S; a rotatable polygonal mirror 3S: an f-$\theta$ lens 4S; and a beam splitter 5S. The laser beam emerging from the laser source 1S is scanningly deflected by the rotating polygonal mirror 3S and the thus scanningly deflected laser beam enters into the beam splitter 5S and various optical elements following the beam splitter 5S. Denoted by reference 6S is a field lens, and denoted by reference 7S is a view field dividing prism which is effective to divide, with time, the scanning laser beam into two along two optical paths. In this respect, the prism 7S serves as a view field and space dividing prism. The TTL alignment optical system AS further includes a pair of polarization beam splitters 8R and 8L; a pair of relay lenses 9R and 9L; a pair of beam splitters 10R and 10L; a pair of objective lenses 11R and 11L; and a pair of objective mirrors 12R and 12L. The laser beam reflected by or transmitted through the beam splitter 8R (8L), the relay lens 9R (9L) and the beam splitter 10R (10L) enters into the objective lens 11R (11L) and, after reflected by the objective mirror 12R (12L), is focused on the reticle RT, to thereby scan the reticle RT surface. The system further includes a pair of photoelectric detecting systems each of which comprises an imaging lens 13R (13L); a chromatic filter 14R (14L); a spatial filter 15R (15L) effective to intercept a specularly reflected light component but to transmit only a scattered-light component for the sake of photoelectric detection; a reflecting mirror 16R (16L); a condenser lens 17R (17L); and a photoelectric detector 18R (18L). The system further includes a pair of illumination optical systems, for observation, each of which comprises a light source 19R (19L); a condenser lens 20R (29L); and a chromatic filter 21R (21L). The system still further includes an observation system which comprises an erector 22S, a prism 23S, a TV camera lens 24S and an image pickup tube CDO.

In this embodiment, for the sake of effective utilization of the quantity of light, the scanning laser beam is divided into two (the leftwardly directed one and the rightwardly directed one) by the field dividing prism 7S which is located at a position optically conjugate with each of the reticle and the wafer. The scan line extends in a direction orthogonal to the ridge of the field dividing prism 7S. In other words, the mirrors 10R (10L) and 12R (12L) are employed so that the laser beam scans the reticle RT surface in the longitudinal direction (Y direction).

It is seen from FIG. 5 that the right-hand side scanning optical system including the optical elements denoted by reference numerals with the suffix "R" and the left-hand side scanning optical system including the optical elements denoted by reference numerals with the suffix "L" are arranged asymmetrically with respect to each other and that the objective lenses 11R and 11L are disposed diagonally, according to the positions of the alignment marks WR and WL of the reticle RT.

Off-axis alignment system OA includes a pair of optical systems OAR and OAL which are to be used for the sake of the off-axis alignment, as will be described later. The off-axis alignment system OA further includes a pair of high resolution image pickup tubes CR and CL provided for the sake of high-magnification alignment, which will be described later, and a pair of converters CDR and CDL such as charge coupled devices (CCD) provided for the sake of low-magnification alignment (which also will be described later).

Figure 6:
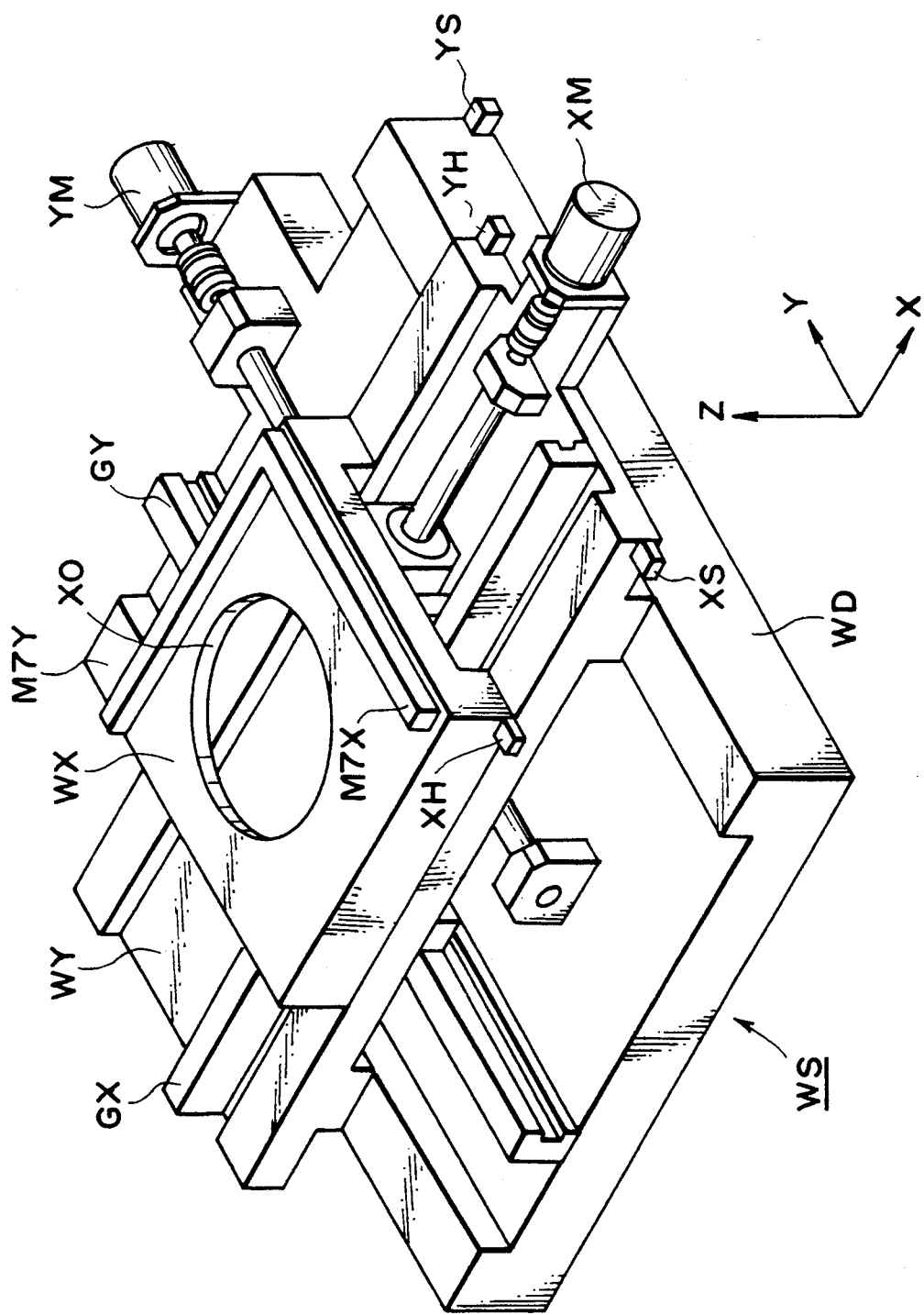
FIG. 6 is a perspective view schematically showing a wafer stage of the embodiment of FIG. 1.

FIG. 6 is a perspective view showing details of the wafer stage WS of the embodiment of FIG. 1. As shown in FIG. 6, the wafer stage WS includes a base WD on which a Y-stage WY for moving the wafer WF in the Y direction is movably supported. On the Y-stage WY, an X-stage WX for moving the wafer WF in the X direction is movably supported. The X-stage WX and the Y-stage WY are movable by means of servomotors XM and YM, respectively, in the X and Y directions, while being guided by guides GX and GY, respectively. Denoted by reference XH and XS; YH and YS are detectors provided for the sake of initial resetting of the stages WX and WY, respectively. Denoted by reference XO is an opening for accommodating the θ-stage θZ (FIG. 7) which is rotatable in the θ direction and is movable upwardly and downwardly in the Z direction.

Figure 7:
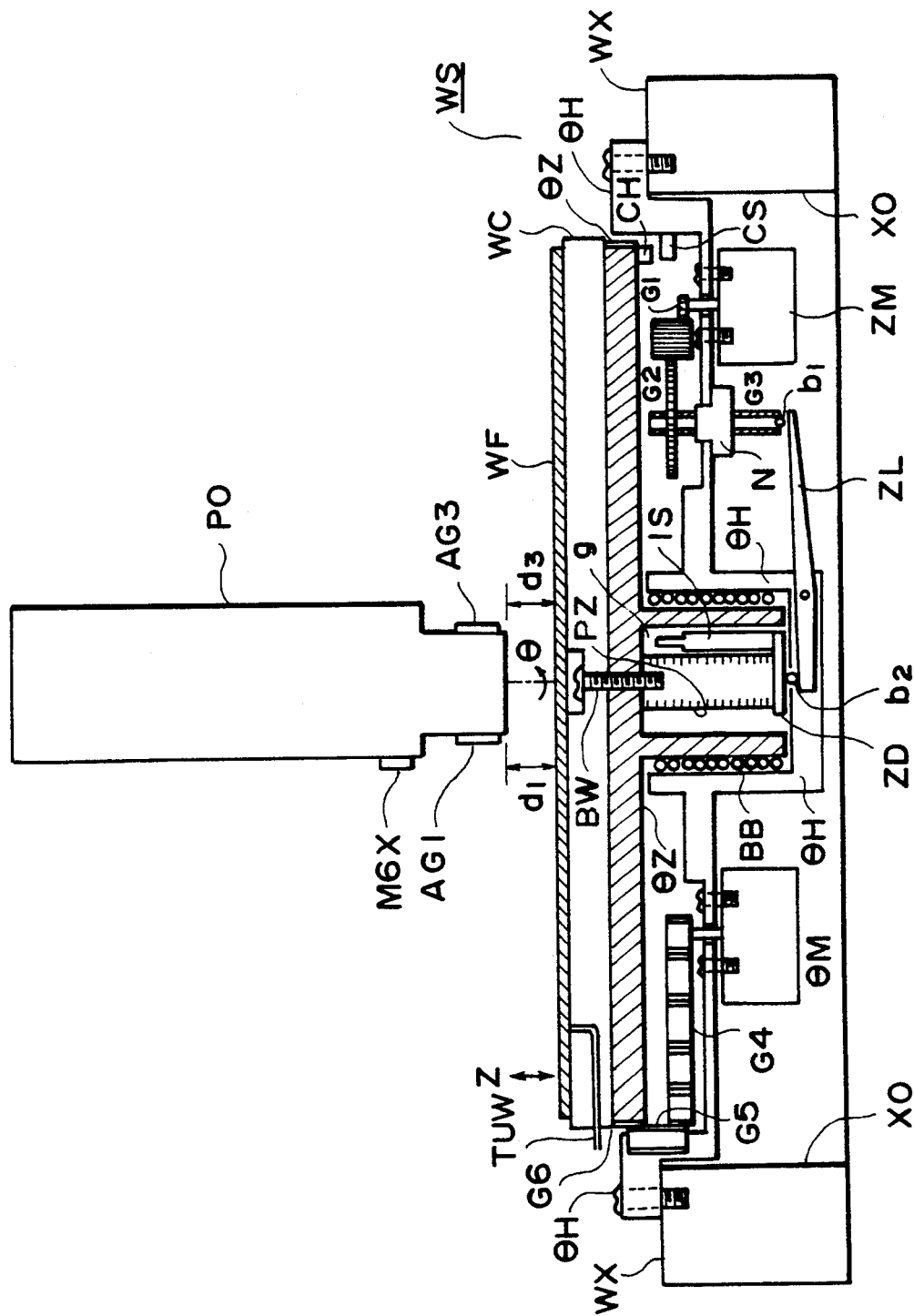
FIG. 7 is a sectional view of the wafer stage of FIG. 6.

As shown in FIG. 7, the θ-stage θZ carries thereon a wafer chuck WC on which the wafer WF is fixedly held by vacuum suction, like the reticle RT. The stage θZ is mounted in a stage holder θH and is arranged to be moved upwardly and downwardly in the Z direction and rotationally in the θ direction, by means of ball bearing BB and b1. The stage holder θH is fixedly secured to the X-stage WX, as shown in the drawing. Pulse motors ZM and θM supplying drives for the movements of the stage θZ in the Z and θ directions, respectively, are fixedly coupled to the stage holder θH.

Disposed below the central portion of the stage θZ is a piezoelectric device PZ comprising a number of doughnut-shaped piezoelectric elements. The piezoelectric device PZ, the stage θZ and the wafer chuck WC are connected integrally to each other by a fastener such as a bis BW.

An eddy-current type position sensor IS is fixedly secured to a base ZD of the piezoelectric device PZ, and detects the amount of upward displacement g of the stage θZ. A lever ZL is pivotably supported by the stage holder θH, and a nut N is fixedly secured to the stage holder θH. When the Z-axis driving motor ZM is driven, gears G1 and G2 are rotated so that a screw shaft G3 is displaced downwardly while being rotated. As a result, the rightward end of the lever ZL is pressed by the ball b1 so that the lever ZL is pivotally moved clockwise. The clockwise movement of the lever ZL presses upwardly the piezoelectric device PZ and the sensor IS via a ball b2 and the base ZD. As a result, the stage θZ and the wafer chuck WC which are integrally connected to the piezoelectric device PZ are moved upwardly in the Z direction. In this manner, the coarse movement of the wafer stage is achieved for the sake of focus adjustment. After completion of such coarse movement of the wafer stage, the piezoelectric device PZ is actuated so that it expands upwardly in the direction of the Z-axis, with reference to the lever ZL. As a result, the wafer chuck WC and the θZ stage are displaced upwardly by an amount corresponding to the amount of expansion of the piezoelectric device PZ. The amount of displacement of the wafer chuck WC or the θZ stage is detected by measuring the gap g with the sensor IS. In this manner, the fine adjustment of the position of the wafer stage in the Z direction is achieved.

When the θ-axis driving motor θM is driven, the stage θZ and the wafer chuck WC are moved by a gear train G4-G6 and are rotated smoothly due to the provision of the ball bearings BB and b2.

Denoted by reference CH and CS is a detecting system provided for determining the reference point of the θZ stage with respect to the rotational direction.

The alignment and exposure apparatus includes four air-microsensors having nozzles AG1-AG 4 (two of which are shown in FIG. 7) which are attached to the lowermost portion of the barrel of the projection lens system PO so as to measure, at four points, the distance to the wafer WF surface from the end face of the projection lens system PO. If the distances from the end face portions of the reduction projection lens system PO to the wafer WF surface portions measured by the nozzles AG1-AG4 are denoted by d1, d2, d3 and d4, the average distance can be expressed by:

$$(d1+d2+d3+d4)/4$$

If the distance between the imaging plane (focal surface) of the projection lens system PO and the end face of the projection lens system PO is denoted by d0, the amount of movement Δd required for moving the wafer WF through the wafer Z-mechanism to a position which is coincident with the imaging plane of the reduction projection lens system PO can be expressed by:

$$\Delta d = d0 - (d1+d2+d3+d4)/4$$

As the result of such movement, the average surface of the wafer becomes coincident with the imaging plane of the projection lens system.

Figure 8:
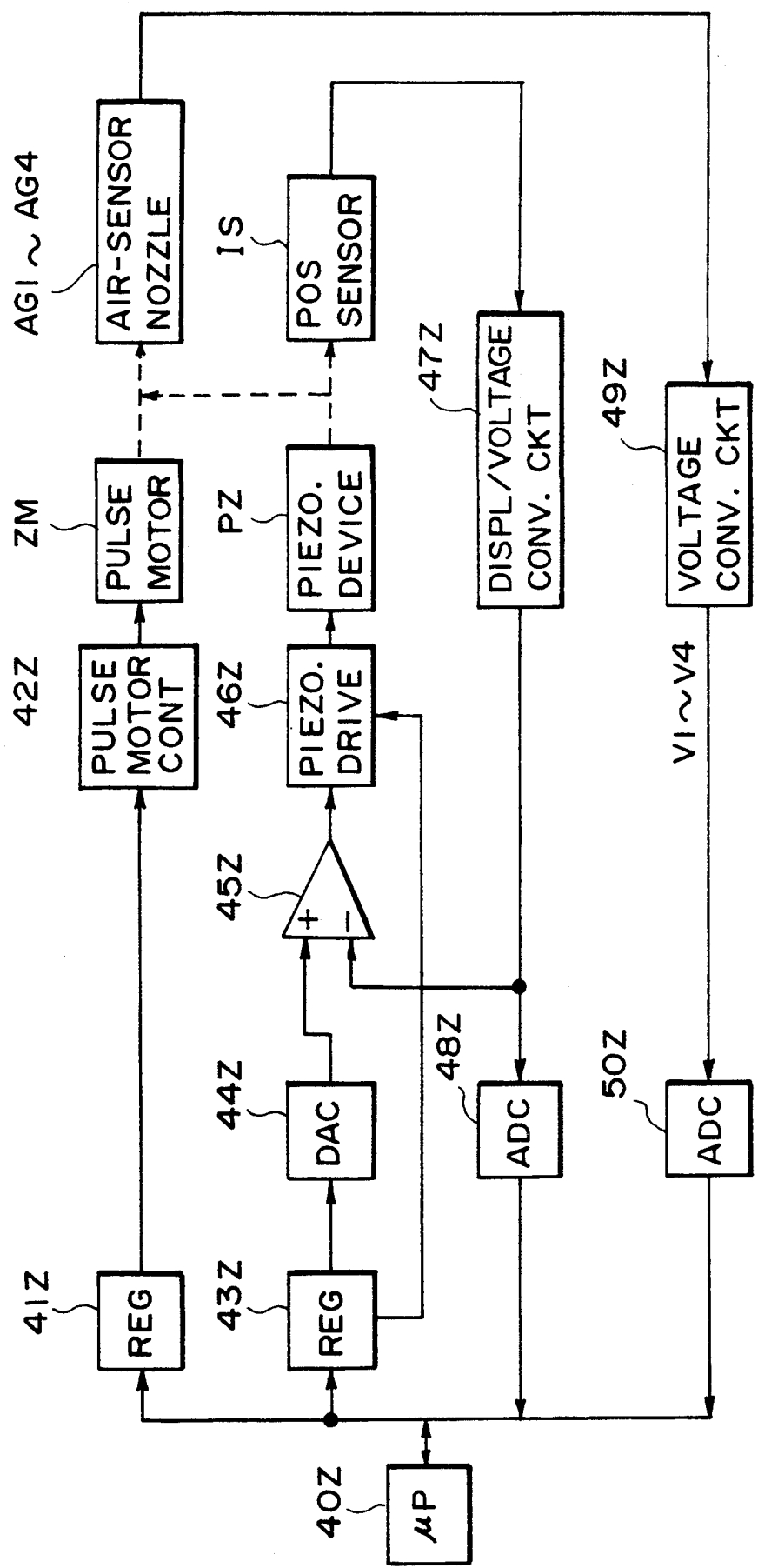
FIG. 8 is a block diagram of a Z-axis driving system for moving the wafer stage in the Z direction.

FIG. 8 is a block diagram showing a control system for controlling an automatic focusing mechanism in the alignment and exposure apparatus of the FIG. 1 embodiment.

In the diagram of FIG. 8, a microprocessor unit (MPU) 40Z is arranged to perform various discriminating operations and to provide various instructions in accordance with the situations. A register 41Z is adapted to store various instruction information on the direction, amount, speed, etc. of the rotation of the pulse motor ZM, which information is supplied from the microprocessor 40Z. Responsive to the instruction information outputted from the register 41Z, a pulse motor control circuit 42Z performs open-loop control for the pulse motor ZM.

In the initial state, the position of the wafer WF surface is spaced from the imaging plane (focal surface) position through a distance not less than 2 mm. This is for the purpose of preventing any contact of the wafer with the reduction projection lens PO even in a case where the wafer has a large thickness. Each of the air-sensor nozzles AG1-AG4 can achieve accurate measurement only when the distance from the end face of the nozzle to the wafer surface is not greater than approx. 0.2 mm. Thus, the predetermined imaging plane position is at a distance of 0.1 mm from the end face of the nozzle, accurate measurement can not be achieved until the wafer surface moving upwardly reaches a position which is downwardly spaced from the imaging plane position through a distance of approx. 0.1 mm.

The control system further includes a converting circuit 49Z for converting, into a voltage, the change in the flow rate in each of the air-sensor nozzles AG-1-AG4 to thereby produce voltage outputs V1, V2, V3 and V4 corresponding respectively to the distances d1, d2, d3 and d4 from the end face portions of the reduction production lens PO to the wafer surface portions. An analog-to-digital converter (ADC) 50Z converts the voltages V1, V2, V3 and V4 produced by the converter circuit 49Z into digital signals, respectively, and supplies them to the microprocessor 40Z. Since, at this time, the initial position of the wafer WF is spaced from the imaging surface position through a distance not less than 2 mm, the microprocessor 40Z continues to apply to the register 41Z the drive instruction signal for driving the pulse motor ZM until the wafer WF moving upwardly or in the Z-axis direction enters into the measurement range of the air-sensor nozzle. When the distance from the wafer WF which is being moved in the Z-axis direction by the rotation of the pulse motor ZM to the imaging plane position becomes equal to or less than 0.1 mm, the microprocessor 40Z detects the fact that the wafer WF has entered into the measurement ranges of the air-sensor nozzles, with the aid of the air-sensor nozzles AG1–AG4, converter circuit 49Z and A/D converter circuit 50Z. Responsive to this detection, the microprocessor 40Z supplies a stop instruction signal to the register 41Z to stop the rotation of the pulse motor ZM, to thereby stop the upward movement of the wafer WF. Subsequently, the microprocessor 40Z again performs measurement of the position of the wafer WF surface with the aid of the air-sensor nozzles AG1–AG4, converter circuit 49Z and A/D converter circuit 50Z, and calculates the amount of movement of the wafer Z-unit, i.e.:

$$\Delta d1 = d0 - (d1 + d2 + d3 + d4)/4.$$

The movement resolution, i.e., the minimum increment of movement of the wafer WF to be caused by the pulsed rotation of the pulse motor ZM is 2 microns. Thus, the microprocessor 40Z applies to the register 41Z an instruction signal for the amount of movement $\Delta d1$, which is in the 2-micron unit, to move the wafer WF upwardly in the Z-axis direction. As the result, the wafer WF surface is positioned relative to the focal surface position with a precision of an order not greater than approximately 2 microns.

Subsequently, the distances from the end face portions of the reduction projection lens PO to the surface portions of the wafer are measured again. When the distances measured by the air-sensor nozzles AG1–AG4 are denoted by d9–d12, respectively, the microprocessor 40Z supplies the register 43Z with an instruction signal on the direction and amount of the driving movement of the piezoelectric device PZ, which can be expressed by:

$$\Delta d2 = d0 - (d9 + d10 + d11 + d12)/4$$

The register 43Z stores the thus supplied information. In addition thereto, the register 43Z supplies the information to a digital-to-analog converter (DAC) 44Z and to a driving circuit 46Z which is adapted to generate a voltage to drive the piezoelectric device PZ.

The D/A converter 44Z converts the digital signal from the register 43Z into an analog voltage and supplies it to a differential amplifier 45Z as an instruction voltage. In accordance with an output from the differential amplifier 43Z, the driving circuit 46Z generates a voltage within a range having a center level which is approximately a half of the maximum voltage VH applicable to the piezoelectric device PZ. As the wafer WF is displaced longitudinally as viewed in FIG. 7 with the drive of the piezoelectric device PZ, the amount of driving movement can be detected and measured by the eddy current type position detector IS. The output of the eddy current type position detector IS is converted by a displacement-to-voltage converter circuit 47Z into a voltage which is proportional to the amount of displacement, the voltage being applied to the differential amplifier 45Z and an analog-to-digital converter (ADC) 48Z. The differential amplifier 45Z successively or sequentially compares the amount of movement of the wafer (driven by the piezoelectric device PZ) detected by the eddy current type position detector IS with the amount of driving movement instructed by the register 43Z, and continues to actuate the driving circuit until the difference detected by the comparison falls within a predetermined tolerance. As a result, the surface of the wafer WF can be precisely positioned relative to the predetermined imaging plane position. The A/D converter 48Z converts the amount of displacement of the piezoelectric device PZ detected by the eddy current type position detector IS into a digital signal and supplies it to the microprocessor 40Z.

When this signal is received by the microprocessor 40Z, it is discriminated that the wafer surface has been moved to a position coincident with the imaging plane. Accordingly, the next control operation is initiated.

It is a possible alternative to control the pulse motor ZM and the piezoelectric device PZ simultaneously, such as described below. That is, the pulse motor ZM and the piezoelectric device PZ can be actuated in accordance with the following equation:

(Measured Distance)/(Resolution of Pulse Motor) = Quotient: Displacement to be made by Pulse Motor Remainder: Displacement to be made by Piezoelectric Device More specifically, the average of the distances measured by the air-microsensors AG1–AG4 is divided by the resolution of the pulse motor ZM. If there remains any remainder, the displacement, to be effected by the wafer stage, corresponding to that remainder is achieved by driving the wafer stage through the piezoelectric device PZ. By this, the coarse driving movement and the fine driving movement are appropriately combined. The displacement corresponding to the "Quotient" and the displacement corresponding to the "Remainder" are stored in the registers 41Z and 43Z simultaneously, so the pulse motor ZM and the piezoelectric device PZ are actuated simultaneously. As the result, the wafer surface can be moved quickly to the focus position.

Figure 13:
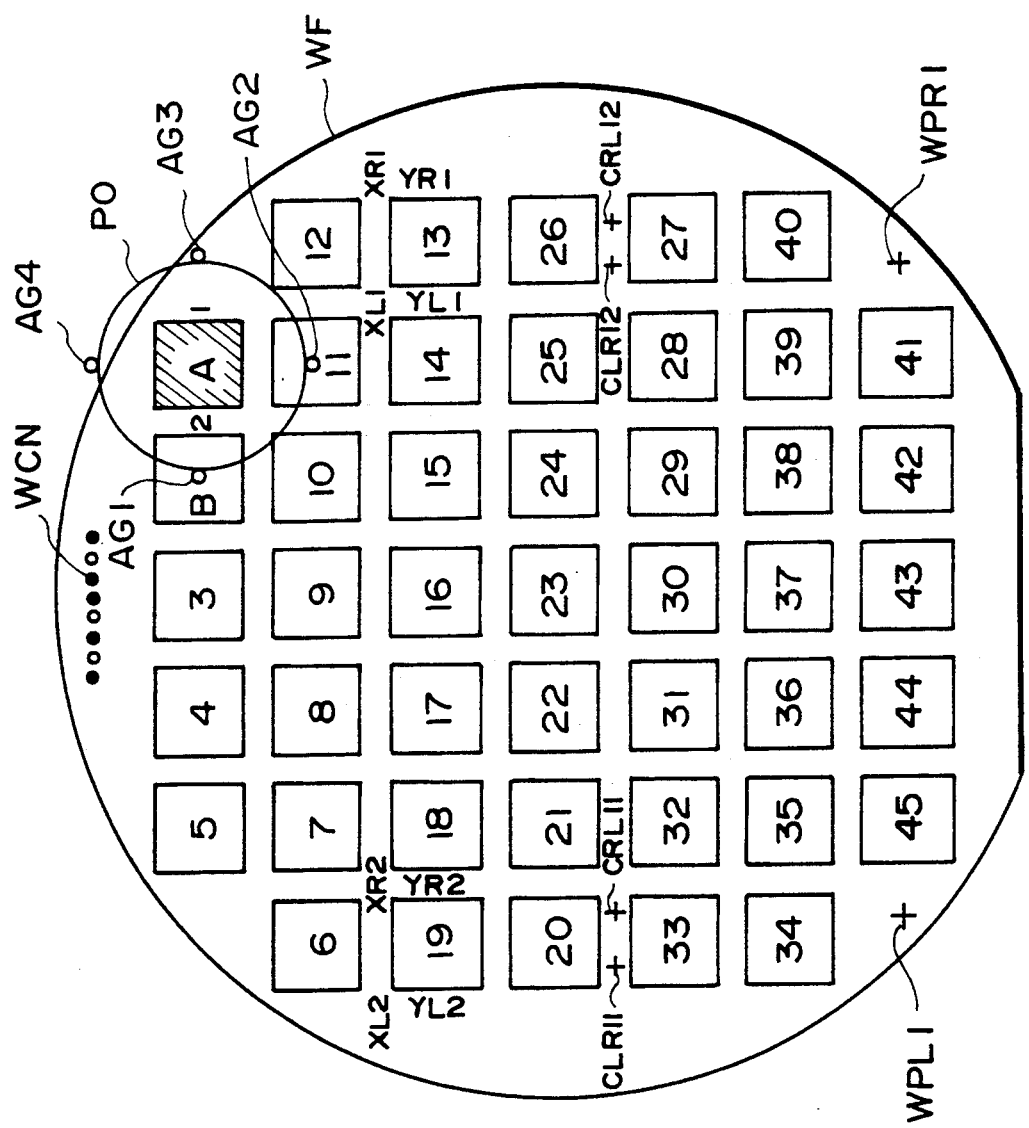
FIG. 13 is a plan view of a wafer, showing shot areas on the wafer.

FIG. 13 is a plan view of the wafer WF showing the arrangement of the shot areas defined on the wafer WF. Among the illustrated shot areas, the area as denoted by reference A is the first shot area which is to be exposed first. In the alignment and exposure apparatus of step-and-repeat type, as is well known in the art, the wafer WF carried by the wafer chuck WC is moved stepwise in the X and Y directions for sequential exposures of the shot areas.

In a case where the shot area A is to be exposed, the reduction projection lens PO and the air-sensor nozzles AG1–AG4 will be positioned relative to the wafer in a manner shown in this Figure. Therefore, the air-sensor nozzle AF4 could not detect or measure the surface position of the wafer, while the nozzles AG1–AG3 can measure or detect the wafer surface. More particularly, as the wafer WF is moved toward the reduction projection lens PO, the microprocessor 40Z detects that the wafer surface has sufficiently entered into the measurement ranges of the air-sensor nozzles AG1, AG2 and AG3. However, no response is inputted, from the air-sensor nozzle AG4, into the microprocessor 40Z. For this reason, the microprocessor 40Z discriminates that the air-sensor nozzle AG4 is unoperable, and therefore, the microprocessor 40Z operates to average the measurement values d2, d3 and d4 of the air-sensor nozzles AG1, AG2 and AG3 whereby, an average distance $(d2 + d3 + d4)/3$ to the wafer 4 is calculated. The focus adjustment with respect to the shot area A is performed on the basis of the results of this calculation.

When an area denoted by B is to be exposed after completion of the exposure of the area A, the air-sensor nozzle AG1 preparatively detects the position of the wafer surface at the area B and measures the distance thereat before the initiation of the stepwise movement of the wafer stage to the shot area B. The measured value is supplied by the microprocessor 40Z to the register 43Z as an instructed amount of drive. During a time period during which the wafer WF is moved so that the exposure area B is positioned under the reduction projection lens PO, the piezoelectric device PZ continues driving on the basis of the preparatively measured value, and the amount of drive thereof is detected by the eddy current type position detector IS. If the necessary displacement is completed, the drive is stopped. In this manner, the focus adjustment with respect to the exposure area B can be achieved during the movement of the wafer WF from the A-area-exposing position to the B-area-exposing position. This ensures exposure with less time wasted since a portion of the requisite time period for executing one operation can be utilized for another operation.

The alignment and exposure apparatus of the FIG. 1 embodiment includes control systems for the X-stage WX and the Y-stage WY, respectively. Since these control systems are of essentially the same structure, description will be made to one of them, in conjunction with a block diagram of FIG. 9. The control system includes a DC motor D coupled to the X-stage WX (Y-stage WY) by means of a ball screw; a motor driving circuit MD for driving the DC motor D; and a tachometer generator T which is connected to the DC motor D and which serves as a speed signal generator. An output of the tachometer generator T is fed back to the driver MD for the sake of speed control. The position of the X-stage WX (Y-stage WY) is detected by a current position counter PCP on the basis of an output signal of a distance measuring device LZ such as a laser interferometer. The output of the distance measuring device LZ indicates the relative position of the stage. In view of this, there are provided origin sensors XH and XS (YH and YS) and an origin detecting circuit SO, for the sake of detection of the origin of the position of the X-stage (Y-stage). From the outputs of the origin sensors and the origin detecting circuit, the origin of X-stage (Y-stage) is detected. Thereafter, the distance measurement is initiated in response to an output from a gate circuit AP, and the current position of the X-stage (Y-stage) is detected by the current position counter PCP. The information on the current position of the X-stage (Y-stage) is supplied by way of a current position latching circuit PLP to a microprocessor (central processing unit) PC which is adapted to control overall operations of the X-stage (Y-stage).

The system further includes a target position latching circuit CLP in which a target position of the X-stage (Y-stage) is set by the microprocessor CP. A differential amplifier DIF compares an output of the current position counter PCP with an output of the target position latching circuit CLP and produces an output corresponding to the difference therebetween. The output of the differential amplifier DIF indicates the distance to the target position from the current position of the stage and is used as a feedback signal for the position servo control. Also, the output of the differential amplifier DIF is used in order to detect the timing for setting a drive pattern of the X-stage (Y-stage). As for the feedback signal for the position servo control, the output of the differentiator DIF is supplied to a bit converter BC whereby a bit-number acceptable by a digital-to-analog converter DAP (hereinafter "D/A converter") is obtained. The output of the bit converter BC is applied to the D/A converter DAP. The output of the D/A converter DAP which is in the form of an analog signal is applied to a position servo amplifier GA as a position feedback signal.

The system further includes a comparator COMP for producing a timing and information signal for setting the drive pattern of the X-stage (Y-stage). The comparator COMP is adapted to compare an output of the bit converter BC with an output of a displacement setting latch RPL for setting the amount of movement to be made. When the output of the bit converter BC becomes equal to the output of the displacement setting latch RPL, the comparator COMP produces a timing and information signal for setting the drive pattern. This signal is applied to an address generator RAG of a random access memory RM in which information on various drive patterns has been stored. By this, a certain RAM address is produced and, therefore, a particular drive pattern information is outputted from the random access memory RM. The timing signal is also applied to an interrupt generator INT, so that an interrupt signal is produced and, therefore, the microprocessor CP detects that timing.

The drive pattern information contains the information for controlling the DC motor D, as well as the above-described data on the displacement (the amount of movement). The controlling information includes speed instructing information for actually driving the DC motor D, target speed instructing information for designating a target value or speed, and various information for controlling the movement until the target value is reached. Denoted by reference PCV is a current speed counter. Denoted by reference CLV is a latching circuit for latching the target speed information. A function generator FG is adapted to set a dividing ratio of a frequency divider DIV. The frequency generator FG controls, by dividing the pulse frequency of the DIV into a desired value, the movement of the stage until the output of the current speed counter PCV becomes equal to the output of the target speed latch CLV. Another comparator COMV is provided to compare the output of the current speed counter PCV with the output of the target speed latch CLV and is effective to open a gate AV until the difference between the two outputs becomes null. Also, when the above two outputs become equal to each other, the comparator COMV applies to the microprocessor CP the information about this by way of the interrupt signal of the interrupt generator INT. The current speed value in the current speed counter PCV is supplied to a digital-to-analog converter DAV (which hereinafter "D/A converter"). An output of the D/A converter DAV which is in the form of an analog signal is supplied, during the speed servo control mode, to the driver MD by way of an "ON" side terminal of a switch SW, as a speed instruction signal. During the position servo control mode, on the other hand, the output of the D/A converter DAV is supplied to an adding circuit AD as a position instruction signal, whereby a combined signal of the output of the D/A converter DAV with an output of the D/A converter DAP (i.e. the position feedback signal) is supplied to the driver MD by way of the position servo amplifier GA and an "OFF" side terminal of the switch SW.

Denoted by reference DMG is a driving mode generating circuit. In accordance with an output signal of the driving mode generating circuit DMG, the driving mode changing switch SW is changed over between the "ON" position and the "OFF" position. For example, the "ON" side terminal of the switch SW defines the speed servo control mode, so that an output of the D/A converter DAV is supplied to the driving circuit MD. As the result, the X-stage (Y-stage) is driven under the speed servo control, during the drive initiating period. On the other hand, the "OFF" side terminal of the switch SW establishes the position servo control mode, so that an output of the position servo amplifier GA is supplied to the driver MD, whereby the X-stage (Y-stage) is driven under the position servo control, during the drive terminating period.

Figure 9:
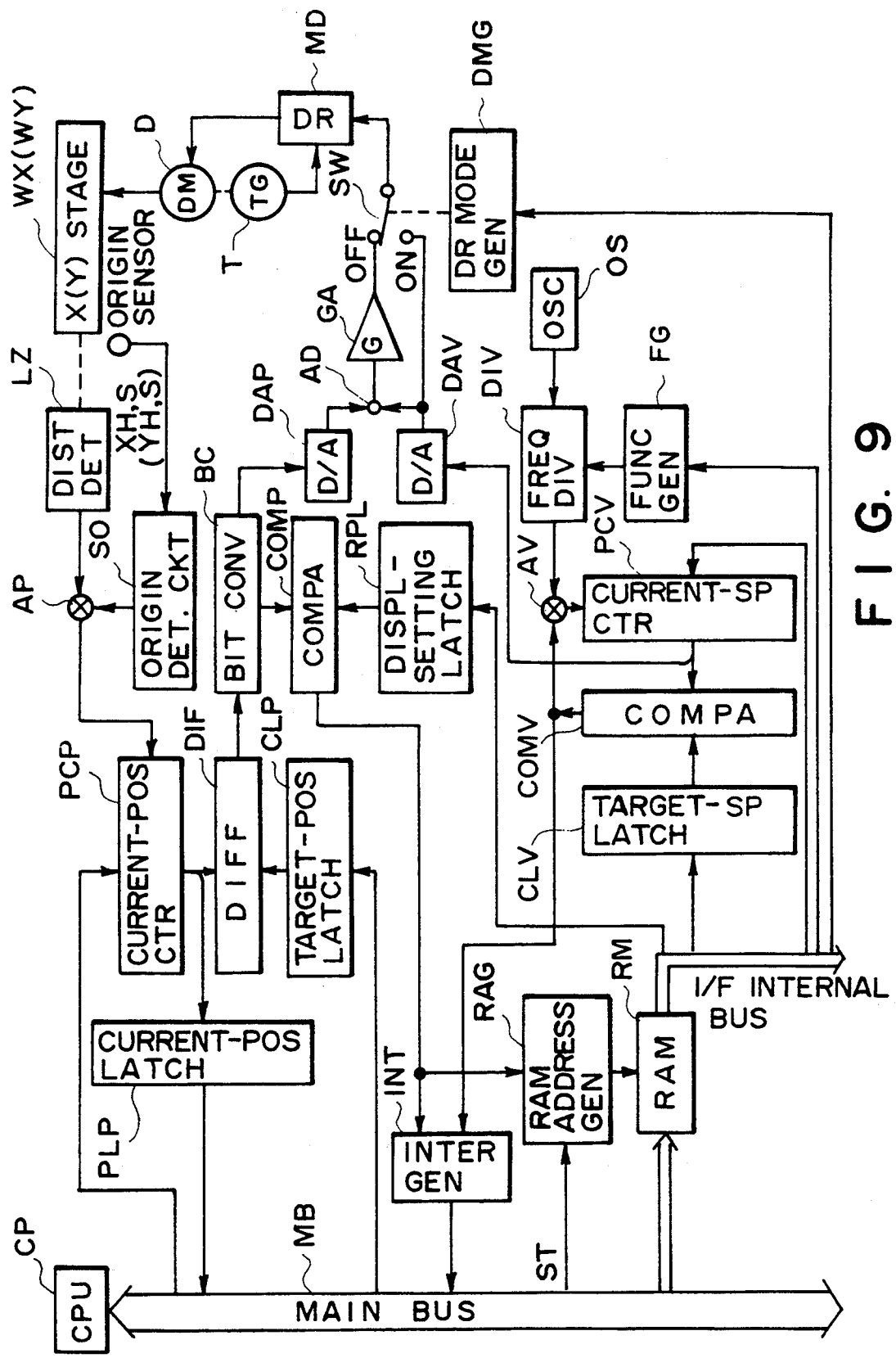
FIG. 9 is a block diagram of an X(Y)-axis driving system for moving the wafer stage in the X(Y) direction.
Figure 10:
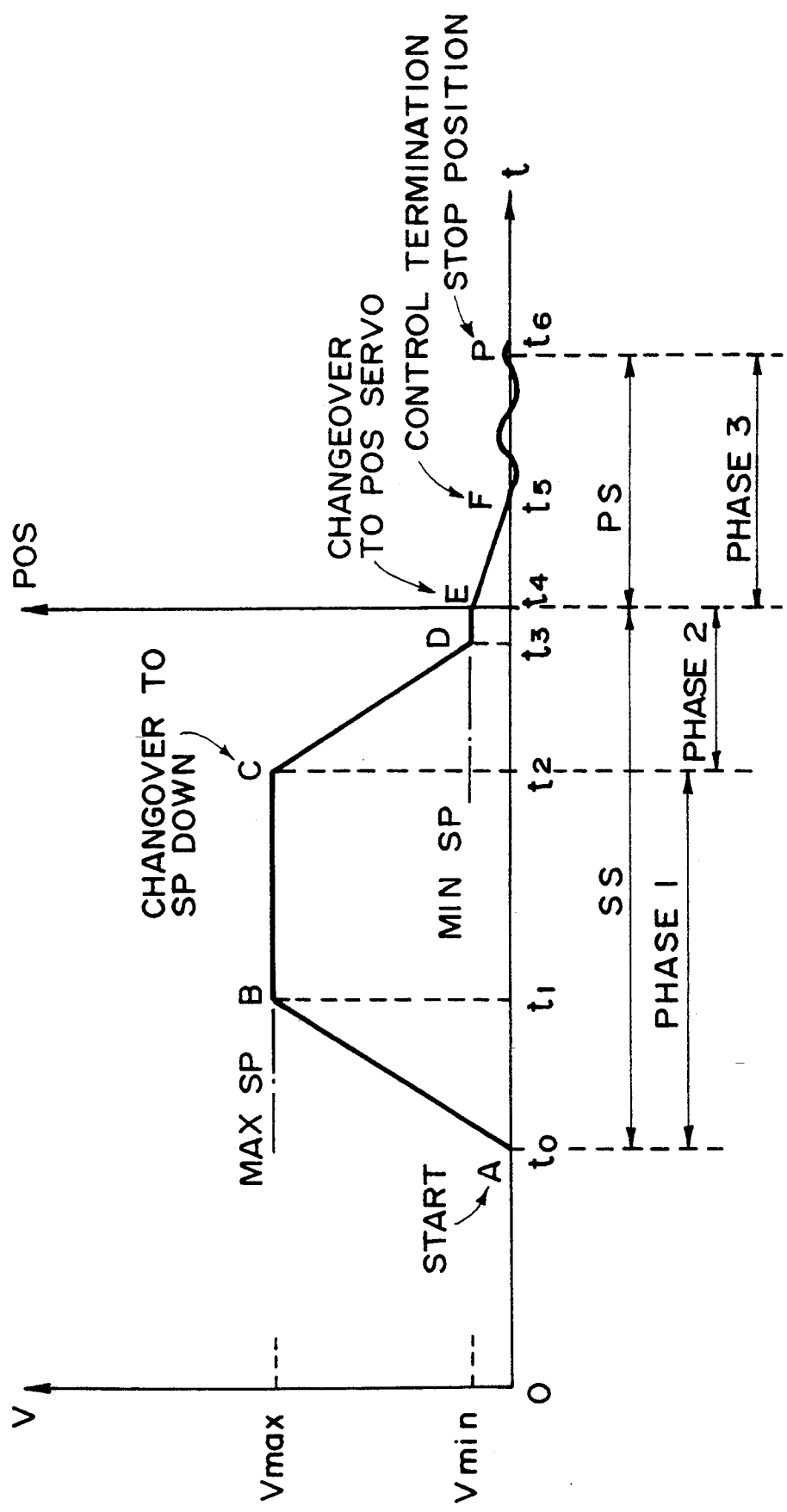
FIG. 10 is a graph showing a control operation of the system of FIG. 9.

FIG. 10 is a graph showing the changes in the speed (position) of the stage, the axis of abscissa depicting the time while the axis of ordinate depicting the speed (position). In FIG. 10, a period SS from time t0 to time t4 is a speed control period, while a period PS from time t4 to time t6 is a position control period. The speed control period SS is composed of an acceleration portion A-B in which a constant gradient of acceleration is shown, a constant speed portion B-C in which the stage is moved at a constant speed Vmax, a deceleration portion C-D in which a constant gradient of deceleration is shown, and another constant speed portion D-E in which the stage is moved at another constant speed Vmin. The segments A-B, B-C, C-D of the acceleration or deceleration and the point C of changeover to speed down are all determined by the difference between the current position A and the target position P, i.e. by the amount of movement. Such determination can be achieved by, for example, reading out the information, from a data table, on the acceleration, the deceleration, the maximum speed and the changeover point to speed down, in accordance with the amount of movement to be made. The reading-out of the data is effected by the microprocessor CP. The microprocessor CP stores the thus obtained data into the random access memory RM shown in FIG. 9. FIG. 11 shows the contents of the random access memory. The contents of the random access memory RM are classified into three blocks of "PHASE 1", "PHASE 2" and "PHASE 3" each of which is composed of four kinds of data.

The "PHASE 1" contains the data necessary for controlling the movement of the stage from the start point A to the point C of changeover to speed down. The "PHASE 2" contains the data necessary for controlling the movement of the stage from the changeover point C to the point E of changeover to the position servo. The "PHASE 3" contains the data necessary for controlling the movement of the stage from the changeover point E to the stop position P.

Referring to FIGS. 9-11, description will now be made to the control of the movement of the X-stage (Y-stage). First, the microprocessor CP stores into the random access memory RM various data necessary for the drive of the stage. Subsequently, the microprocessor CP sets a target position in the target position latch CLP and, simultaneously therewith, applies a start signal ST to the RAM address generator RAG. This causes the address generator RAG to produce an address of the "PHASE 1", so that the random access memory RM is operated to set "zero speed data" in the current speed counter PCV; to set "maximum speed data" in the target speed latch CLV; to set "acceleration gradient data" in the function generator FG; and to set "the distance or displacement to the speed changeover point C" in the displacement setting latch RPL. Also, the random access memory RM causes the drive mode generating circuit DMG to select the "ON" side terminal of the switch SW.

In response to the output of the D/A converter DAV, the X-stage (Y-stage) starts movement with an acceleration shown by the segment A-B in FIG. 10. More particularly, the acceleration operation of the segment A-B in FIG. 10 is effected in accordance with the varying output of the current speed counter PCV which counts the output of the frequency divider DIV until the output of the counter PCV becomes equal to the output of the target speed latch CLV. After the output of the counter PCV becomes equal to the output of the latch CLV, the constant speed operation of the segment B-C in FIG. 10 is effected in accordance with the output, which is now constant, of the counter PCV, the input thereto from the frequency divider DIV being intercepted.

At the time t2 corresponding to the point C of changeover to speed down, the comparator COMP outputs a "no-difference" signal which is supplied to the address generator RAG. This causes the address generator RAG to produce an address of the "PHASE 2", such that the random access memory RM is operated to set "maximum speed data" in the current speed counter PCV; to set "minimum speed data" in the target speed latch CLV; to set "deceleration gradient data" in the function generator; and to set "the distance to the point E" in the displacement setting latch PRL. As a result, the X-stage (Y-stage) begins deceleration. More particularly, the decleration operation of the segment C-D in FIG. 10 is effected similarly, until the output of the counter PCV becomes equal to the output of the latch CLV and, thereafter, the constant speed operation of the segment D-E is effected.

At the time t4 corresponding to the point E of changeover to the position servo control, the comparator COMP outputs a "no-difference" signal which is supplied to the address generator RAG. This causes the address generator RAG to produce an address of the "PHASE 3", such that the random access memory RM is operated to set "the displacement to the point E" (e.g., the amount of displacement to a point which is 25-micron in short of the target position) in the current speed counter PCV; to set "target position data" in the target speed latch CLV; to set "position servo gradient data" in the function generator FG; and to set "target stop point P" in the displacement setting latch. Simultaneously therewith, the random access memory RM causes the driving mode generating circuit DMG to establish the position control mode and to select the "OFF" side terminal of the switch SW. Whereby, the X-stage (Y-stage) is driven in the position control mode.

At the time t5 corresponding to the control termination point F, the comparators COMV and COMP output "no-difference" signals which are supplied to the interrupt generator INT. As a result, an interrupt signal is produced by the interrupt generator INT, which signal is detected by the microprocessor CP. The generation of the interrupt signal indicates that the X-stage (Y-stage) has been displaced to a position very close to the target position, which means that the basic portion of the control of the X-stage (Y-stage) is completed. Therefore, in response to the detection of the interrupt signal, the microprocessor CP discriminates whether or not the stop position of the stage is within an acceptable range (which hereinafter "tolerance"). For this purpose, the microprocessor CP receives the data on the current position of the stage from the current position counter PCP by way of the current position latch PLP, and discriminates whether or not the difference between the current position and the target position of the stage is within the tolerance. When the stop position accuracy and the vibration come into the tolerance, the control is finished and the movement of the X-stage (Y-stage) is accomplished.

Figure 12:
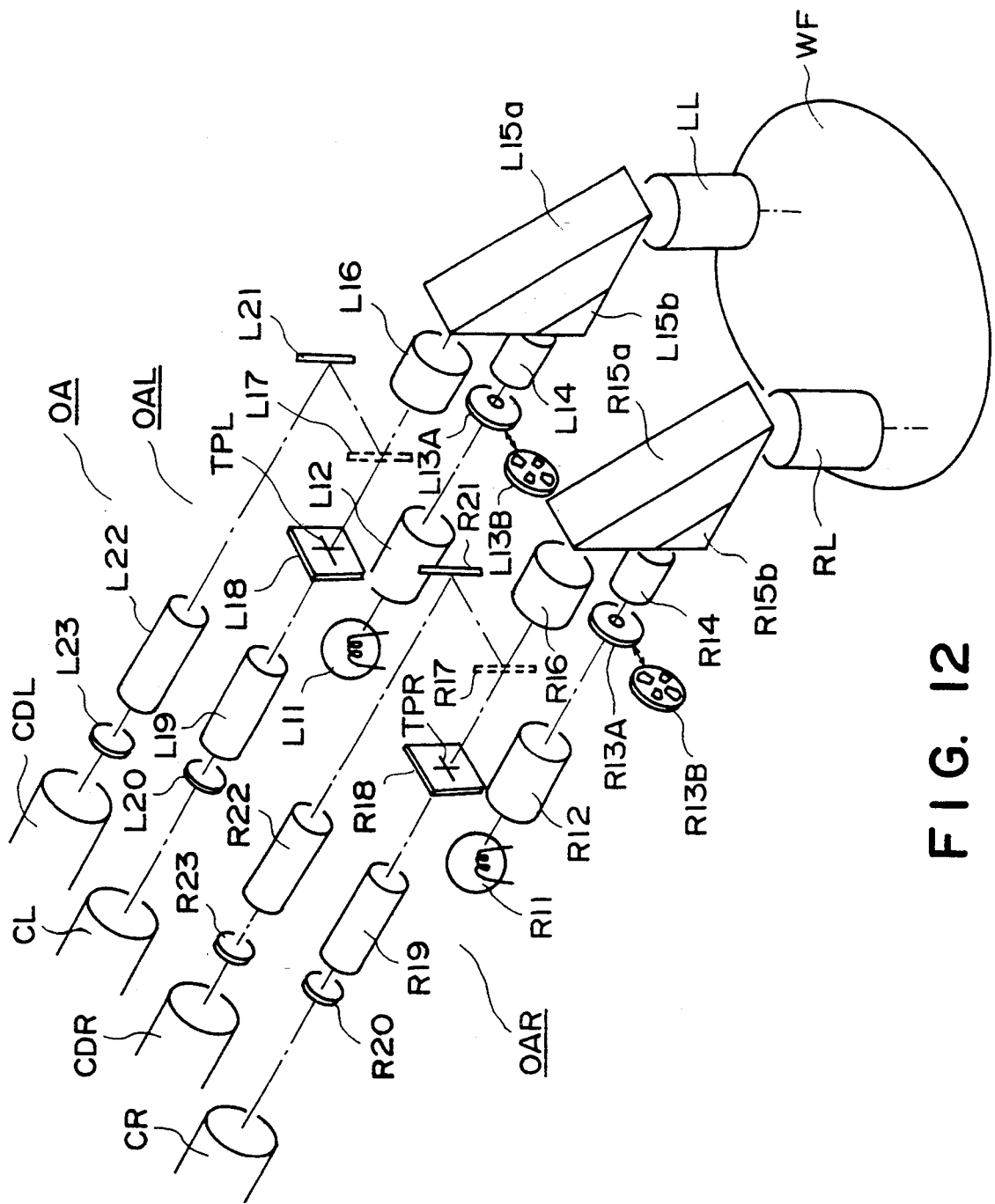
FIG. 12 is a perspective view schematically showing an off-axis alignment optical system of FIG. 5.

FIG. 12 shows an example of an optical arrangement of the off-axis optical system OA, shown in FIG. 1, provided for the sake of TV alignment. As shown in FIG. 12, the system includes a pair of illumination sources R11 and L11 such as halogen lamps or the like; a pair of condenser lenses R12 and L12; a pair of bright-field aperture stops R13A and L13A; and a pair of dark-field aperture stops R13B and L13B. The bright-field aperture stop and the dark-field aperture stop are used interchangebly. In the state shown in FIG. 12, the bright-field aperture stops R13A and L13A are disposed on the optical paths, respectively, so that the images of the light sources R11 and L11 are formed on the bright-field aperture stops R13A and L13A, respectively, by the condenser lenses R12 and L12. The system further includes a pair of relay lenses R14 and L14 for illumination; and a pair of cemented prisms R15 and L15 each having an internal reflection surface R15a (L15a) and a semi-transmitting reflection surface R15b (L15b). The light source R11 (L11), the condenser lens R12 (L12), aperture stops R13a and R13b (L13a and L13b), the relay lens R14 (L14) and the cemented prism R15 (L15) constitute, together with an objective lens RL (LL), a right-hand side illumination system (left-hand side illumination system). The light beam emerging from the objective lens RL (LL) is perpendicularly incident on the wafer WF to illuminate either an alignment mark CRL12 (CRL11) or an alignment mark CLR12 (CLR11); alignment mark WPR1 (WPL1).

The system further includes a pair of relay lenses R16 and L16; a pair of mirrors R17 and L17 each of which is effective to select a low-magnification alignment system in place of a high-magnification alignment system; and a pair of index glass plates R18 and L18 each having a reference mark TPR (TPL) provided for the sake of TV alignment. Each of the reference marks TPR and TPL functions to define an origin of the coordinates for the position of the wafer WF. Therefore, the position of each of the alignment marks formed on the wafer WF can be detected as the position with respect to the X-Y coordinates. Denoted by references R19 and L19 are image pickup lenses, and denoted by references R20 and L20 are aperture stops each for limiting the value of numerical aperture (NA). The above-described cemented prism R15 (L15), the relay lens R16 (L16), the mirror R17 (L17), the index glass plate R17 (L17), the image pickup lens R19 (L19) and the aperture stop R20 (L20) constitute, together with a high-magnification image pickup tube CR (CL), a right-hand side light-receiving system (left-hand side light-receiving system). Thus, each of the cemented prisms R15 and L15 serves to combine the optical axis of the illumination system with the optical axis of the light-receiving system.

The light beam reflected from the wafer WF and passing through the objective lens RL (LL) is reflected by the internal reflection surface R15a (L15a) of the cemented prism R15 (L15) and, after being reflected by the semi-transmitting reflection surface R15b (L15b), is again reflected by the internal reflection surface R15a (L15a), so that the light beam is directed to the relay lens R16 (L16). Thus, the image of the alignment mark CRL12 (CRL11) or CRL12 (CLR11) of the wafer WF is once formed on the index glass plate R18 (L18) having the reference mark TPR (TPL). Thereafter, the image of the alignment mark of the wafer WF as well as the image of the reference mark TPR (TPL) are formed on the image pickup surface of the high-magnification image pickup tube CR (CL).

The high-magnification system in the off-axis alignment system will now be described in more detail. The light beam emitted from the illumination source R11 (L11) is converged by the condenser lens R12 (L12) to illuminate the aperture or apertures of the bright-field aperture stop R13A (L13A) or the dark-field aperture stop R13B (L13B). The light beam passing through the aperture stop enters into the relay lens R14 (L14) and, after being transmitted therethrough, enters into the cemented prism R15 (L15). The light beam entering into the cemented prism R15 (L15) is transmitted through the semi-transmitting reflection surface R15b (L15b) and is reflected by the internal reflection surface R15a (L15a), so that it is emitted toward the objective lens RL (LL). Then, the light beam passes through the objective lens RL (LL) to illuminate the wafer WF surface.

The light beam reflected by the surface of the wafer WF enters again the objective lens RL (LL) and, after being subjected to the imaging function of this objective lens, is incident on the cemented prism R15 (L15). Then, the light beam is reflected by the reflection surface R15a (L15a), so that it emerges therefrom and, after being relayed by the relay lens R16 (L16), is imaged on the index glass plate R18 (L18). Subsequently, by the image pickup lens R19 (L19), the light beam is re-imaged on the image pickup tube CR (CL).

Next, the dark-field detection mode is selected to allow easy observation and detection of the image of the alignment mark. Then, the thus obtained image of the alignment mark is picked up by the image pickup tube CR (CL), and the position of the alignment mark is detected by an electrical processing which will be described later. In accordance with the thus detected position of the alignment mark, the wafer stage WS is moved so that the first shot area (exposure area) of the wafer WF is located at a predetermined position in the projection field of the projection lens system PO.

The off-axis optical system further includes a pair of reflecting mirrors R21 and L21; a pair of erectors R22 and L22; a pair of aperture stops R23 and L23, like the aperture stops R20 and L20; and a pair of charge coupled devices (CCDs) CDR and CDL for the low-magnification alignment. These elements are operable substantially in the same manner as of the optical elements of the high-magnification alignment system, but with a low magnification. While, as described in the foregoing, the off-axis alignment system includes a pair of optical systems (i.e. the right-hand side and the left-hand side optical systems), this is not restrictive and one of the pair of optical systems may be omitted. The provision of the pair of optical systems, is, however, preferable because it allows simultaneous detection of two spaced alignment marks, which assures high-speed and high-accuracy alignment operation.

Figure 14:
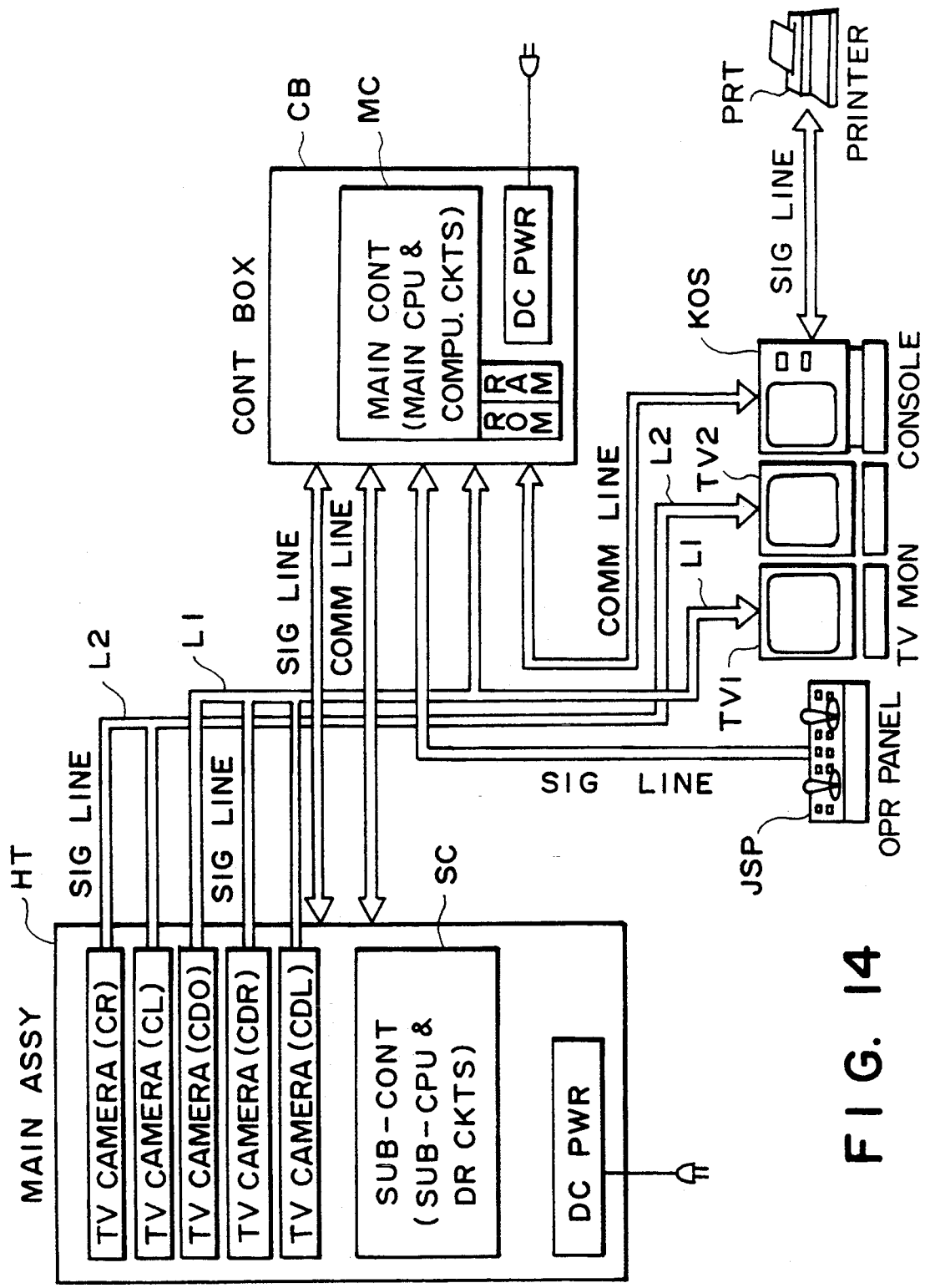
FIG. 14 is a block diagram schematically showing a major portion of the alignment and exposure apparatus of the FIG. 1 embodiment.

FIG. 14 is a block diagram generally showing the electrical connections in the alignment and exposure apparatus of this embodiment. The main assembly includes, as well as the system HT shown in FIG. 1, an auxiliary central processing unit (CPU) and various drive circuits, i.e. various control circuits for controlling various units such as shown in FIGS. 8 and 9, for example. The TV cameras of low-magnification denoted by references CDO, CDR and CDL are connected to a first TV receiver TV1 via a signal line L1, while the TV cameras CR and CL of high-magnification are connected to a second TV receiver TV2 via a signal line L2.

A control box CB accommodates therein a control unit MC, including a main central processing unit (CPU) and a high-speed computing circuit, as well as a read only memory (ROM) and a random access memory (RAM). The RAM stores therein various instructions such as shown in the flow charts which will be described later. A console KOS is provided to execute various controls such as the setting of various parameters, etc., and a printer PRT is provided to produce printed information about the apparatus.

Figure 15A:
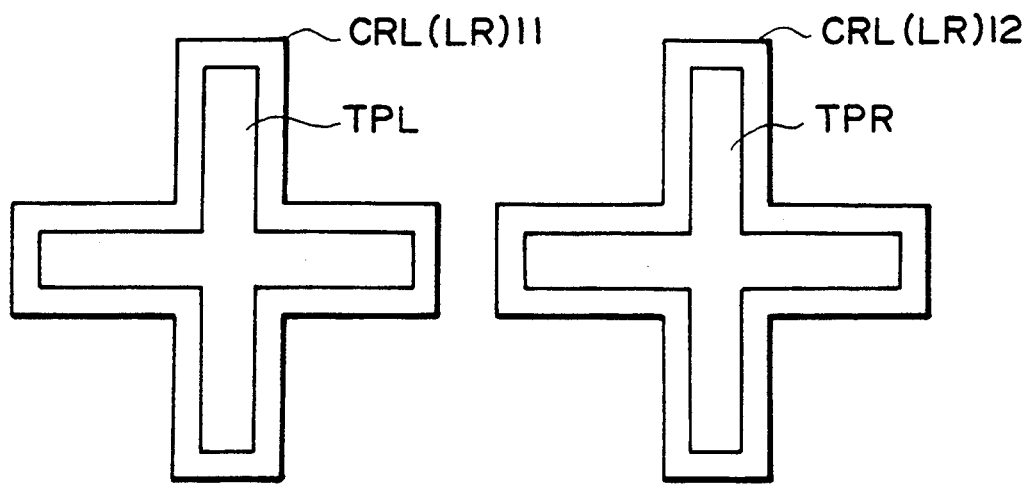
FIGS. 15A–15C are schematic views, respectively, showing displays in TV monitors.
Figure 15B:
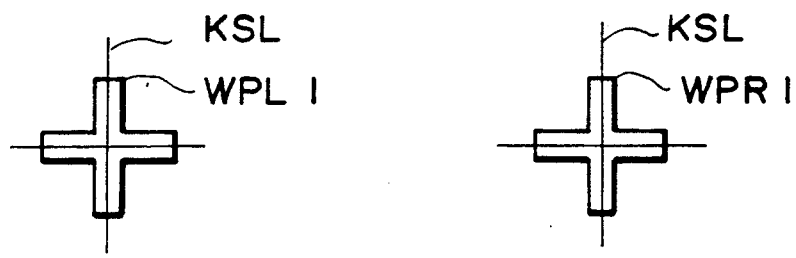
Figure 15C:
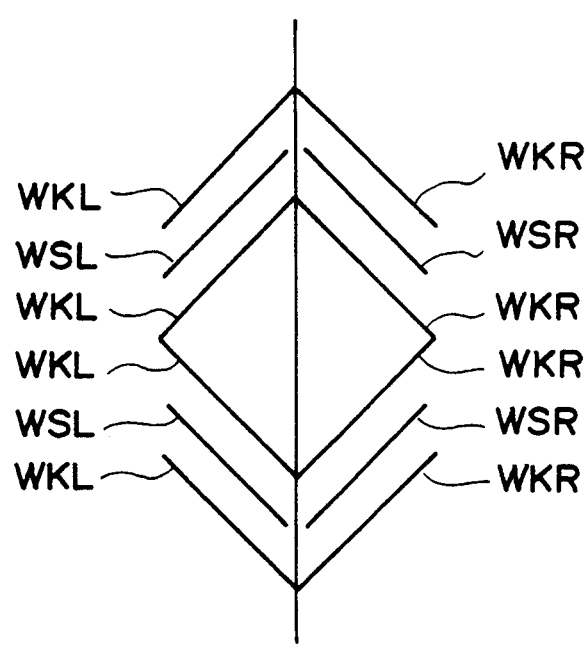

FIGS. 15A–15C are examples of displays in the TV monitors during the off-axis alignment and the TTL alignment. Of these Figures, FIG. 15A shows the display in the TV monitor TV2, for the high-magnification alignment, during the off-axis alignment operation. As shown in this Figure, the reference marks TPR and TPL of the index glass plates R18 and L18 of the off-axis alignment optical system OA in FIG. 12 and the alignment marks CRL12 and CRL11 (CLR12 and CLR11), for the high-magnification alignment, of the wafer WF shown in FIG. 13 are displayed, so that the degree of alignment of these marks can be observed. FIG. 15B shows the display in the TV monitor TV1 for the low magnification alignment, and the alignment marks WPR1 and WPL1 for the low-magnification alignment, of the wafer WF shown in FIG. 13 and the reference lines (cursor lines) KSL–KSL, which are electronically set, are displayed. FIG. 15C shows the display in the TV monitor TV1, for the low-magnification, in a case where the TTL alignment optical system AS is used to observe the wafer alignment marks WKR and WKL of the wafer WF and the reticle alignment marks WSR and WSL of the reticle RT. Thus, the relative position or the degree of alignment of these marks can be observed through the projection lens system PO, i.e., in the TTL alignment manner. In a case where the automatic reticle-and-wafer alignment is not possible for any reason, a particular manual alignment mark may be printed on the scribe line of the wafer WF while a mating manual alignment mark may be formed on the reticle. These manual alignment marks of the wafer and the reticle can be observed through the TV monitor to achieve the reticle-and-wafer alignment manually. As for the manual alignment mark, a cross mark such as shown in FIG. 15A or 15B, rather than those shown in FIG. 15C, is preferable because of ease of observation of the degree of alignment.

Figure 16A:
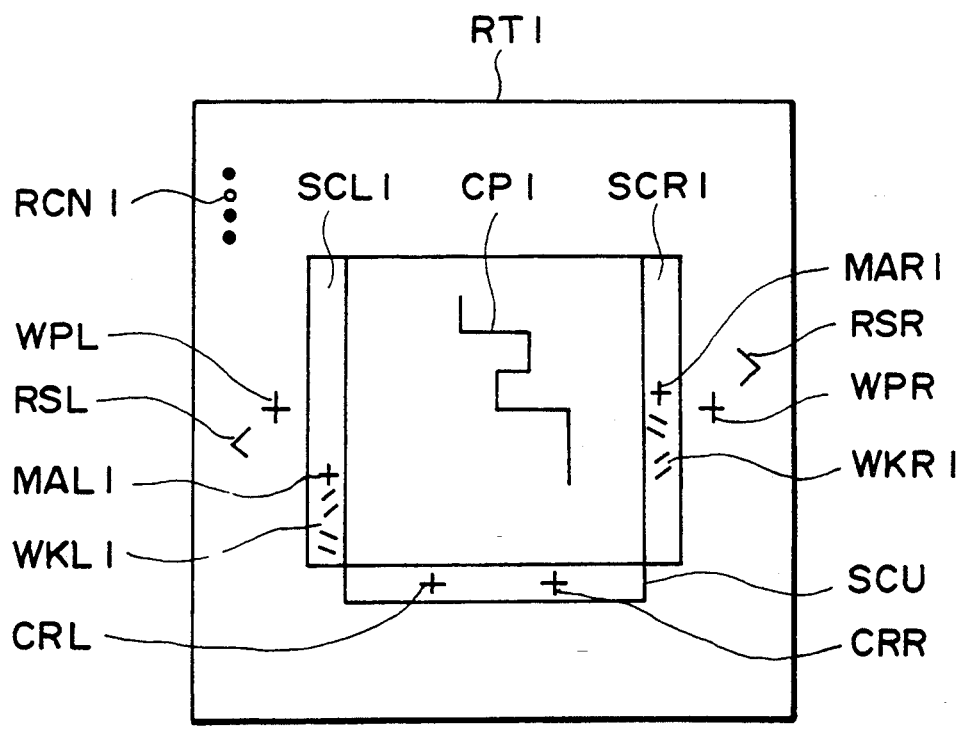
FIGS. 16A and 16B are schematic views, respectively, showing examples of reticles.
Figure 16B:
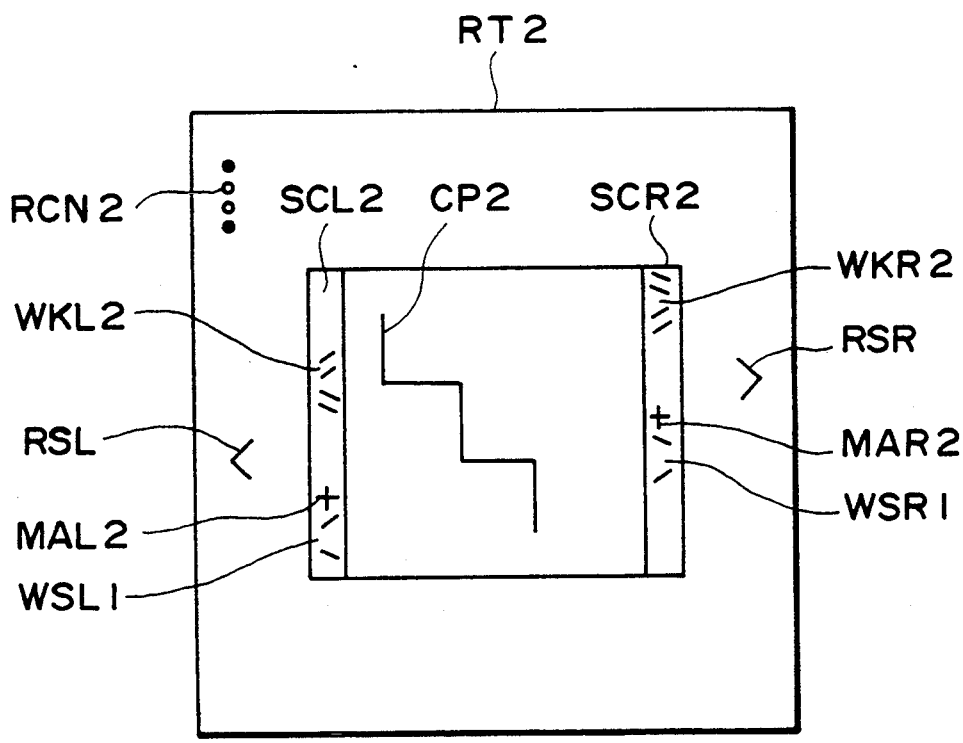
Figure 16C:
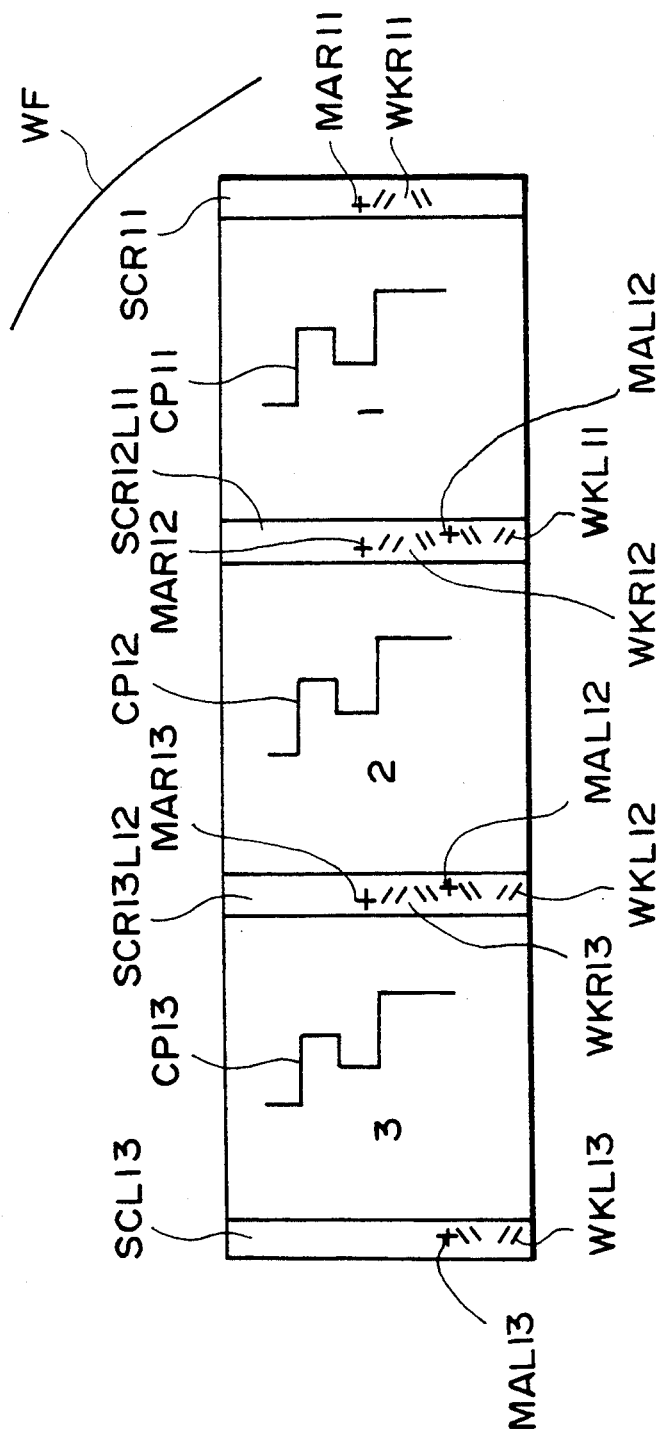
FIGS. 16C and 16D are schematic views, respectively, showing the manner of step-and-repeat exposure of the wafer.
Figure 16D:
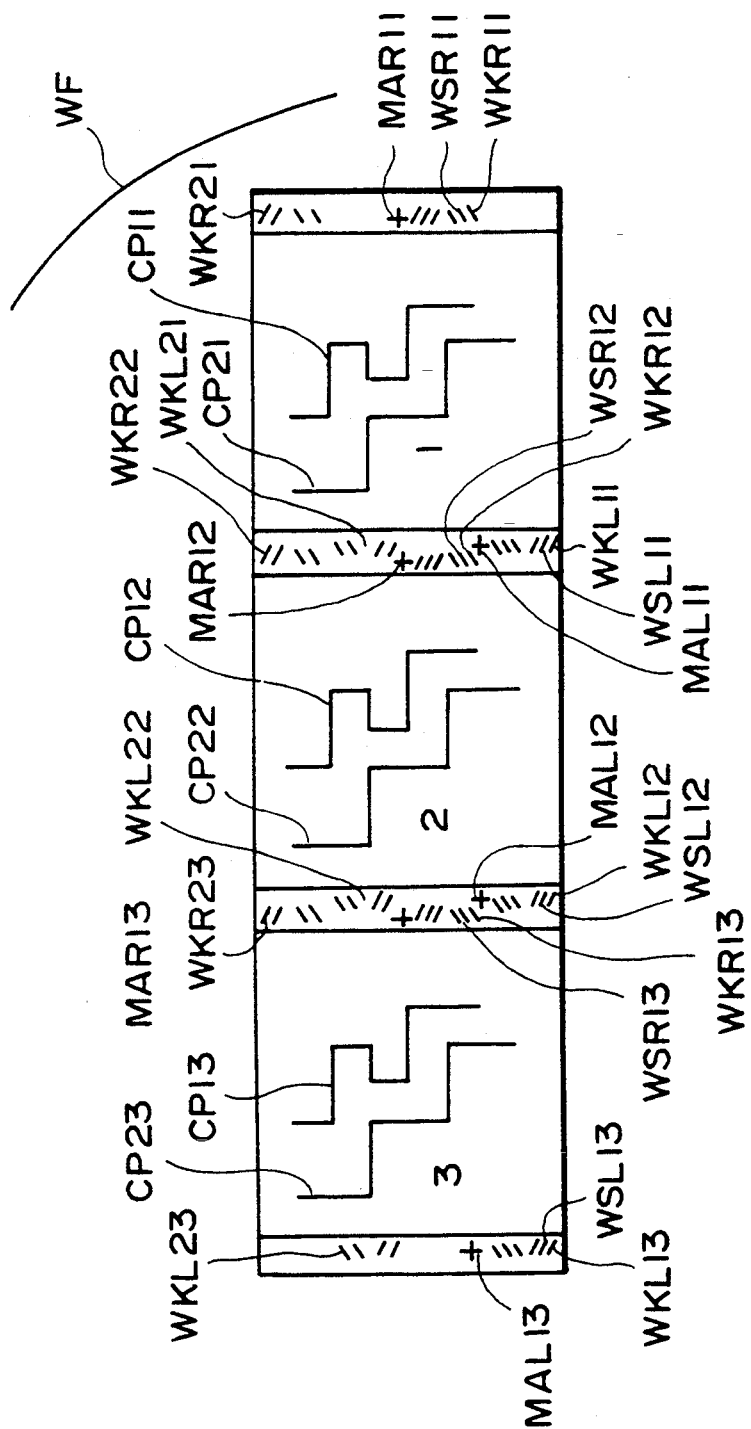

FIG. 16A shows an example of a first reticle which is to be used with virgin wafers, and FIG. 16B shows an example of a second reticle which is to be used with the wafers to which the pattern of the first reticle has already been transferred. FIG. 16C shows the manner of sequential exposures of the wafer WF (which is the virgin wafer in this case) to the pattern of the first reticle RT1, and FIG. 16D shows the manner of sequential exposures, to the pattern of the second reticle RT2, of the wafer WF to which the pattern of the first reticle RT1 has already been transferred. In these Figures, denoted by references CP1 and CP2 are the circuit patterns (the actual element patterns) formed on the reticles RT1 and RT2, respectively, and denoted by references SCR1, SCL1, SCR2 and SCL2 are the scribe lines or areas of the reticles RT1 and RT2, respectively. These scribe lines are defined on the opposite sides of the circuit pattern area. The first reticle RT1 has reticle marks WKR1 and WKL1 formed for the sake of alignment with the second reticle RT2. If necessary, the above-described manual alignment marks MAR1 and MAL1 are formed on the first reticle RT1 in place of or in juxtaposition with the reticle marks WKR1 and WKL1. The first reticle RT1 has a third scribe line SCU in which two alignment marks CRR and CRL are formed for the sake of high-magnification alignment. The size of each of these alignment marks CRR and CRL is smaller than that of each of the alignment marks WPR and WPL provided for the low-magnification alignment. These two alignment marks CRR and CRL are transferred onto the wafer at particular shots, such as, for example, the shots Nos. 20 and 26 shown in FIG. 13, as the alignment marks CRL11 and CLR11; CRL12 and CLR12. As described hereinbefore, the alignment mark CRL12 mates with the alignment mark CRL11, while the alignment mark CLR12 mates with the alignment mark CLR11, during the off-axis alignment. The provision of these two pairs of alignment marks is very preferable, because it increases the possibility that, at the time of initiation of the off-axis alignment, either pair of alignment marks are located within the view fields of the objective lenses RL and LL of the off-axis alignment optical system OA shown in FIG. 5.

Referring back to FIG. 16A, denoted in this Figure by references WPR and WPL are the alignment marks provided for the sake of low-magnification alignment. Also, denoted by references RSR and RSL are reticle alignment marks which are to be aligned with the reference marks RKR and RKL, respectively, formed on the projection lens system PO, for the sake of positioning of the reticle. Each of the reference marks RKR and RKL has a shape similar to that of the alignment mark WKR1 or WKL1, so that the reference marks RKR and RKL mate with the alignment marks RSR and RSL, respectively, in a similar manner as the mating of the alignment marks during the TTL alignment shown in FIG. 15C, for example. By aligning the reticle alignment marks RSR and RSL with respect to the reference marks RKR and RKL, the reticle is aligned with respect to the projection lens PO automatically.

The second reticle RT2 has alignment marks WKR2 and WKL2 which are to be used for the succeeding alignment operation, and alignment marks WSR1 and WSL1 which are to be used for the current alignment operation. Each of the alignment marks WKR2 and WKL2 has a shape similar to that of the alignment mark WKR1 or WKL1, while each of the alignment marks WSR1 and WSL1 has a shape similar to that of the alignment mark RSR or RSL. Denoted in FIGS. 16A and 16B by references RCN1 and RCN2 are reticle numbers, respectively, each in the form of a code. Each of the reticle numbers RCN1 and RCN2 can be read by the TTL alignment optical system AS of FIG. 5, whereby the number of reticle, being treated, is automatically identified. The code of the reticle number is formed on the reticle at the time of manufacture of the circuit pattern and various marks.

Similar to the reticle number, the wafer WF has a wafer number WCN shown in FIG. 13 which is also in the form of a code. This wafer number can be printed onto the wafer by means of the TTL alignment optical system AS and then can be read by means of the same TTL alignment optical system AS or off-axis alignment optical system OA. The reading of the reticle number and/or the wafer number may be effected in response to the information preparatively supplied from the console KOS of FIG. 14 or sequential information supplied in a real-time manner.

When, in operation, the first reticle RT1 of FIG. 16A is positioned on the projection lens system PO such as shown in FIG. 5, the light-intercepting device BL of FIG. 2 is adjusted to set or define a light-transmitting aperture allowing exposure of the scribe lines SCR1 and SCL1 of the reticle RT1 as well as the circuit pattern CP1 area thereof, such as shown in a part (A) of FIG. 17. Then, as shown in FIG. 16C, the sequential exposures of the wafer WF are effected in an order from the right to the left as viewed in this Figure. Namely, at the first shot area (exposure area) 1, the manual alignment marks MAR1 and MAL1 of the reticle RT1 are transferred onto the wafer WF as marks MAR11 and MAL11, while the alignment marks WKR1 and WKL1 of the reticle RT1 are transferred onto the wafer WF as marks WKR11 and WKL11. Of course, the circuit pattern CP1 of the reticle RT1 is transferred onto the wafer to print thereon a circuit pattern CP11. Actually, since the pattern of the reticle RT1 is projected onto the wafer WF by means of the projection lens system PO, the image formed on the wafer WF is inverted in both the X and Y directions, with respect to the pattern of the reticle RT1. For the sake of ease of understanding, however, each image of the reticle pattern formed on the wafer is illustrated in the drawings as an erected image. The remaining shot areas on the wafer WF are exposed in a similar manner and in sequence. It is to be noted that a scribe line defined between two adjacent shot areas, such as a scribe line SCR12L11 defined between the circuit patterns CP11 and CP12, is used as a common mark-printing area for the two adjacent shot areas. This is effective to save the wafer area. Because of such single scribe line arrangement between adjacent shot areas, the marks WKR1 and WKL1 of the reticle RT1 are located in a diagonally deviated relation so that the marks WKR11 and WKL11 to be printed on the wafer are diagonally deviated from each other. This arrangement is effective to prevent unpreferable overlap of the marks WKR12 and WKL11. In this manner, sequential exposures of the wafer WF (which is the virgin wafer in this case) are effected according to the step-and-repeat technique, in an order of the shot numbers, Nos. 1-45 shown in FIG. 13. When a particular shot, e.g. each of the shots Nos. 20 and 26, is going to be exposed, the blades of the light-intercepting device BL is adjusted to set an aperture allowing exposure of the portion of the reticle RT1 including the lower scribe line SCU, such as shown in a part (B) of FIG. 17. By this, the high-magnification alignment marks CRL and CRR of the reticle RT1 are transferred onto the wafer to print, on the lower scribe line of each of the shots 20 and 26, the marks CLR11 and CRL11; CLR12 and CRL12. Also, upon exposure of particular shots, e.g. the shots 41 and 45, the aperture of the light-intercepting device BL is adjusted to allow exposure of the low-magnification alignment mark WPR or WPL, such as shown in a part (C) or (D) of FIG. 17. Accordingly, the alignment marks WPR1 and WPL1 are formed on the wafer for the sake of low-magnification alignment. In this manner, the exposure operation with respect to the first wafer WF is completed. The sequence of exposure of the shot areas, in the order as denoted by numerals 1-45 in FIG. 13, is preferable because it requires a minimum displacement of the wafer stage WS. After completion of exposure, the wafer WF is replaced with another virgin wafer which is then treated in a similar manner. After the exposure operations relative to the wafers corresponding to one lot are completed, the first reticle RT1 is discharged and the second reticle RT2 is placed on the projection lens system PO. The second reticle RT2 has an arrangement shown in FIG. 16B, as described in the foregoing. At the time at which the first shot area is to be exposed, the mark WSR1 of the reticle RT2 is aligned with the mark WKR11 of the wafer WF, while the mark WSL1 of the reticle is aligned with the mark WKL11 of the wafer by using the TTL alignment optical system AS. Such accurate alignment is effected before initiation of the exposure. Then, by the exposure, the circuit pattern CP2 of the reticle RT2 is printed on the circuit pattern CP11, as a pattern CP21. Also, the mark WSR1 of the reticle RT2 is printed on the wafer WF at a position between the mark elements of the mark WKR11, so that the mark WKR11 is no longer usable. In view of this, the reticle RT2 has marks WKR2 and WKL2 which are provided for the performing of the succeeding alignment operation and are located at upwardly shifted positions. During exposure, these marks are transferred onto the wafer as marks WKR21 and WKL21 for the first shot area, such as shown in FIG. 16D. In this manner, new alignment marks are sequentially formed on the wafer, and any "old" mark is prevented from being used. This is effective to preclude degradation of the detection sensitivity.

Usually, ten or more kinds of reticles are necessary for the manufacture of semiconductor devices. While each of the scribe lines shown in the drawings has an area only for accommodating the marks necessary for the alignment with respect to two reticles, this is merely for purposes of illustration. In practice, each scribe line has a sufficient area so that a number of alignment marks can be printed. Of course, the same alignment mark may be used for the purpose of plural alignment operations. During manual alignment operation, the marks MAR2 and MAL2 of the reticle RT2 are aligned with the marks MAR11 and MAL11, printed during the preceding exposure operation, by using the TV monitor TV2 of the low-magnification alignment system.

Figure 18:
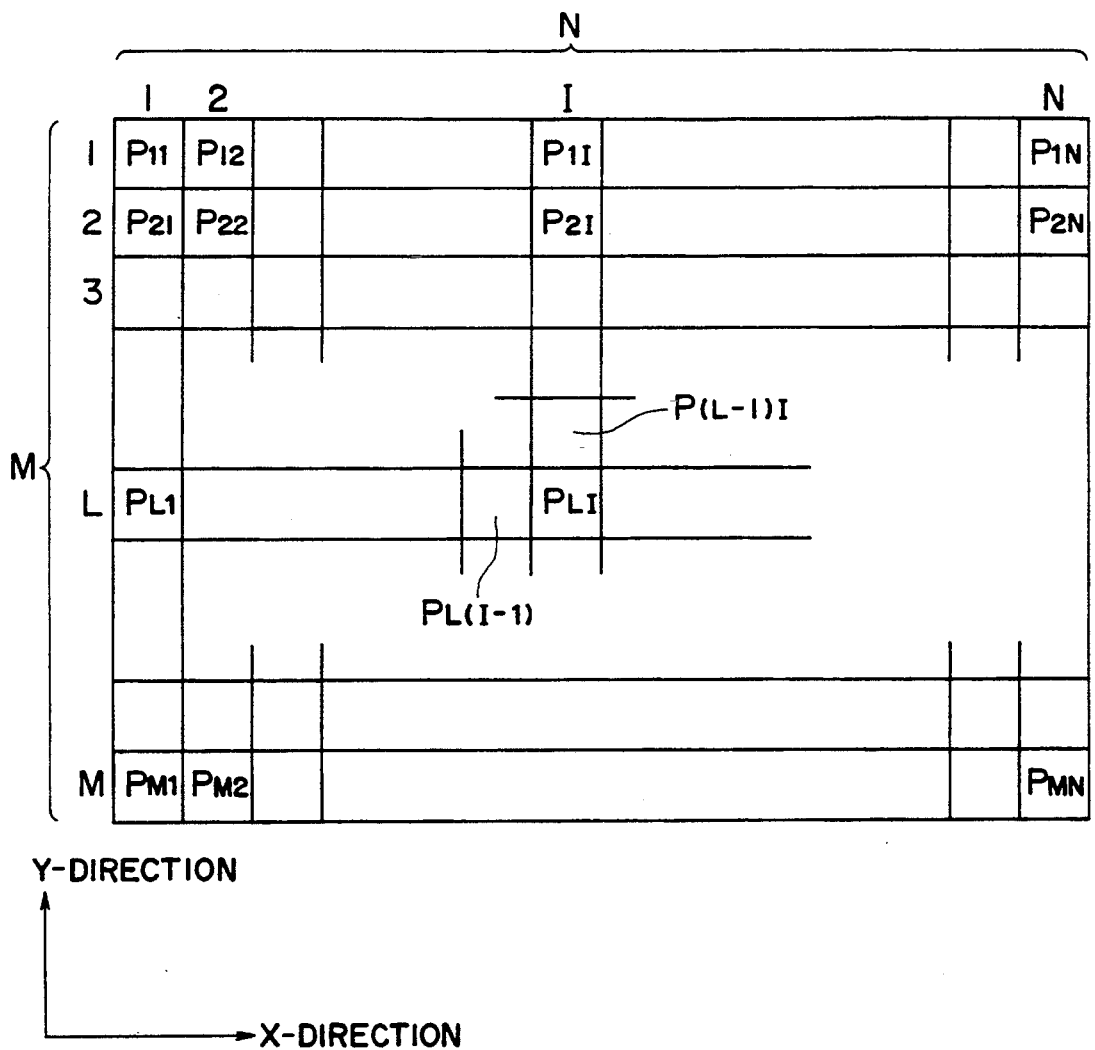
FIG. 18 is a schematic view showing an example of division of a TV picture plane.

In FIG. 18, there are shown plural picture elements which are defined by dividing the TV picture plane (shown in FIG. 14 or 15) into N (an integral number) with respect to the X-direction and into M (an integral number) with respect to the Y-direction. A reference character $P_{LI}$ denotes a picture element located on row or line L on column I. The dividing number M in the Y-direction is usually equal to the number of horizontal scanning lines. Accordingly, division into picture elements MxN can be achieved by effecting N-times sampling operations, within the duration of one horizontal synchronizing signal.

Therefore, the adding operation with respect to the X-direction is expressed as follows:

$$S_{X1} = \text{Data}(P_{11}) + \text{Data}(P_{12}) + \ldots + \text{Data}(P_{1N})$$
$$S_{X2} = \text{Data}(P_{21}) + \text{Data}(P_{22}) + \ldots + \text{Data}(P_{2N})$$
$$\vdots$$
$$S_{XM} = \text{Data}(P_{M1}) + \text{Data}(P_{M2}) + \ldots + \text{Data}(P_{MN})$$

The adding operation with respect to the Y-direction is expressed as follows:

$$S_{Y1} = \text{Data}(P_{11}) + \text{Data}(P_{21}) + \ldots + \text{Data}(P_{M1})$$
$$S_{Y2} = \text{Data}(P_{12}) + \text{Data}(P_{22}) + \ldots + \text{Data}(P_{M2})$$
$$\vdots$$
$$S_{YN} = \text{Data}(P_{1N}) + \text{Data}(P_{2N}) + \ldots + \text{Data}(P_{MN})$$

At the time at which the adding operation is completed, an X-direction integration memory has stored therein the data of $S_{X1}, S_{X2} \ldots S_{XM}$ while a Y-direction integration memory has stored therein data of $S_{Y1}, S_{Y2}, \ldots S_{YN}$.

An example of alignment mark is shown in FIG. 19, a part (A), which is in the form of a cross. By the density integration in the X and Y directions in the manner described above, density distributions shown in parts (B) and (C) of FIG. 19 are obtained. The distribution (B) shows the result of integration in the X direction, while the distribution (C) shows the result of integration in the Y direction. It is seen from FIG. 19 that each of the density distributions (B) and (C) is characterized by a two-step curve. By setting, to such density distribution, two slice levels such as XSL1 and XSL2 shown in the part (C) of FIG. 19, patterns such as shown in the parts (D) and (E) of FIG. 19 are obtained on the basis of binarization. Thus, when the centers of patterns obtained by the binarization are aligned with each other, the point of coincidence designates the position of the center of the alignment mark with respect to the X or Y direction.

Figure 20A:
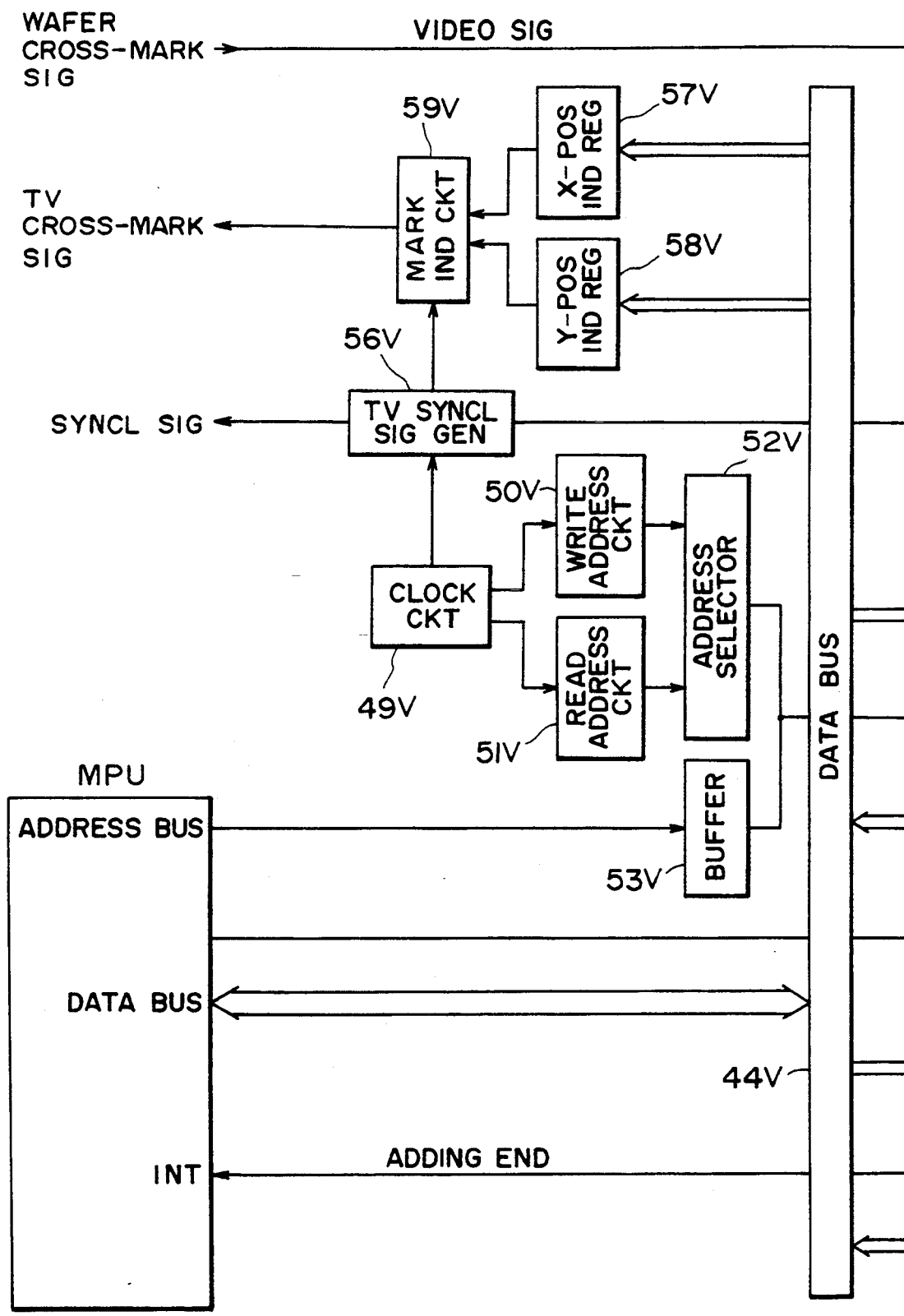
FIGS. 20(a–c) are block diagrams showing an alignment mark detecting circuit of the alignment and exposure apparatus of FIG. 1.
Figure 20B:
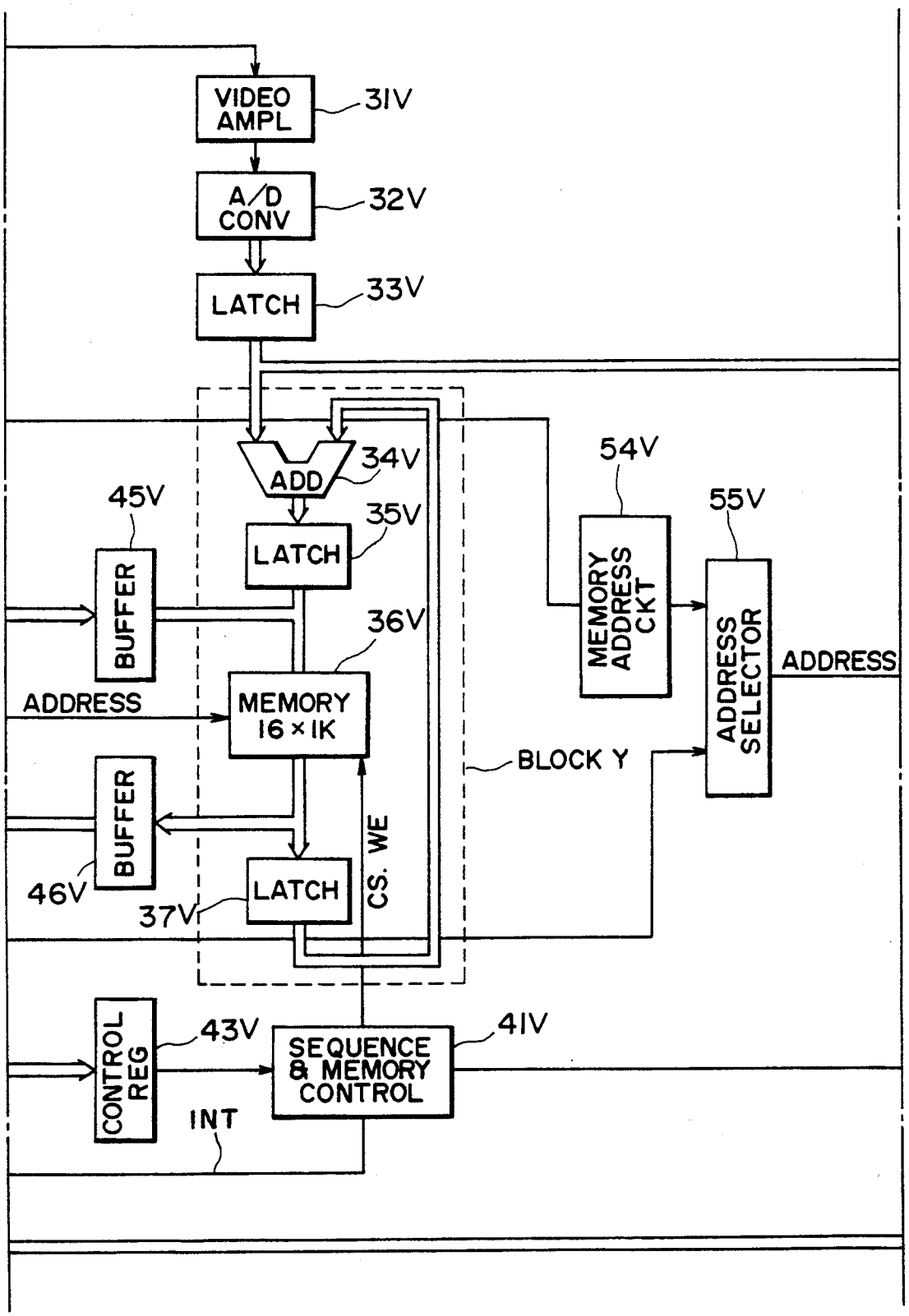
Figure 20:
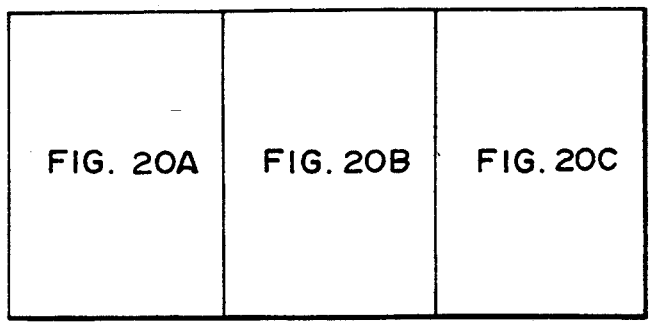

Referring now to FIG. 20, there is shown an example of an alignment mark detecting circuit.

In the block diagram of FIG. 20, a block X (broken line) shows a portion of the system which is effective to add up the densities of the picture elements in the X-direction, while a block Y (broken line) shows another portion of the system which is effective to add up the densities of the picture elements in the Y-direction.

As is shown in FIG. 20, the system includes a video amplifier 31V, and analog-to-digital converter 32V and a latch 33V. A video signal supplied from a TV camera control unit is amplified by the video amplifier 31V and the amplified video signal is converted by the analog-to-digital converter 32V into a digital signal. The digital signal is then stored in the latch 33V. An output data of the latch 33V is supplied to each of the X-direction adding block X and the Y-direction adding block Y.

The block Y comprises an adder 34V for adding up or integrating the data in the Y-direction, an adding output latch 35V for latching an output data of the adder 34V, a Y-direction integration memory 36V for storing therein the data supplied from the adding output latch 35V, and an adding input latch 37V for latching an output data from the memory 36V.

The block X comprises an adder 38V for adding up or integrating the data in the X-direction, a latch 39V for latching an output of the adder 38V, and an X-direction integration memory 40V for storing therein the output data from the latch 36V.

The bit number of the digital data for the above-described system is not limited to a particular one and, in the disclosed example, the analog-to-digital converter 32V is of the 8-bit type while each of the adders 34V, 38V and memories 36V, 40V is of the 16-bit type.

The system further includes a sequence and memory control circuit 41V for controlling chip selection and read/write of the memory 36V, and a memory control circuit 42V for controlling the memory 40V in the block X. A control register 43V is provided to allow a microprocessor MPU to control the sequence-and-memory control circuit 41V. An input to the control register 43V is supplied by a data bus 44V of the microprocessor. Also, the microprocessor MPU is able to access through this data bus 44V to the memories 36V and 40V. For this purpose, buffers 45V, 46V, 47V and 48V are provided. Among them, each of the buffers 45V and 47V is operative when the microprocessor operates to write the data in the memory 36V or 40V, while each of the buffers 46V and 48V is operative when the data is to be read. The system further includes a clock circuit 49V, a memory write address circuit 50V and a memory read address circuit 51V for producing, respectively, a write address and a read address for the X-direction integration memory 36V. An address selector 52V is effective to interchange the read address and the write address for the memory. An address buffer 53V is provided which is operative when the microprocessor accesses the memory 36V. When the microprocessor MPU does not access, the output of the address selector 52V is selected while the output of the buffer 53V is inhibited. A memory address circuit 54V produces an address for the X-direction integration memory 40V, and an address selector 55V operates to interchange the address from the memory address circuit 54 and the address to be produced when the microcomputer MPU accesses the memory 40V.

A TV synchronizing signal generating circuit 56V is provided to generate, using the clock from the clock circuit 49V as the reference, a horizontal synchronizing signal, a vertical synchronizing signal, a blanking signal or the like for the television system. An X-position indicating register 57V and a Y-position indicating register 58V are provided each of which is connected to the data bus 44V of the microcomputer MPU. Also these registers 57V and 58V are connected to a marker indicating circuit 59V. Thus, when the microprocessor supplies output information about the position of the alignment mark, as detected by the TV alignment, to each of the X-position indicating register 57V and the Y-position indicating register 58V, the marker indicating circuit 59V produces a mixed signal which is applied to a video input terminal of the TV camera control unit. Also, this signal is fed to the CPU of FIG. 9 from the microprocessor MPU, whereby the wafer stage is moved to the mark discriminating position through the servo motor.

The details of the function and operation of the alignment mark detecting circuit of FIG. 20 will now be described.

The detecting circuit has functions of (1) integration of the data in the X-direction, (2) integration of the data in the Y-direction and (3) indication or display, in the TV monitor, the detected position of the prealignment mark. As regards the integration of the data in the X- direction and in the Y-direction, of the above-described functions, the adding operation is carried out by the adders 34V and 38V of the TV alignment detecting circuit and the data resulting from the adding operation is stored in the memory. The adding operation is carried out relative to the TV signals for each frame. The adding operation may be effected relative to only one frame or relative to each of plural frames, if necessary. In any case, during the adding operation, the data bus and the address bus for the memories 36V and 40V are electrically isolated from the data bus 44V and the address bus of the microprocessor MPU. The address of the memory 36V is connected to that of the address selector 52V while the address of the memory 40V is connected to that of the address selector 55V. Thus, the adding operation is carried out under the control by the read/write signal and the chip selection signal produced by the sequence and memory control circuit 41V and the memory control circuit 42V.

Upon completion of the adding operation relative to the frame of frames of the predetermined number, the sequence and memory control circuit 41V produces an adding end signal which is supplied along an interruption signal line INT. After generation of the adding end signal, the microprocessor accesses the memories 36V and 40V to detect the position of the TV alignment mark on the basis of the results of the adding operation. When the microprocessor accesses the memories 36V and 40V, the address, read/write signal, chip selection signal or the like for each memory are of course controlled by a control signal supplied from the microprocessor. The data of the memory 36V is supplied via the buffer 46V, while the data of the memory 40V is supplied via the buffer 48V, both to the data bus 44V whereby they are read by the microprocessor.

Figure 21:
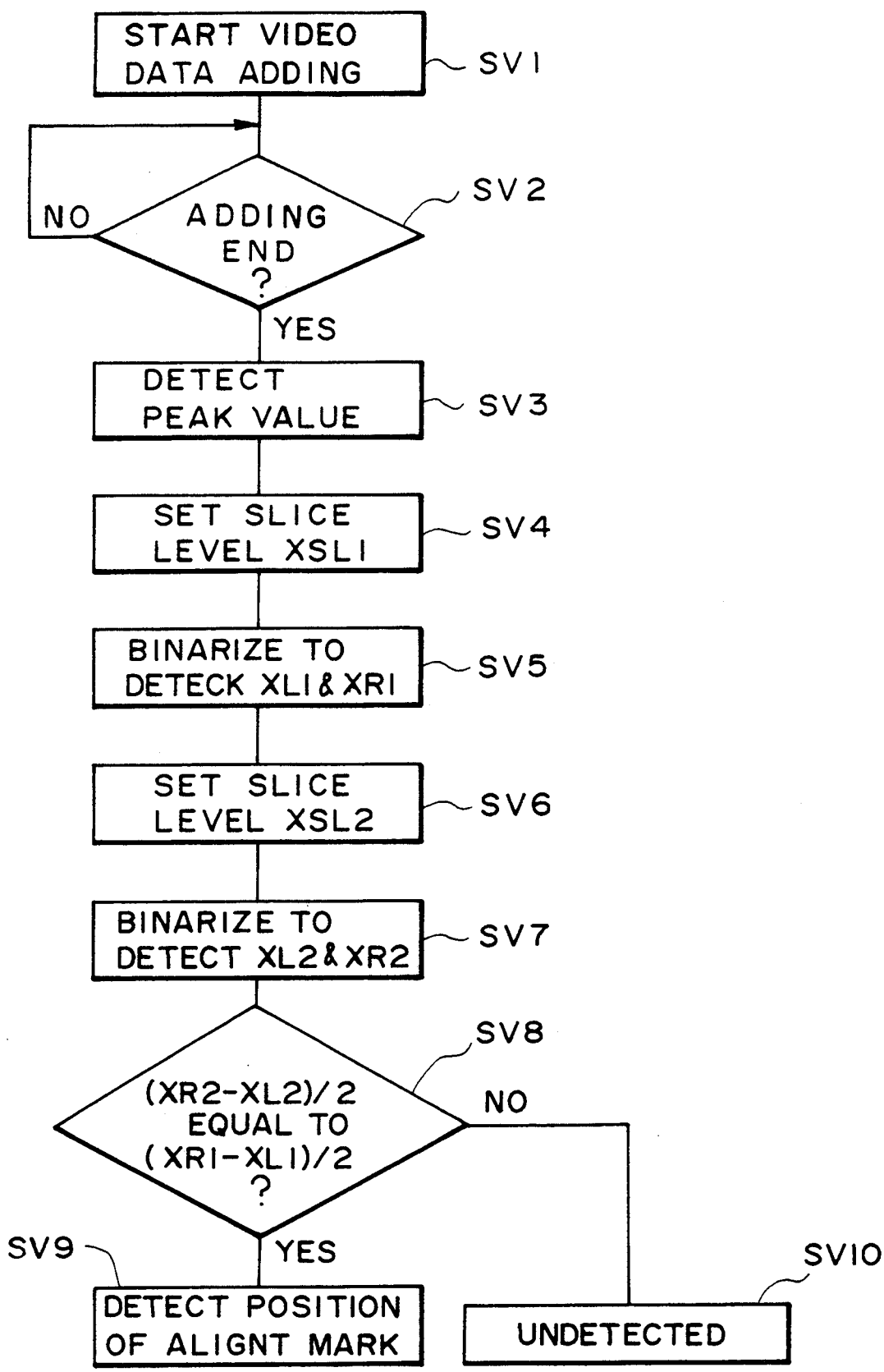
FIG. 21 is a flow chart showing an alignment mark detecting operation of the system of FIG. 20.
Figure 22A:
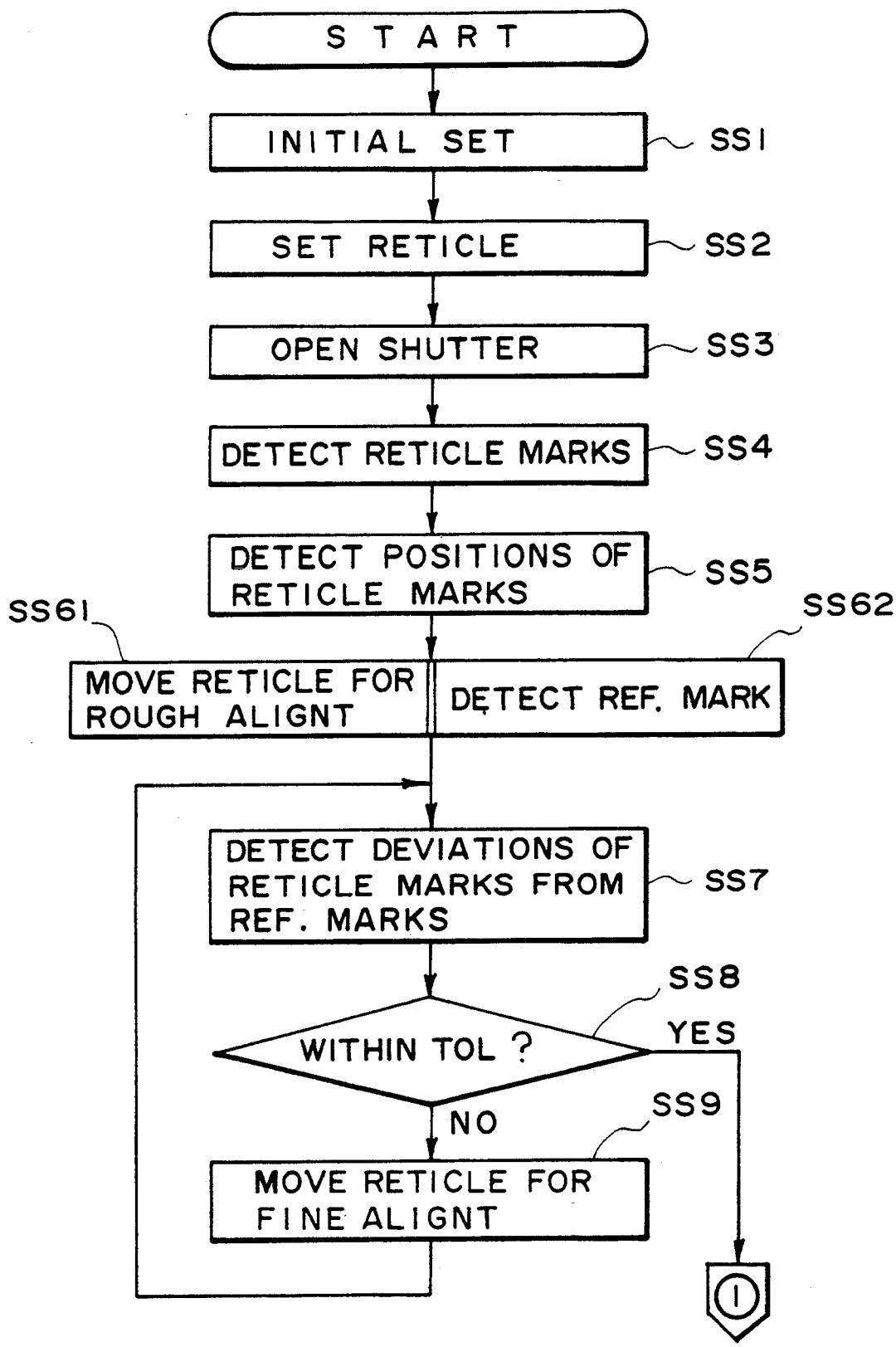
FIGS. 22A–22E, 23A–23F, 24A–24C, 25A–25C, 26A and 26B are flow charts, respectively, showing alignment and exposure operations in various modes according to the present invention.
Figure 22B:
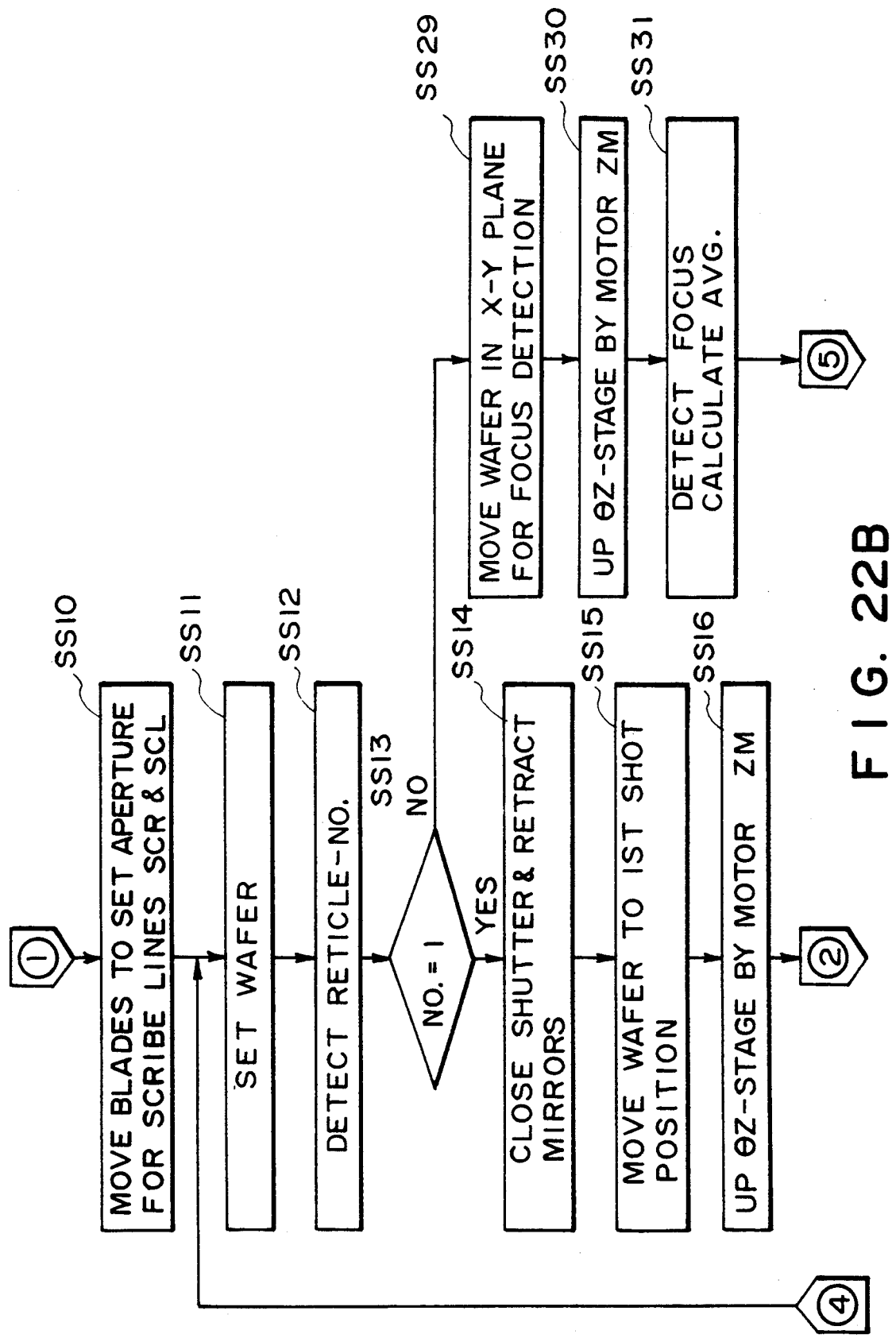
Figure 22C:
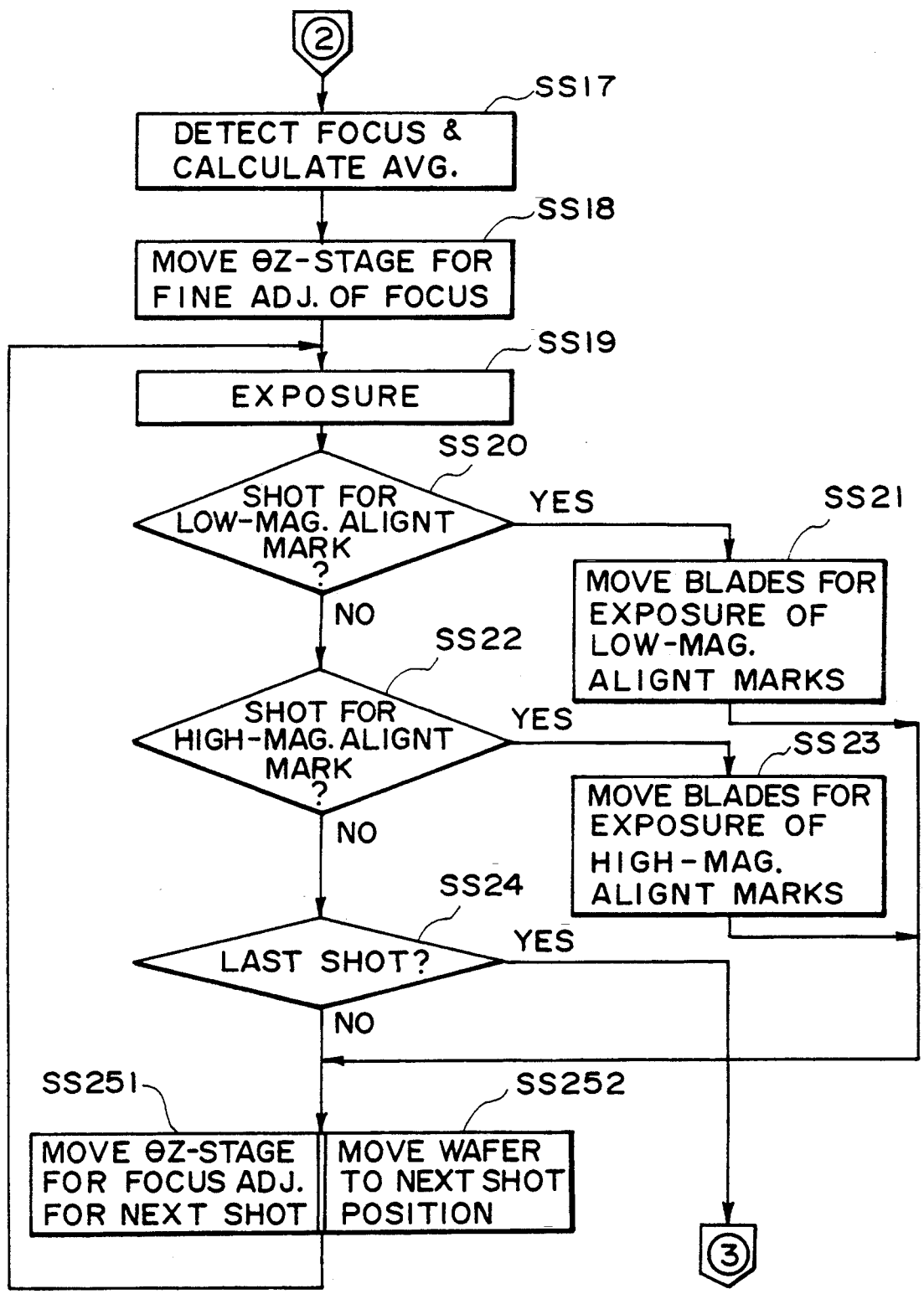
Figure 22D:
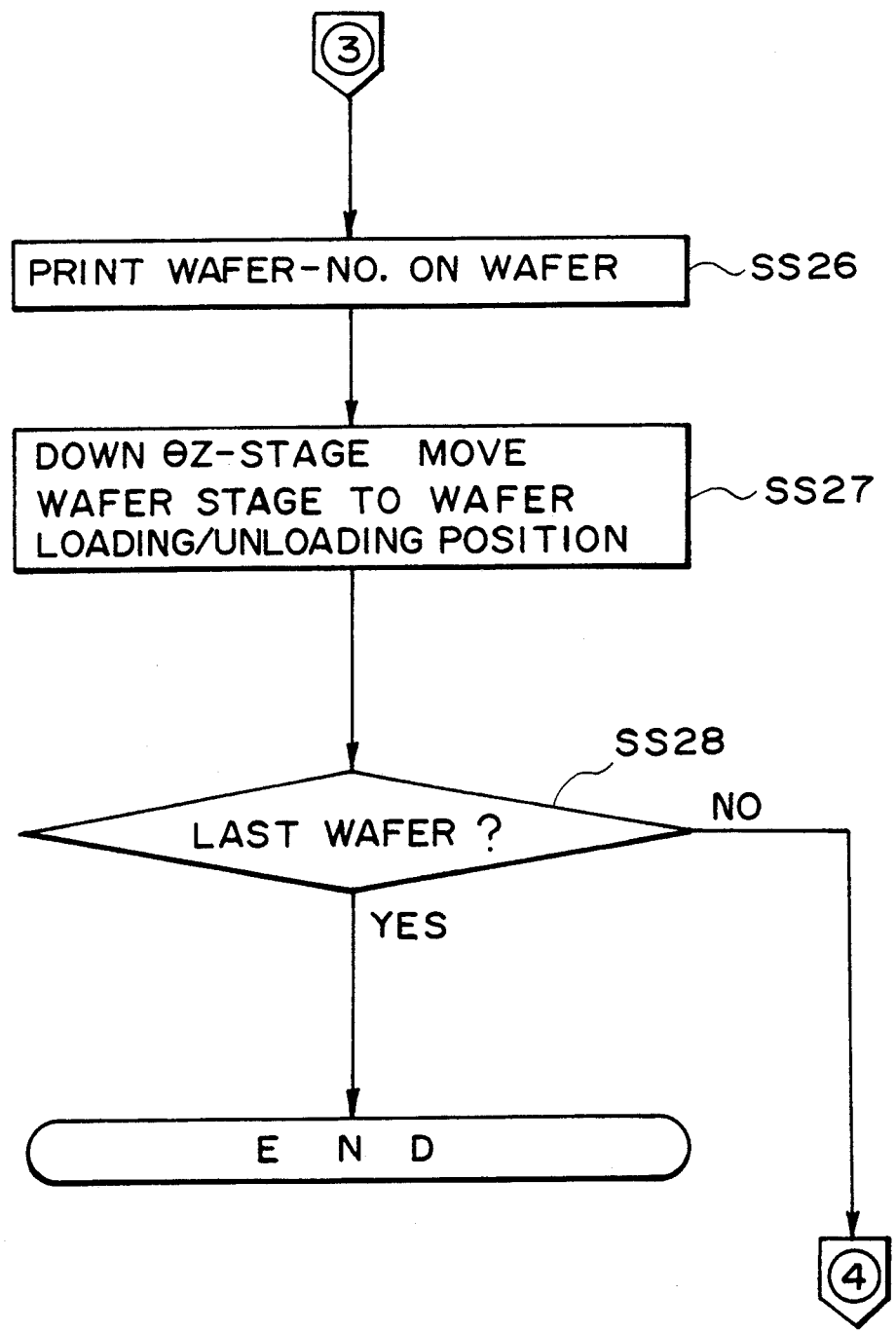
Figure 22E:
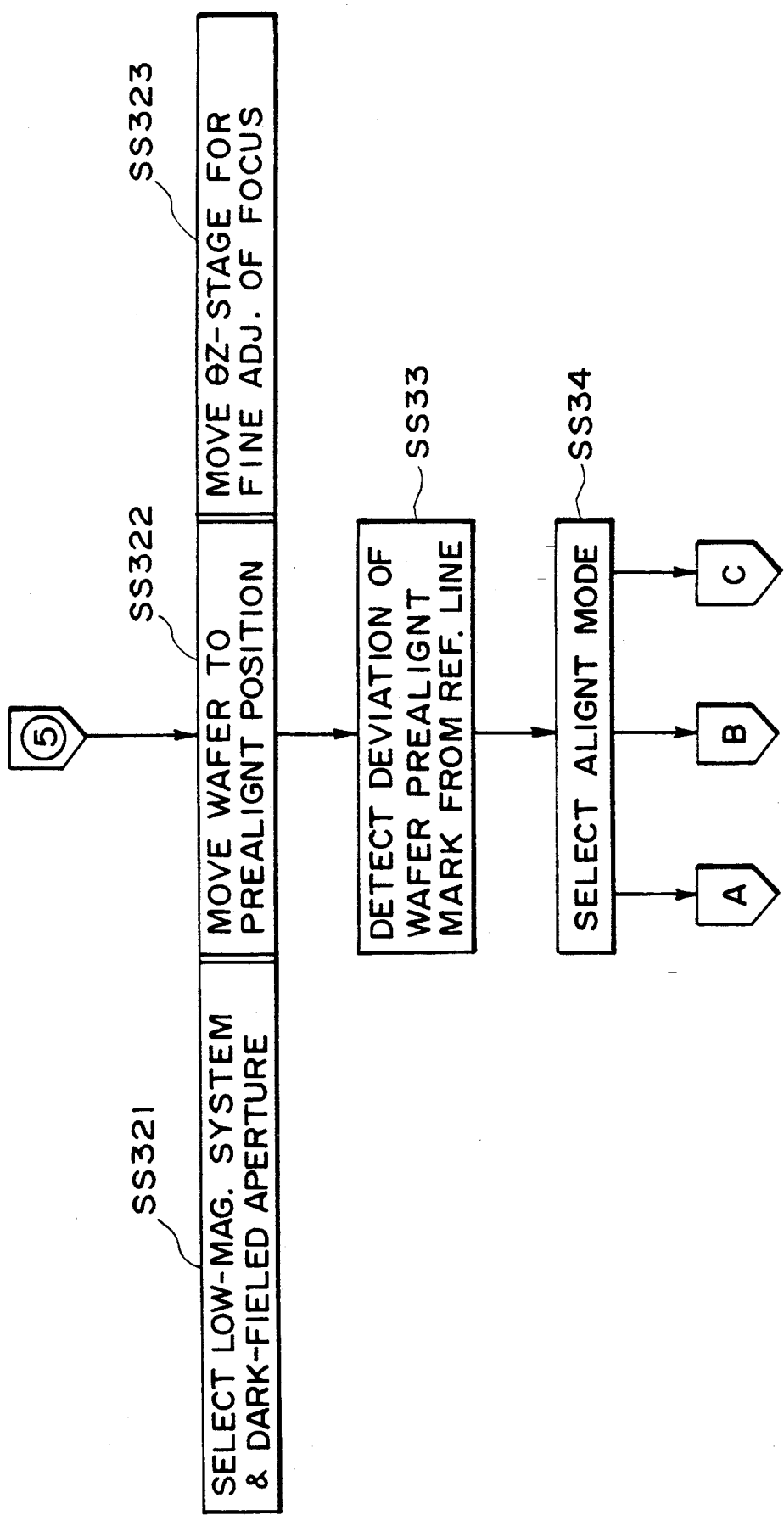

The operation will now be described in more detail in conjunction with the flow chart of FIG. 21. When the microprocessor outputs an instruction signal for instructing the density integration (Step SV1), the integration of the density with respect to each of the X and Y directions is initiated in the manner described above. The microprocessor is kept in a stand-by state until the adding operation is completed (Step SV2). If the adding operation relative to a predetermined number of frames is completed, then the sequence proceeds to Step SV3. At Step SV3, the microprocessor is operated to search or detect the maximum value and minimum value of the image density data stored in the memory. When they are detected, then the sequence proceeds to Step SV4 in which the slice levels XSL1 and WSR1 are set. As for the slice level WSL1, a level which is approximately 70%, for example, of the difference between the maximum and minimum values, i.e. the peak value is selected. Next, at Step SV5, the data in the memory is compared with the slice level XSL1, and, on the basis of the binarization, the positions XL1 and XR1 are detected. Similarly, a level which is approximately 20%, for example, of the peak value is selected for the slice level XSL2 (Step SV6), and the positions XL2 and XR2 are detected at Step SV7, in a similar manner as the Step SV5.

In the manner described above, the patterns (D) and (E) of FIG. 16, namely the positions XL1, XR1, XL2 and XR2 are determined. Then, at Step SV8, (XR2−XL2)/2 is calculated, the result of which is compared with (XR1−XL1)/2. If there is not a substantial difference, the detected positions are discriminated as being those related to the alignment mark and, so, the sequence proceeds to step SV9. If, on the other hand, the result of comparison at step SV8 shows that there is a substantial difference, then the detected positions are discriminated as being those not related to the alignment mark, and, so, the sequence proceeds to step SV10. In such case, different slice levels are newly set to repeat the detection. Alternatively, the sequence proceeds to a particular step for searching the alignment mark, when it is discriminated that any alignment mark is not. located within the field of the picture plane. The positions YL1, YR1, YL2 and YR2 with respect to the Y direction can be detected in a similar manner.

The advantageous points of the embodiment shown in FIG. 16 are: (1) that the random noises are averaged by the integration so that the S/N ratio is improved; (2) that the position in the X direction and the position in the Y direction can be detected independently from each other, so that the detection itself is simplied; and (3) that the necessary capacity of the memory for storing the video data is decreased.

The operation of the alignment and exposure apparatus of the FIG. 1 embodiment will now be described in more detail in conjunction with the flow charts of FIGS. 22A–26B.

First, at Step SS1, the initial setting of all the components of the apparatus is effected. For example, the content of the memory RAM is cleared, the TTL alignment optical system AS is moved, as a whole, in the Y direction and the objective lenses 11R and 11L and the objective mirrors 12R and 12L are moved in the X direction to positions opposing to the reticle reference marks RKR and RKL, respectively, formed on the projection lens system PO. Also, each of the objective mirrors 12R and 12L is inclined to its 45-degree position to allow the laser beam to be incident on the mark position. Further, the reticle stage, the wafer stage and the edge masking blades are moved to the respective initial positions.

Next, at Step SS2, the reticle RT is held by suction on the reticle chuck RC. Then, at step SS3, the laser shutter BS is opened in preparation for the alignment of the reticle RT. At Step SS4, the alignment optical system AS is moved, as a whole, in the Y direction by an unshown pulse motor, while the objective lenses 11R and 11L and the objective mirrors 12R and 12L are moved in the X direction by a pulse motor (not shown), to thereby detect the existence of the reticle set marks RSR and RSL of the reticle RT with the detectors 18R and 18L. The positional deviation of each of the marks RSR and RSL from corresponding one of predetermined reference points is measured by corresponding one of the detectors 18R and 18, whereby the current positions of the marks RSR and RSL are detected (Step SS5). At the subsequent Step SS61, each of the pulse motors PX, PY and P$\theta$ of the reticle stage RS is driven by an amount corresponding to the detected positional deviation, whereby the marks RSR and RSL of the reticle RT are moved to positions close to the reference marks RKR and RKL, respectively. At the same time, the objective lenses 11R and 11L and the objective mirrors 12R and 12L are moved back to the positions opposing to the reticle reference marks RKR and RKL, respectively, in preparation for the fine alignment.

Then, at Step SS7, the positional deviation between the reticle reference mark RKR (RKL) of the projection lens PO and the reticle set mark RSR (RSL) of the reticle RT with respect to each of the X and Y directions is detected by the detector 18R (18L). Hereinafter, the positional deviation in the X direction will be referred to also as the "X deviation", while the positional deviation in the Y direction will be referred to also as "Y deviation". On the basis of the results of detection, averages of X-deviations and Y-deviations with respect to the set marks RSR and RSL are calculated. Then, at Step SS8, whether or not each of the averages obtained at Step SS7 is within the tolerance is discriminated. If within the tolerance, the sequence proceeds to Step SS10. If not within the tolerance, the sequence proceeds to Step SS9 in which each of the pulse motors PX, PY and P$\theta$ of the reticle stage RS is again driven so as to align the reticle reference marks RKR and RKL with the set mark RSR and RSL. Until the deviation comes into the tolerance, the steps SS7 and SS$\theta$ are repeated to move the reticle stage RS. When it is discriminated in the CPU that the tolerance is satisfied, then the sequence proceeds to Step SS10. At Step SS10, the exposure area on the reticle RT is set. That is, the blades of the light-intercepting device BL are moved to set the aperture area to allow exposure of the circuit pattern CT area and the scribe lines SCR and SCL of the reticle RT, such as shown in the part (A) of FIG. 17.

Subsequently, at Step SS11, a first wafer WF is held by suction of the wafer chuck WC of the wafer stage WS. This wafer is a virgin wafer which has not been exposed to any circuit pattern. Therefore, no alignment mark is printed thereon.

Then, at Step SS12, the objective mirror 12R or 12L is moved to a position effective to detect the reticle number RCN of the reticle RT. As described in the foregoing, the reticle number RCN is in the form of a code and is read by the detector 18L or 18R. By this, the number or kind of the reticle RT is automatically discriminated. As a source of illumination for such detection, the element 19R or 19L may be used. Since the reticle RT is the first reticle, the sequence proceeds to Step SS14 by way of Step SS13 which is a discrimination step. At Step SS14, the laser shutter BS is closed and the position of each of the objective mirrors 12R and 12L is changed from the 45-degree inclined position to a vertically (Z direction) extending position so that the lower portion of each of the mirrors does not interfere with the exposure beam. Then, at Step SS15, the wafer stage WS is moved by the servo motors XM and YM in the X and Y directions through predetermined amounts, respectively, so as to locate the first shot area of the wafer WF at a position exactly under the projection lens system PO. This movement of the wafer stage WS is very precisely controlled by means of the laser interferometer LZ. Thereafter, at Step SS16, the pulse motor ZM is driven to move upwardly the $\theta$Z-stage at a higher speed so as to move the wafer WF, whose first shot area is located under the projection lens PO, into a range in which the air-sensors AG1–AG4 mounted on the projection lens PO are operable to detect the state of focus of the projection lens with respect to the wafer WF surface. After the wafer WF is moved into the focus-detectable range, each of the air-sensors AG-1–AG4 detects the distance to the surface of the wafer WS, i.e. the focus, the detection results being stored into the random access memory RAM so that an average is calculated (step SS17). This average is regarded as the "distance" from the end face of the projection lens PO to the wafer surface with respect to the first shot area. On the basis of this average and of a target focus (a target position corresponding to the focal plane of the projection lens PO), the $\theta$Z-stage is moved upwardly or downwardly by the pulse motor ZM and/or the piezoelectric device PZ, as described in the foregoing, until the wafer surface reaches the target position (Step SS18). Next, the shutter ST for the exposure light source LP is released for a predetermined time period to expose the first shot area of the wafer WF, whereby the circuit pattern CP of the reticle RT as well as the alignment marks WKR1 and WKL1 formed in the scribe lines SCR and SCL of the reticle are transferred onto the first shot area of the wafer.

Subsequently, various discriminations are effected at steps 20, 22 and 24. That is, Step SS20 is a step for discriminating whether or not the current shot is one for transferring the low magnification alignment marks WPR and WPL. Step SS22 is a step for discriminating whether or not the current shot is one for transferring the high-magnification alignment marks CRR and CRL. Step SS24 is a step for discriminating whether or not the current shot is the last shot. If all the results of these discriminations are "NO", then the sequence proceeds to step 251 and 252. At Step SS251, one of the air-sensors which is located at a position closest to the next shot area detects the focus information related to the next shot area. The $\theta$Z-stage is moved upwardly or downwardly by the pulse motor ZM and/or the piezoelectric device PZ until the focus is satisfied. Simultaneously therewith, at Step SS252, the wafer stage WS is moved by the servo motors XM and YM in the X and Y directions so as to locate the next shot area at a position exactly under the projection lens PO. Also, the X-Y movement of the wafer stage is very precisely controlled by means of the laser interferometer LZ. In this manner, accurate stepwise movement, focus detection and exposure are repeated sequentially.

If, at Step SS20 or SS22, it is discriminated that a predetermined particular shot area is located at the exposure position, then, the aperture of the light-intercepting device BL is adjusted so as to allow exposure of the low-magnification alignment mark WPR or WPL (see the part C or D of FIG. 17) or to allow exposure of the high-magnification alignment marks CRR and CRL (see the part B of FIG. 17). When the wafer stage is moved so that any ordinary shot area is located at the exposure position in place of the above-described particular shot area, the blades BL are moved again to define an aperture for the exposure of such ordinary shot areas (see the part A of FIG. 17).

If the last shot area has been exposed, the sequence proceeds to Step SS26 from the Step SS24. At Step SS26, the wafer stage WS is moved by the motors XM and YM to a predetermined position established for the sake of printing of the wafer number. Then, the laser shutter BS is opened for a time period sufficient for printing, whereby the wafer number and/or a lot number WCN which is also in the form of a code is printed on a peripheral portion of the wafer WF (see FIG. 14). Then, at Step SS27, the wafer stage WS is moved to a wafer loading/unloading position to discharge the wafer WF. At the same time, the $\theta$Z-stage is moved by the pulse motor ZM to its initial lowermost position. Subsequently, at Step SS28, whether or not the next wafer which is now going to be fed is the last wafer is discriminated. This discrimination is based on the comparison of the number of the wafers having been introduced to the wafer stage with the predetermined number which the operator has specified in the microprocessor from the console. If not the last wafer, the sequence returns to Step SS11 and the operations following Step SS11 are repeated.

The above-described exposure process for transferring the circuit pattern and the alignment marks of the first reticle is repeatedly effected relative to each of a predetermined number and lots of wafers. When this is completed, the first reticle is replaced by a second reticle and the circuit pattern of the second reticle is superposingly transferred onto each of the shot areas of each wafer which has already been subjected to the exposure process using the first reticle. That is, the circuit pattern of the second reticle is superposed on the already printed circuit pattern in each shot area of the wafer. Such superposing exposure is repeated until the circuit pattern of the last reticle is superposingly transferred onto each shot area.

When the second reticle is introduced to the alignment and exposure apparatus, the above-described Steps SS1–SS13 are repeated. Since, at Step SS13, it is detected that the reticle No. is not "1", the sequence proceeds to Step SS29. At Step SS29, the wafer stage WS is moved by the motors XM and YM in the X and Y directions to place the wafer WF at a position below the air-sensors AG1–AG4. Then, at Step SS30, the $\theta$Z-stage of the wafer stage WS is upwardly moved by the pulse motor ZM at a higher speed, like Step SS16. Then, at Step SS31, focus detecting operation and the average calculating operation are effected, like Step SS17. Thereafter, the sequence proceeds to Steps SS321–SS323. That is, at Step SS321, the mirrors R18 and L18 of the off-axis alignment optical system OA are set to select the low-magnification alignment system and, at the same time, the dark-field aperture stop R13B and L13B are moved to their operative positions. Simultaneously therewith, the wafer stage WS is moved by the motors XM and YM in the X and Y directions so as to locate the low-magnification alignment marks WPR1 and WPL1 of the wafer WF, having been mechanically prealigned, at positions approximately below the objective lenses RL and LL (i.e. the TV prealignment position) (Step SS322). Also at the same time, the $\theta$Z-stage is moved upwardly or downwardly by the motor ZM and/or the piezoelectric device PZ, until the wafer surface reaches the position corresponding to the target or desired focus (Step SS323). The movement of the wafer stage to locate the marks WPR1 and WPL1 at the positions below the objective lenses RL and LL, respectively, is controlled according to a predetermined constant. Subsequently, at Step SS33, the deviation of each of the prealignment mark WPR1 and WPL1 of the wafer WF from the reference line KSL (the cursor in the TV picture plane) is detected with respect to each of the X and Y directions. The detected deviations with respect to the X and Y directions are stored in the random access memory RAM. Thereafter, at Step SS34, one of plural alignment modes, modes A–C, is selected. Thus, the alignment, the stepwise movement, the exposure, etc. are effected in accordance with the selected mode. Each alignment mode will be described below.

Alignment Mode A

First, at Step SA11, the wafer stage WS is moved by the motors XM and YM in the X and Y directions so as to locate the high-magnification alignment marks CRL12 and CRL11 (CLR12 and CLR11) of the wafer WF at positions approximately below the objective lenses RL and LL, respectively. The amount of movement of the wafer stage with respect to each of the X and Y directions is determined by adding a predetermined amount to the amount of deviation, in corresponding one of the X and Y directions, of the wafer prealignment marks WPR1 and WPL1 from the position of the reference line KSL. At the same time, the $\theta$Z-stage is rotated by the pulse motor $\theta$M by an amount corresponding to the amount of $\theta$ (rotational) deviation calculated from the above-described deviations of the wafer prealignment marks WPR1 and WPL1 from the reference line KSL with respect to the X and Y directions (Step SA12).

Next, at Step SA2, the mirrors R18 and L18 of the off-axis alignment optical system OA are set to select the high-magnification alignment system. By this high-magnification alignment system, the deviations of the alignment marks CRL12 and CRL11 (CLR12 and CLR11) from the reference marks TPR and TPL with respect to the X and Y directions are detected (Step SA3). Also, at this Step SA3, the amount of expansion/contraction of the wafer is detected. If the detected amount of wafer expansion/contraction is within an acceptable tolerance, the amount of expansion/contraction is shared between the X deviations of the righthand side and the left-hand side alignment marks, the shares being added to the X deviations, respectively. Subsequently, at Step SA4, whether or not each of the X and Y deviations is within a tolerance is discriminated. If the tolerance is not yet satisfied, the wafer stage WS is moved by the servo motors XM and YM and by the pulse motor $\theta$M in the X, Y and $\theta$ directions so as to align the marks CRL12 and CRL11 (CLR12 and CLR11) with respect to the reference marks TPR and TPL, respectively (Step SA5). Then, the sequence returns to Step SA3 and the above-described operations are repeated. If, on the other hand, the result of discrimination at Step SA4 shows that the tolerance is satisfied, the sequence proceeds to Steps SA61 and SA62. At Step SA61, the wafer stage WS is moved by the servo motors XM and YM in the X and Y directions through predetermined amounts so as to locate the first shot area of the wafer WF at a position exactly under the projection lens PO. The amount of movement of the wafer stage with respect to each of the X and Y directions is determined in accordance with a value obtained by adding a predetermined constant to the current position of the wafer WF. At the same time, the $\theta$Z-stage of the wafer stage WS is moved upwardly by the pulse motor ZM (Step SA62). This is because of the fact that the focal length of the projection lens PO is shorter than that of the each of the objective lenses RL and LL.

Thereafter, as has been described with reference to the exposure process using the first reticle, the focus detection and average calculation (Step SA7), the movement of the $\theta$Z-stage for fine adjustment of focus (Step SA81), the retracting movement of the mirrors 12R and 12L (Step SA82) and the exposure (Step SA9) are effected. Further, the focus adjustment for the next shot area (Step SA111), the stepwise movement of the wafer stage to the next shot position (Step SA112) and the exposure (Step SA9) are repeated until the last shot area is exposed. When it is discriminated at Step SA10 that the exposure of the last shot area is completed, the sequence proceeds to Step SA12. At Step SA12, the wafer stage WS is moved by the servo motors XM and YM to a position at which the wafer No. WCN of the wafer can be detected. If, for example, the TTL alignment optical system AS is used for the sake of such detection, the wafer is moved so that its wafer No.

WCN is located just below the projection lens PO. Then, the wafer No. WCN which is in the form of a code is read by the detector 18R or 18L. As an illumination source usable for the sake of such detection, the light source 19R or 19L may be used in place of the laser source IS. Alternatively, the off-axis alignment optical system OA may be used to read the wafer No. WCN. In such case, the wafer stage WS is moved so as to locate the wafer No. WCN at a position just below either the objective lense RL or LL. In any case, the detected wafer No. WCN is stored in the random access memory RAM. Subsequently, at Step SA14, the $\theta Z$-stage is moved to its lowermost position by the pulse motor ZM and, at the same time, the wafer stage WS is moved to the wafer loading/unloading position, whereby the wafer is discharged. If the last wafer has not yet been treated (Step SA15), then the sequence returns to Step SS11 shown in FIG. 22B and the operations following the Step SS11 are repeated.

Figure 23A:
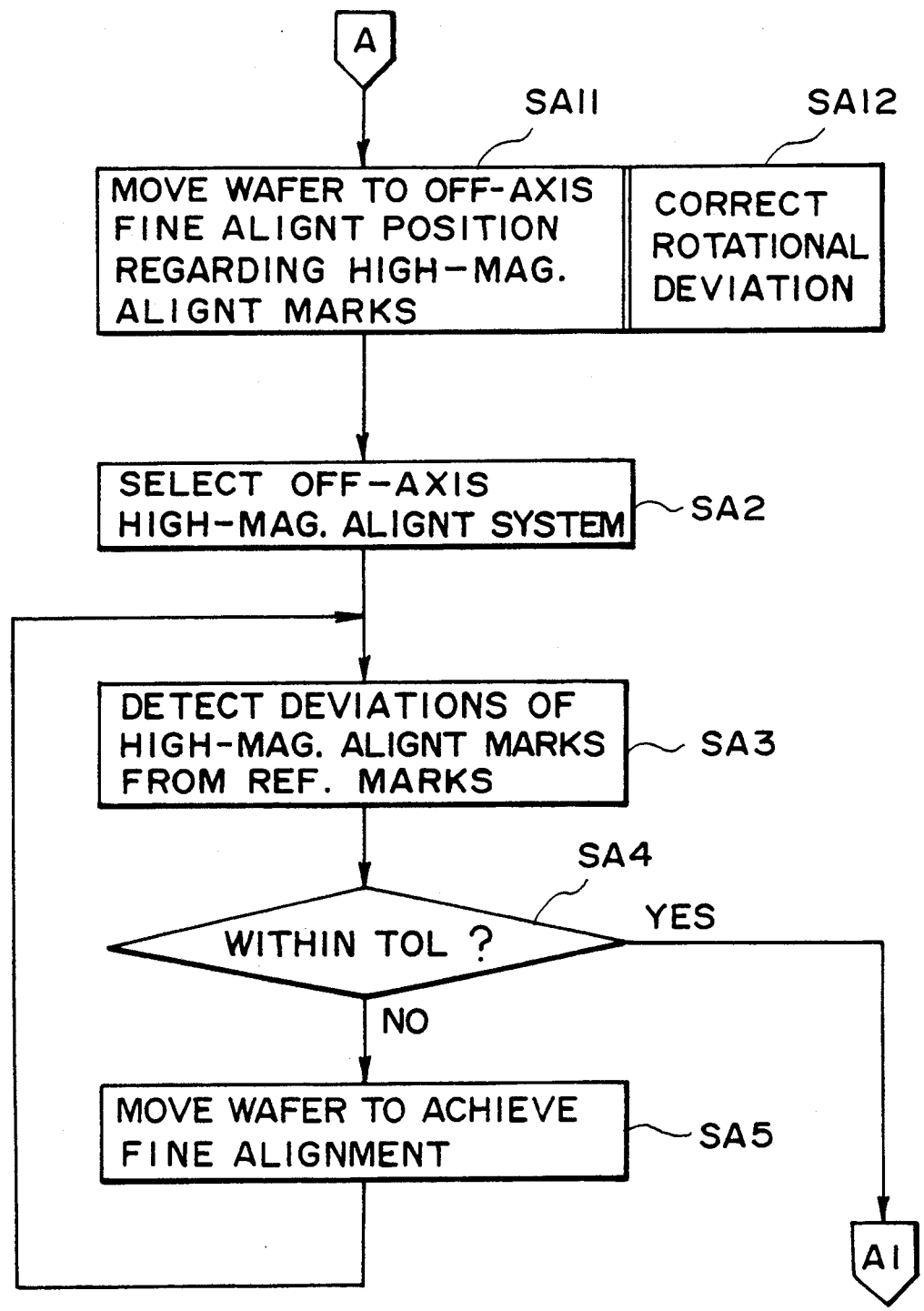
Figure 23B:
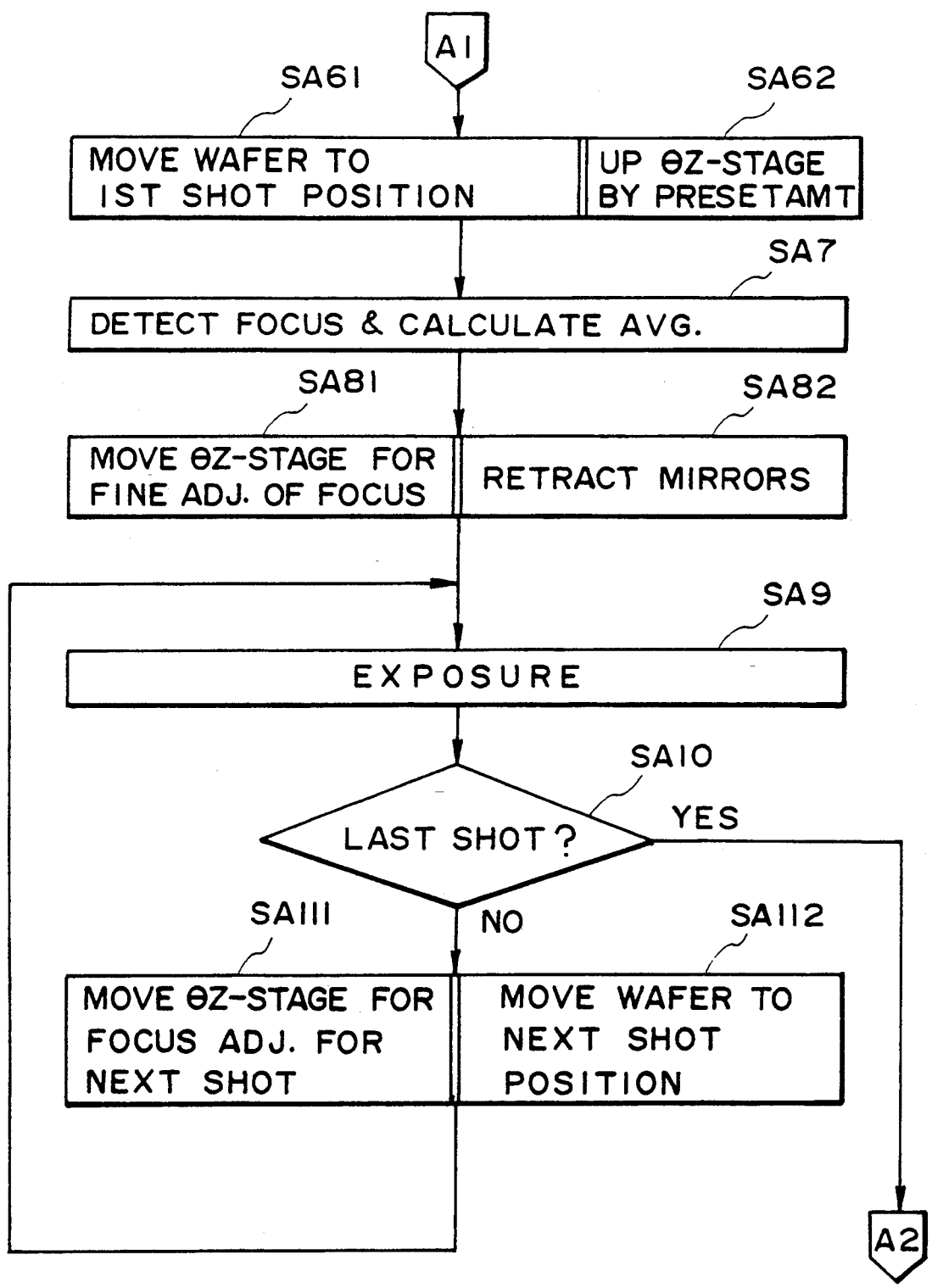
Figure 23C:
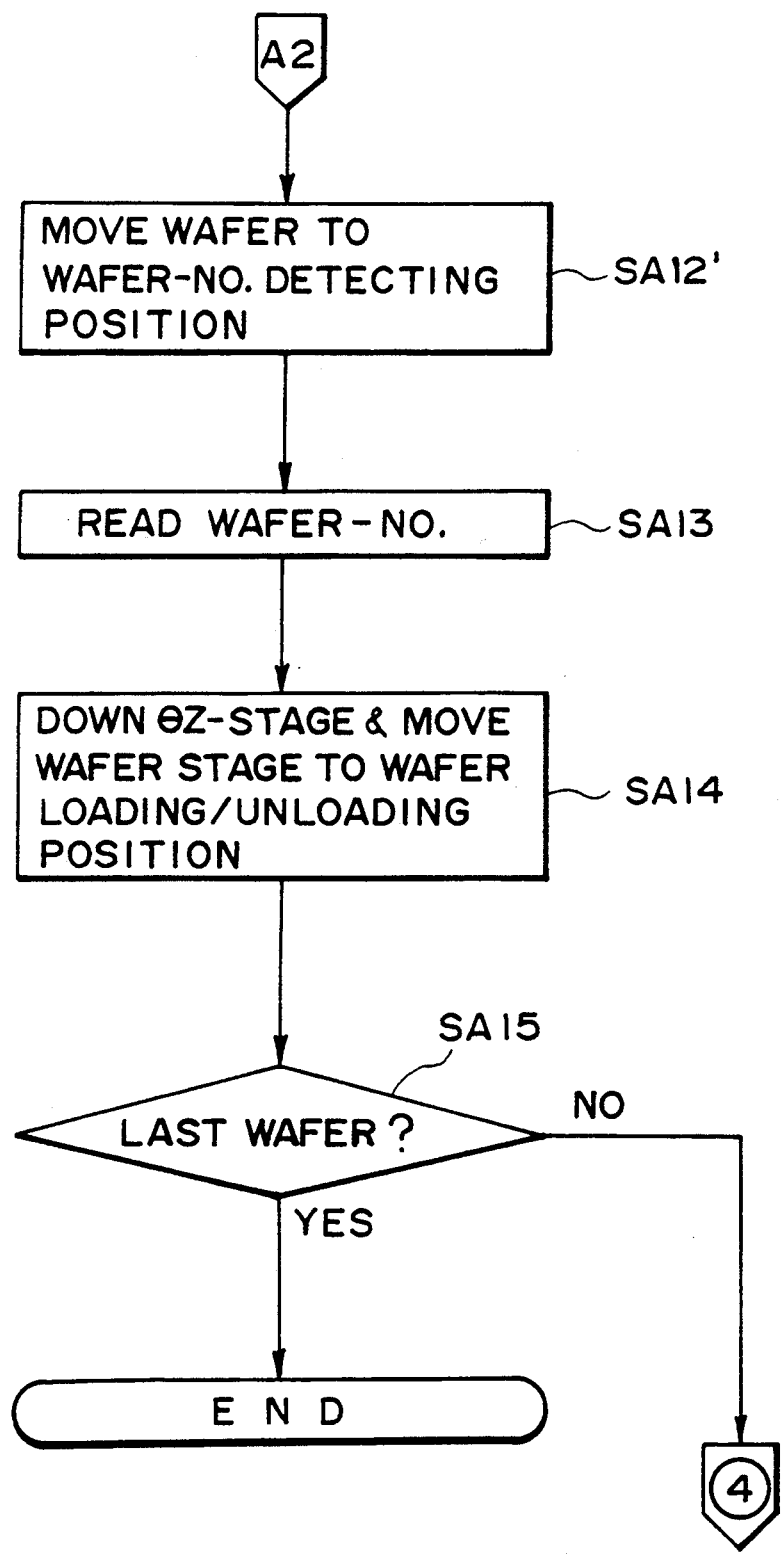
Figure 23D:
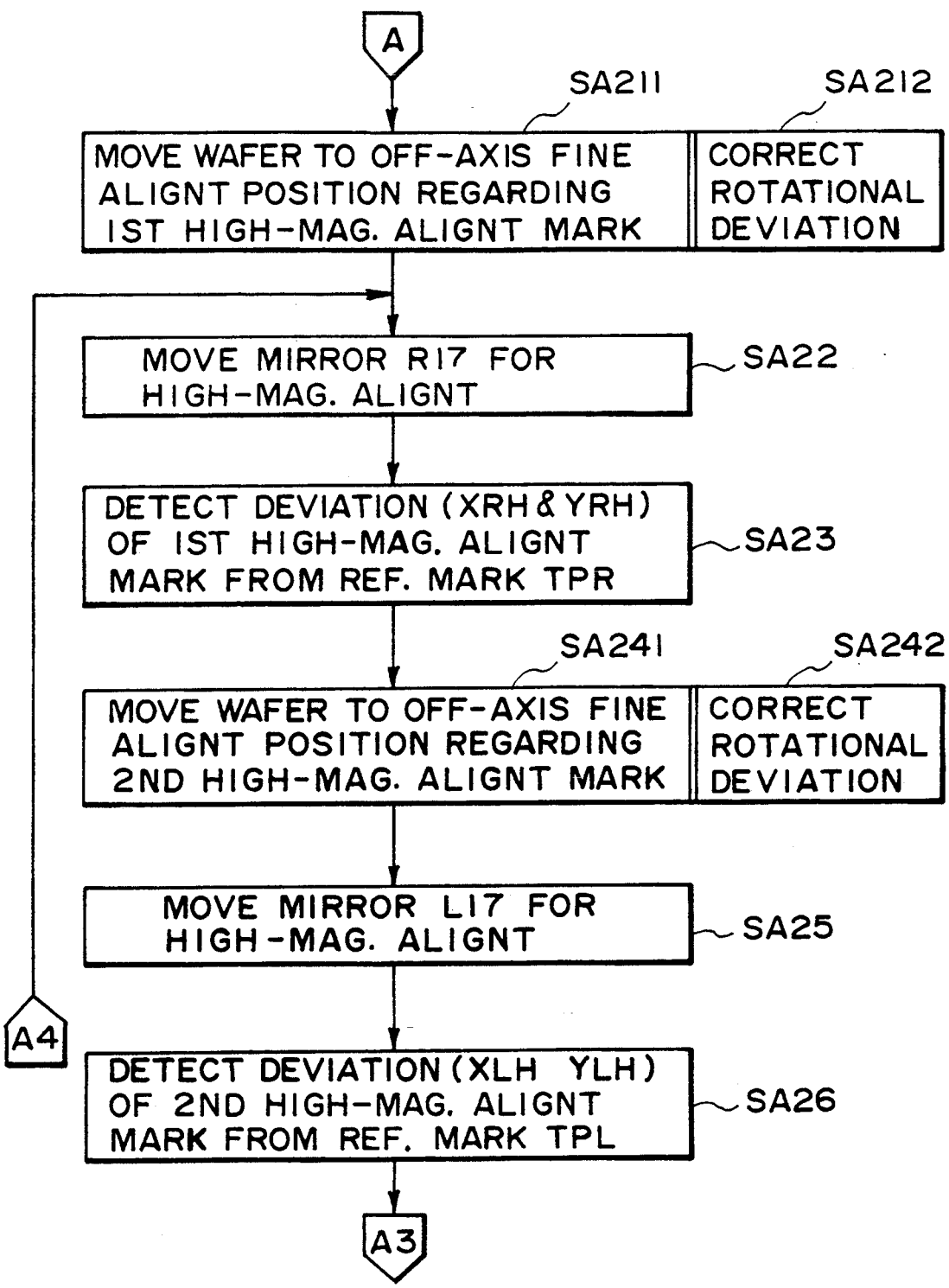
Figure 23E:
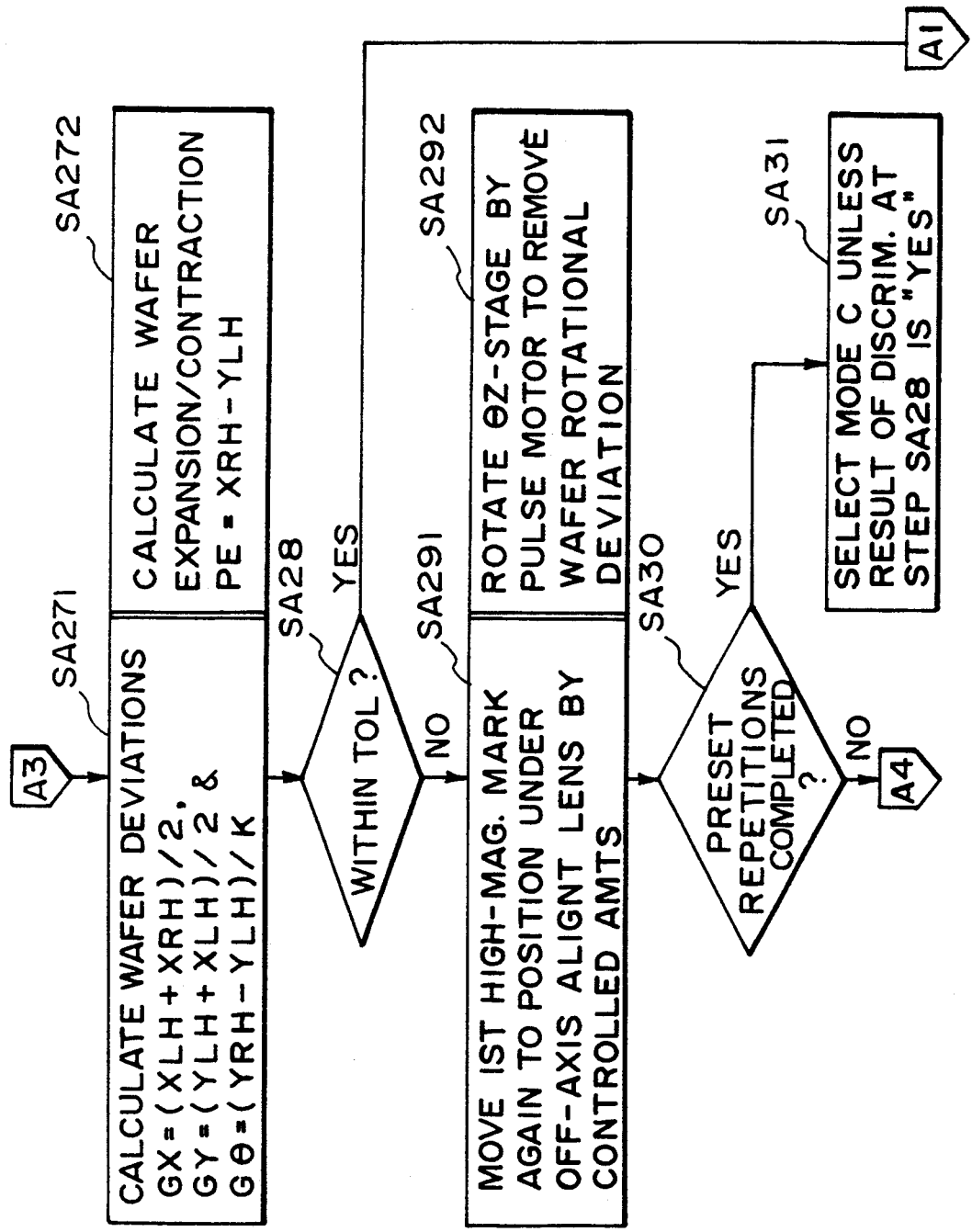

In the foregoing, the description has been made to the off-axis alignment in which the pair of alignment marks CRL12 and CRL11 (CLR12 and CLR11) are detected, simultaneously, by a pair of high-magnification systems of the off-axis alignment optical system OA. The simultaneous detection is, however, not limitative. That is, another example of off-axis alignment using the high-magnification systems is shown in FIGS. 23D and 23E. In this embodiment, a pair of alignment marks for the high-magnification alignment are detected in sequence. The sequential detection is effective for a case where the distance between the pair of alignment marks CRL12 and CRL11 (CLR12 and CLR11) is not coordinated with the span of the objective lenses RL and LL of the off-axis optical system. More particularly, this embodiment is preferably applicable to a case where the diameter of the wafer is very large or very small or to a case where the wafer has been expanded Dr contracted significantly due to heat or the like.

In this example shown in FIGS. 23D and 23E, a pair of alignment marks CRL12 and CLR11 shown in FIG. 13 are located at positions outside the objective lenses RL and LL and, therefore, the simultaneous detection of these alignment marks is not possible. For this reason, the light-hand side alignment mark CRL12 is first detected by the objective lens RL which is close to the mark CRL12 and, then, the alignment mark CLR11 is detected by the objective lens LL which is close to the mark CLR11. Of course, this order may be reversed.

The detecting operation will now be described in more detail. First, at Step SA211, the wafer stage WS is moved by the motors XM and YM in the X and Y directions so as to locate the designated first alignment mark (which is the mark CRL12 in this case) at a position approximately under the objective lens RL. The amount of movement of the wafer stage WS with respect to each of the X and Y directions is determined in accordance with a value obtained by adding a predetermined amount to the amount of deviation, in corresponding one of the X and Y directions, of the wafer prealignment marks WPR1 and WPL1 from the position of the reference line KSL. At the same time, the rotational deviation of the wafer is corrected by rotating the $\theta Z$-stage (Step SA212), like Step SA12 described hereinbefore. Next, at Step SA22, the mirror R17 of the off-axis optical system OA is set to select the high-magnification system. Subsequently, at Step SA23, the positional deviations (XRH and YRH) of the alignment mark CRL12 from the reference mark TPR of the off-axis optical system OA with respect to the X and Y directions are detected. The detection results are stored in the random access memory RAM. Thereafter, at Step SA241, the wafer stage WS is moved by the motors XM and YM in the X and Y directions so as to locate the designated second alignment mark (which is the mark CLR11 in this case) of the wafer WF at a position below the objective lens LL. The amount of movement of the wafer stage WS is determined in a similar manner as of Step SA211. At the same time, the rotational deviation is corrected (Step SA242), like Step SA212. Also, similar operations as of Steps SA22 and SA23 are effected at Steps SA25 and SA26. The results of detection of X and Y deviations XLH and YLH are stored in the random access memory RAM. Then, the sequence proceeds to Step SA271.

At Step SA271, from the detected X and Y deviations of the first and second designated alignment marks, global deviations GX, GY and $G\theta$ of the wafer, i.e. the positional deviations of the wafer as a whole with respect to the X, Y and $\theta$ directions, are calculated on the basis of the following equations:

$$GX=(XLH+XRH)/2$$

$$GY=(YLH+XLH)/2$$

$$G\theta=(YRH-YLH)/K$$

At the same time, the amount of expansion/contraction of the wafer as a whole is calculated from the deviations XLH and XRH (Step SA272), in accordance with the following equation:

$$PE=XRH-XLH$$

Subsequently, at Step SA28, whether or not each of the deviations GX, GY and $G\theta$ is within the tolerance is discriminated. If within the tolerance, the sequence returns to Steps SA61 and SA62 so that the operations described with reference to FIGS. 23B and 23C are effected. If not within the tolerance, then the sequence proceeds to Steps SA291 and SA292. At Step SA291, the wafer stage WS is moved in the X and Y directions by the servo motors XM and YM through controlled amounts so as to locate again the designated first alignment mark CRL12 of the wafer WF at a position under the objective lens RL. At this time, the movement of the wafer stage WS is controlled in accordance with: the sum of the deviation GX, a predetermined value, a value corresponding to the share of one of the marks CLR11 and CRL12 of the wafer expansion/contraction PE when it is shared between the marks CLR11 and CRL12, and an amount of displacement to be made by the servo motor XM (as calculated by Step SA292); and the sum of the deviation GY, a predetermined amount and an amount of displacement to be made by the servo motor YM (as calculated by Step SA292).

At Step SA292, on the other hand, the amount of global deviation $G\theta$ in the 0 direction is divided by the resolution of the pulse motor $\theta M$, and the portion of the deviation $G\theta$ corresponding to the quotient is corrected by driving the pulse motor $\theta M$, whereas the remaining portion of the deviation $G\theta$ corresponding to the remainder is corrected by driving the servo motors XM and YM. That is, the deviation $G\theta$ of the wafer is corrected by the combination of the pulse motor $\theta M$ and the servo motors XM and YM. Details of this control will be described with reference to Steps SB81 and SB82. The above-described operations are repeatedly effected and, at Step SA30, whether or not a preset number of repetitions of such operations are completed is discriminated. If not completed, then the sequence returns to Step SA22 so that the above-described alignment operation is repeated. In a case where the tolerance is not yet satisfied (Step SA28) despite that the preset repetitions of the operations are completed (Step-SA30), the alignment mode is changed automatically or manually to the mode C which will be described later. When the result of discrimination at Step SA28 shows that the tolerance is satisfied, the sequence returns to Steps SA61 and SA62, as described before.

Figure 23F:
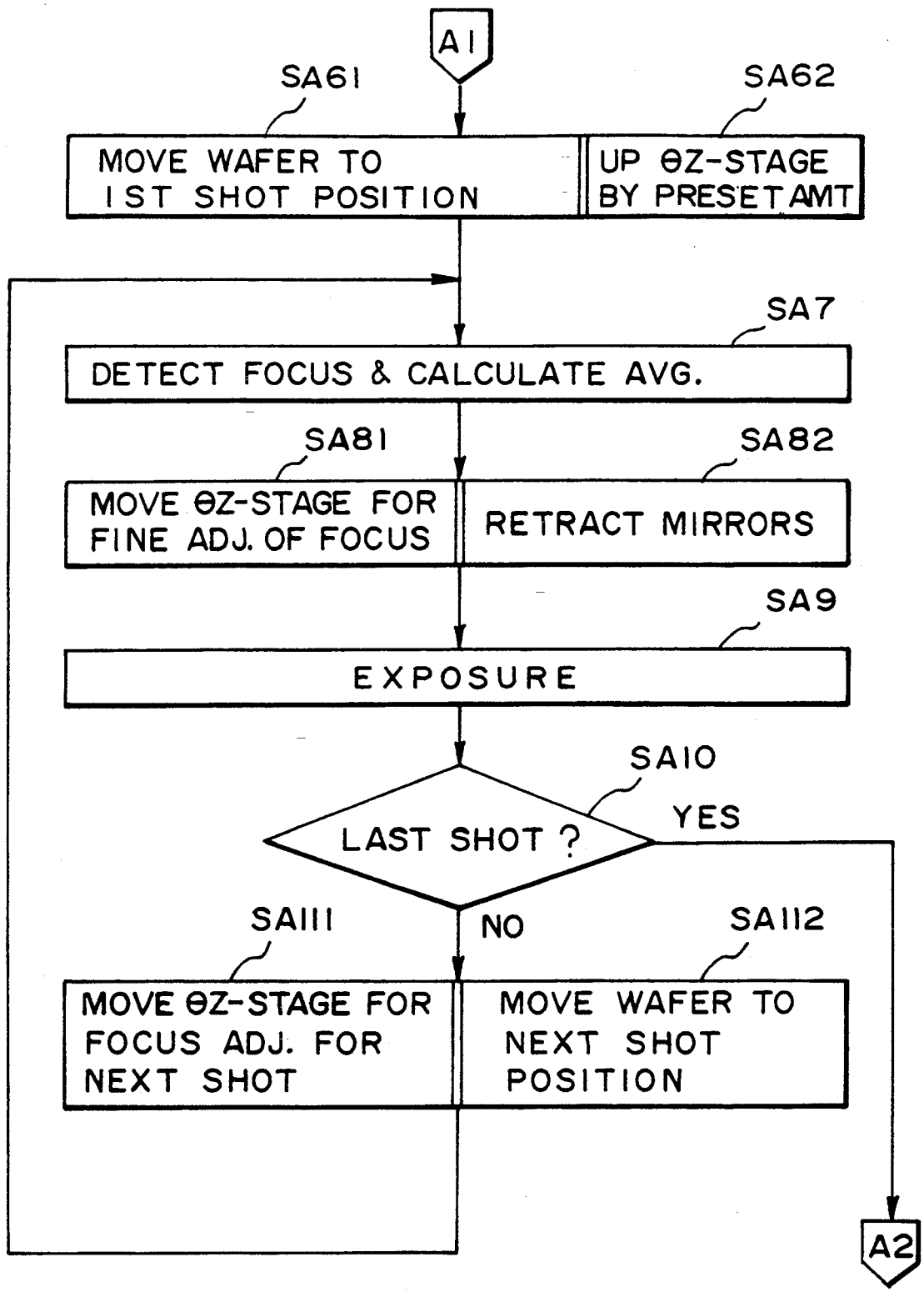

FIG. 23F is a flow chart showing a modification of the portion of the alignment mode A which is shown in FIG. 23B. One of the distinctive features of this example lies in the content of Step SA111. That is, at Step SA111 of this embodiment, one of the air-sensors which corresponds to or is at a position closest to the next shot area is operated again to detect the focus information related to the next shot area and, thereafter, the $\theta Z$-stage is moved upwardly or downwardly until the desired focus value is achieved. Another distinctive feature of this embodiment lies in that, after completion of the steps SA111 and SA112, the sequence returns to Step SA7 which means that, before initiation of the exposure of the next shot area that has been moved to the exposure position, the focus adjustment with respect to that shot area is again carried out by using all the air-sensors. With such arrangement, more accurate focus adjustment is assured which leads to further improvements in the pattern overlay accuracies.

Alignment Mode B

The alignment mode B will now be described with reference to FIGS. 24A–24C. First, at Step SB11, one shot area such as, for example, the shot area 13 shown in FIG. 13 is specified or designated, and the wafer stage WS is moved by the servo motors XM and YM so that the designated first shot area, i.e. the shot area 13 in this case, is located at a position under the projection lens PO. The amount of movement of the wafer stage WS with respect to each of the X and Y directions is determined in accordance with a value obtained by adding a predetermined amount to the amount of deviation, in a corresponding one of the X and Y directions, of the wafer prealignment marks WPR1 and WPL1 from the position of the reference line KSL. At the same time, the rotational deviation is corrected by the motor $\theta M$ (Step SB12) in a similar manner as has already been described. Also, at the same time, the $\theta Z$-stage is moved upwardly by the motor ZM by a preset amount (Step SB13), like Step SA62. Subsequently, at Step SB2, the laser shutter BS is opened and the positional deviation is detected with the use of the TTL alignment optical system AS (Step SB3). More specifically, the deviations (XL1, YL1, XR1 and YR1) in the X and Y directions of the shot area, being treated, with respect to two points on the right-hand side and the left-hand side of this shot area are detected. The reference XR1 (XL1) denotes the deviation in the X direction on the right-hand side (the left-hand side) point, while the reference YR1 (YL1) denotes the deviation in the Y direction on the right-hand side (the left-hand side) point. An average of these deviations with respect to each of the X and Y directions is calculated in accordance with the following equations:

$$S1X = (XL1 + XR1)/2$$

$$S1Y = (YL1 + YR1)/2$$

These averages are stored in the random access memory RAM (Step SB3).

Subsequently, the wafer stage WS is moved by the motors XM and YM in the X and/or Y direction by a predetermined amount or amounts, so as to locate a designated second shot area (such as, for example, the shot area 19 shown in FIG. 13) at a position under the projection lens system PO (Step SB4). Then, the X and Y deviations XL2, YL2, XR2 and YR2 at two points are detected and the averages thereof, i.e. S2X and S2Y, are calculated (Step SB5), like Step SB3. Also, the results of calculation are stored in the random access memory RAM. Next, from the averages S1X, S2X, S1Y and S2Y, the global deviations, GX, GY and $G\theta$ of the wafer with respect to the X, Y and $\theta$ directions are calculated (Step SB61) in accordance with the following equations:

$$GX = (S1X + S2X)/2$$

$$GY = (S1Y + S2Y)/2$$

$$\tan G\theta \div [(YL2 + YR2)/ - (YL1 + YR1)/2]/K$$

where K is a constant indicating the distance between the alignment marks of the designated first and second shot areas.

At the same time, from the deviations XL1 XR1, XL2 and XR2 and thus from the average deviations S1X and S2X, the amount of expansion/contraction PE of the wafer as a whole is calculated (Step SB62) in accordance with the following equation:

$$PE = S1X - S2X$$

Next, at Step SB7, whether or not each of the detected wafer deviations and expansion/contraction is within a tolerance is discriminated. If not within the tolerance, the sequence proceeds to Steps SB81 and SB82. At Step SB81, the wafer stage WS is moved by the servo motors XM and YM by controlled amounts so as to locate again the first designated shot area at a position under the projection lens PO. The movement of the wafer stage WS in the X and Y directions is determined in accordance with a combination of: values obtained by adding a predetermined amount ($\div K$) to each of the already detected X and Y deviations; a value obtained by adding to the X deviation a value corresponding to the share of one shot area of the wafer expansion/contraction PE when it is shared uniformly among all the shot areas; and the amounts of displacements, in X and Y directions, if any, to be made by the servo motors which are calculated by Step SB82 as will be described below.

At Step SB82, the correction of the global deviation $G\theta$ of the wafer in the rotational direction is shared between the pulse motor $\theta M$ and the servo motors XM and YM. That is, the global deviation $G\theta$ is divided by the resolution of the pulse motor $\theta M$. The portion of the deviation $G\theta$ corresponding to the quotient is one to be corrected by the pulse motor while the portion of the deviation $G\theta$ corresponding to the remainder is one to be corrected by the servo motors XM and YM. By controlling the drives of the servo. motors XM and YM in the X and Y directions, the $\theta$ deviation can be corrected. More particularly, the X axis and the Y axis of the wafer stage WS intersect, in principle, exactly orthogonally. Therefore, no $\theta$ component will exist. However, in the actual manufacture of machines, it is very difficult to achieve a perfectly orthogonal arrangement, so there would occur the $\theta$ component. In view of this, the $\theta$ component is measured upon completion of assembly, and the amount of drive of each of the X motor and the Y motor is controlled during the operation of the apparatus, to thereby move the wafer stage in a direction correcting or obviating the $\theta$ component. This is called as "correction of orthogonality". The Steps SB81 and SB82 use this principle. Thus, a minute angle of $\theta$ deviation which can not be corrected by the pulse motor $\theta$M is corrected by controlling the drives of the servo motors SM and YM. This is very advantageous.

Subsequently, at Step SB9, whether or not the above-described deviation-detecting operation and the deviation-correcting operation are repeated by a preset number of times is discriminated. If not completed, the sequence returns to Step SB3 and the above-described operations are repeated. When, by the repetition, the position of the wafer comes into the tolerance and when this is detected by the Step SB7, the sequence proceeds to Step SB12.

If it is discriminated at Step SB9 that the preset repetitions are completed, then the laser shutter BS is closed (Step SB10), whereby the TTL detection is completed. Step SB11 is a step for detecting that any "YES" signed has not been produced at the Step SB7 within a period of the preset repetitions of operations. If this is detected, the alignment mode B is changed to another, for example, the alignment mode C.

Figure 24A:
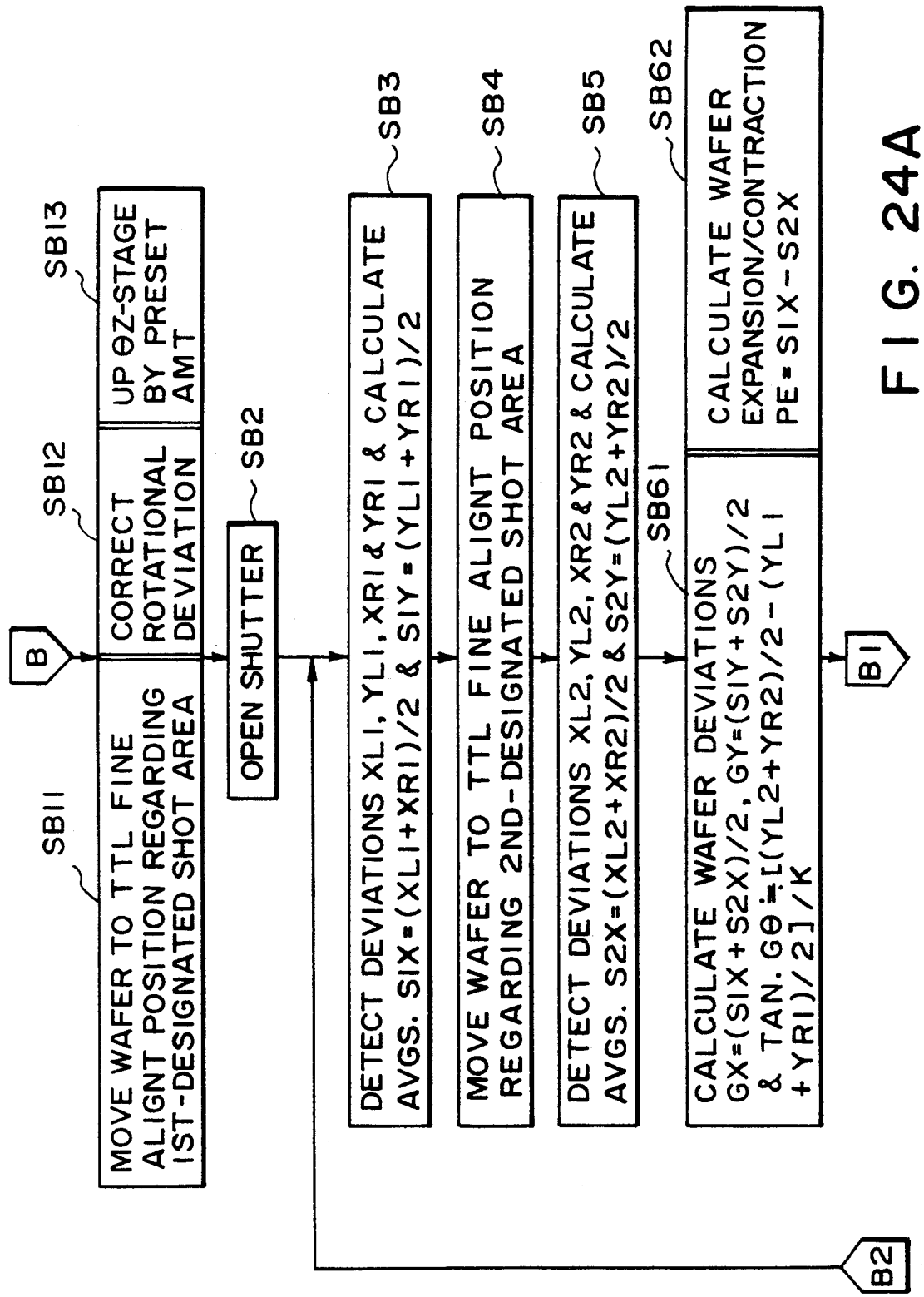
Figure 24B:
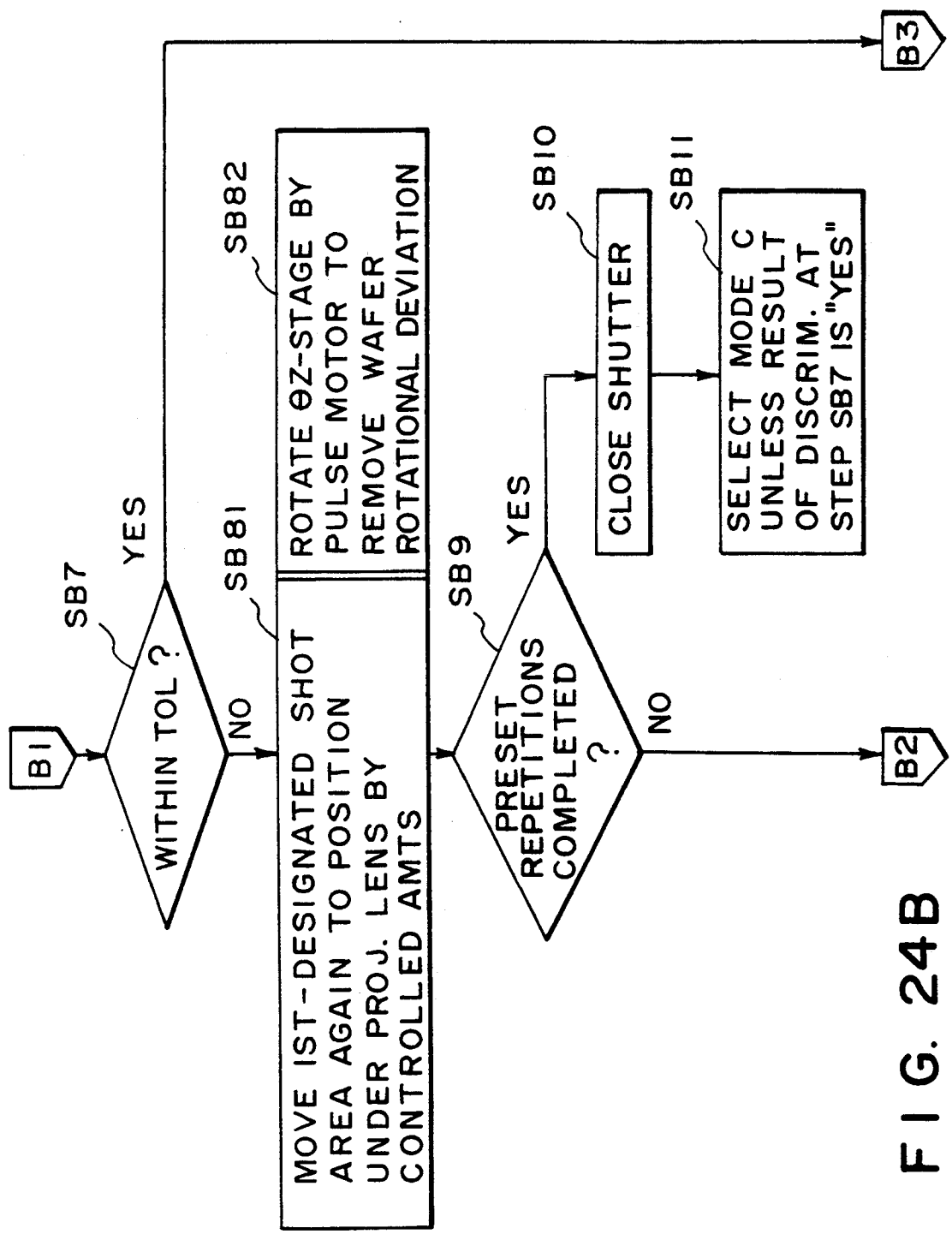
Figure 24C:
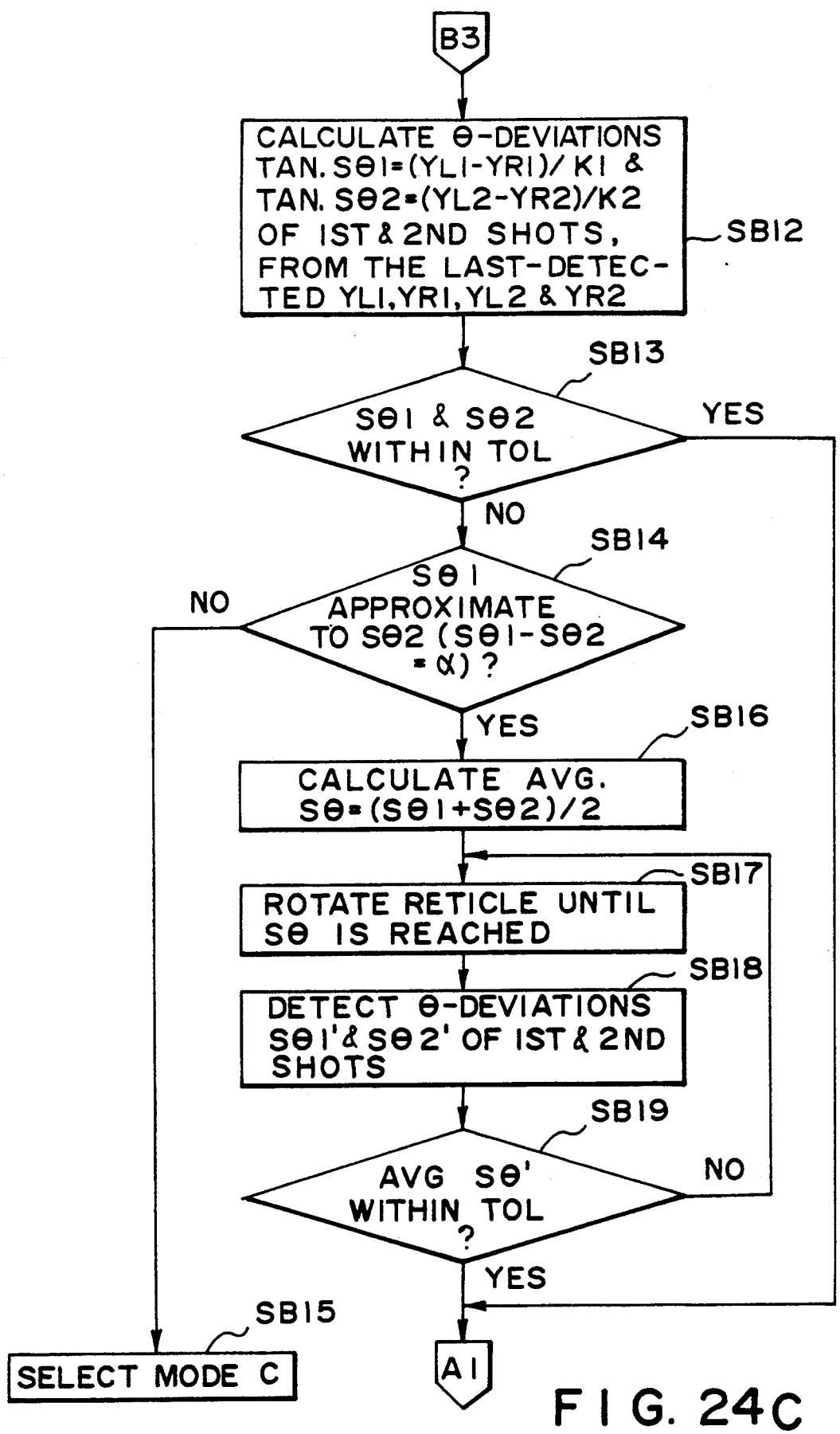

The alignment operation which has been described with reference to FIGS. 24A and 24B is one of "global alignment" techniques. The "global alignment" is an alignment method in which the positions of plural marks formed on the wafer are detected and, on the basis of the result of which, the positioning of the wafer in respect to plural shot areas thereof is effected. Then, the wafer is moved stepwise, while relying on the stage feeding accuracies, to effect exposures of the plural shot areas in sequence. The detection of the positions of the plural marks on the wafer can be achieved either through an off-axis alignment optical system or through a TTL alignment optical system.

Referring back to FIGS. 24A-24C, the global alignment of the wafer is completed just before the sequence proceeds to Step SB12. However, even if the global alignment is completed, it is possible that each of the shot areas contains positional deviation in a rotational direction (i.e. inclination). Such rotational deviation also causes an overlay error. Step SB12 is a step for detecting such rotational deviation of the shot area. More particularly, at Step SB12, from the last-detected deviations YL1, YR1, YL2 and YR2 obtained, during the repetitive operations described before, with reference to the first and second designated shot areas, the deviations $S\theta1$ and $S\theta2$ in the $\theta$ direction of these shot areas, respectively, are calculated in accordance with the following equations:

$$\tan S\theta1 = (YL1 - Yr1)/K1$$

$$\tan S\theta2 = (YL2 - YR2)/K2$$

Whether or not the thus obtained deviations $S\theta1$ and $S\theta2$ is within a tolerance is discriminated at Step SB13. If not within the tolerance, then, whether or not $S\theta1$ approximates to $S\theta2$, i.e. whether or not they are in the same direction or have the same inclination is discriminated at Step SB14. If the deviations $S\theta1$ and $S\theta2$ have different inclinations, it is difficult to assure high-overlay accuracies with the present alignment mode. So, the sequence proceeds to Step SB15, whereby the alignment mode is changed to the mode C. If, on the other hand, the deviations $S\theta1$ and $S\theta2$ have the same or similar inclination, it is possible to assure satisfactory overlay accuracies. So, the sequence proceeds to Step SB16, at which an average $S\theta = (S\theta1 + S\theta2)/2$ is calculated. Then, at Step SB17, the reticle stage RS is driven by the pulse motor P$\theta$ to rotationally move the reticle RT until the average $S\theta$ is reached. Subsequently, at Step SB18, any rotational deviations ($S\theta1'$ and $S\theta2'$) of the two designated shot areas are detected again. Also, an average $S\theta'$ of these deviations $S\theta1'$ and $S\theta2'$ is calculated by the following equation:

$$S\theta' = (S\theta1' + S\theta2')/2$$

Whether or not the average $S\theta'$ is within a tolerance is discriminated at Step SB19. If not within the tolerance, then the sequence returns to Step SB17, whereby the correction and detection are repeated. If the average $S\theta$ is within the tolerance, the sequence proceeds to Steps SA61 and SA62 described with reference to FIG. 23B, whereby the exposure and the stepwise movement are carried out in a similar manner as in the alignment mode A. By this, the treatment of the wafer in the alignment mode B is completed.

Alignment Mode C

Figure 25A:
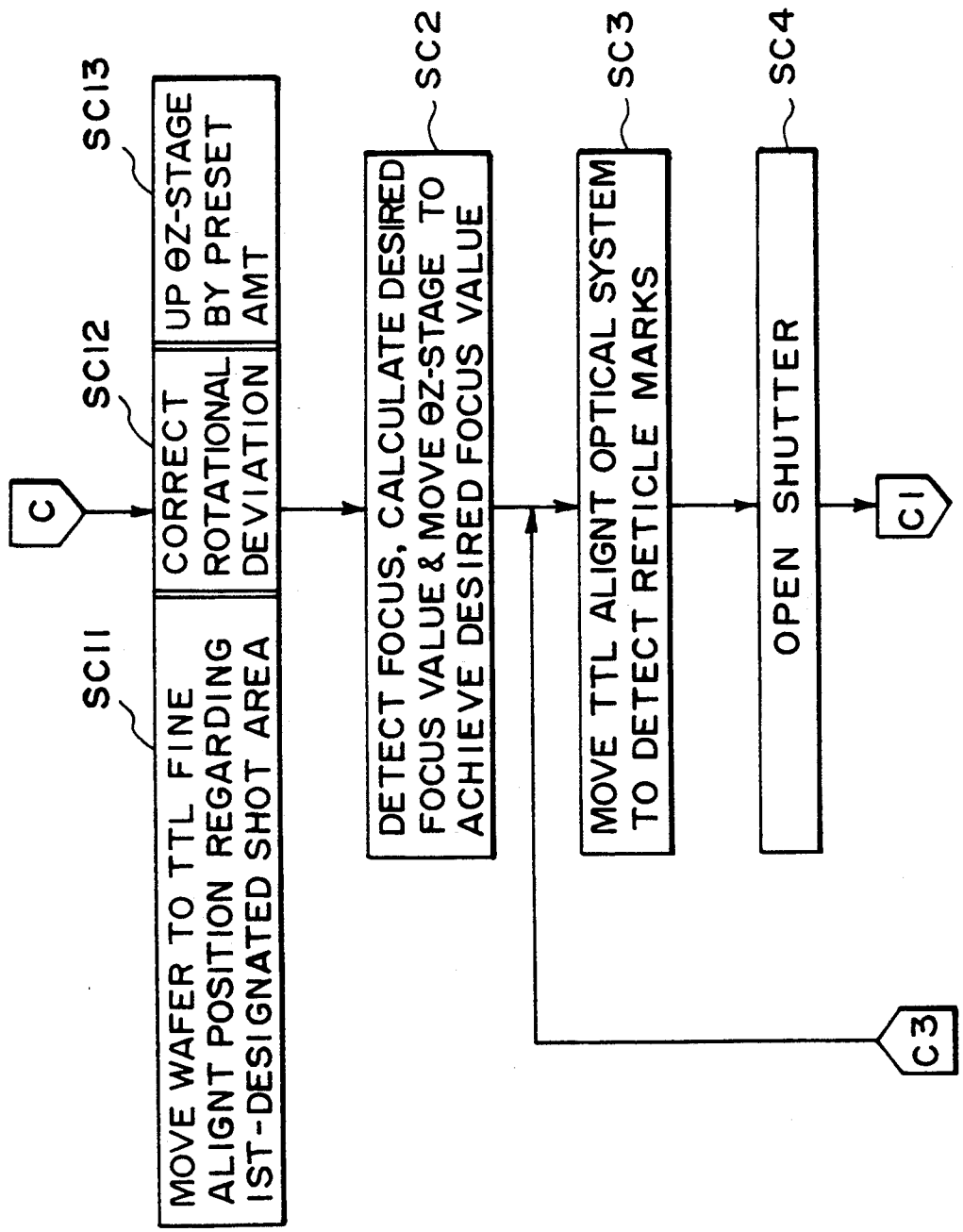
Figure 25B:
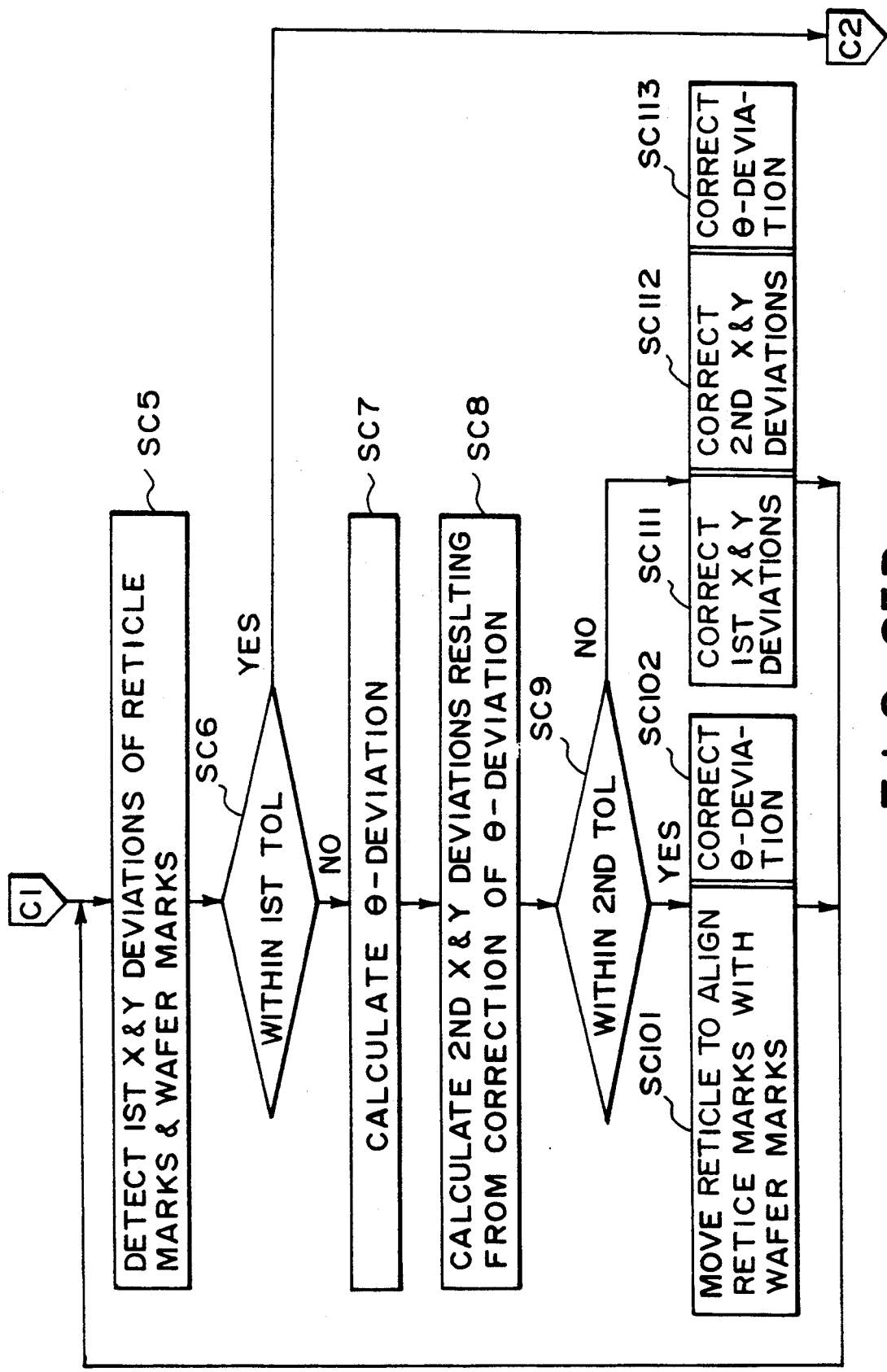
Figure 25C:
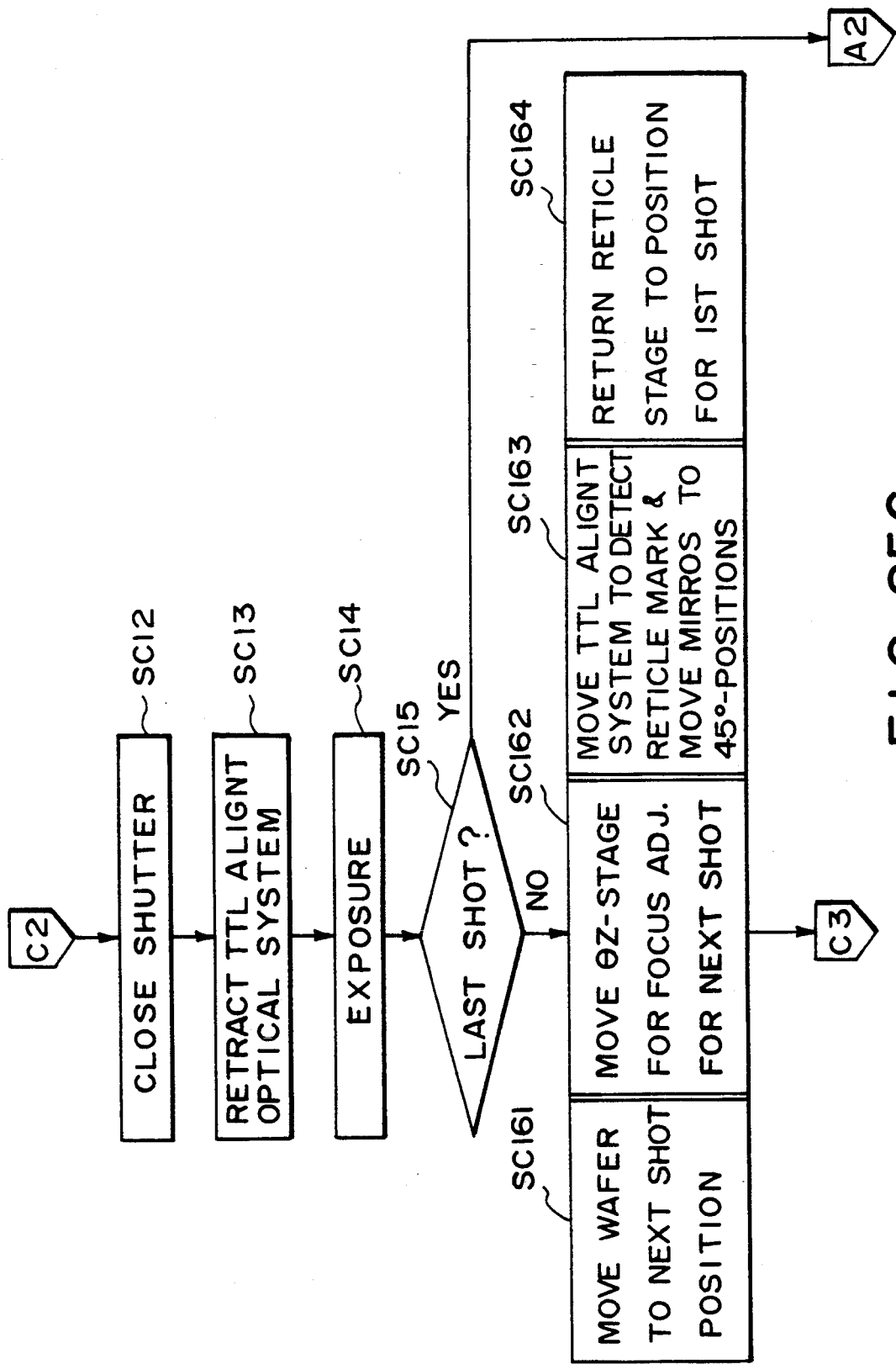

Referring now to FIGS. 25A-25C, the alignment mode C will be described.

The present alignment mode is a mode of TTL "die-by-die" alignment. The "die-by-die" alignment is an alignment method in which a reticle and a wafer is aligned with each other (particularly with the use of a TTL alignment optical system) for each time one shot area is to be exposed. First, at Step SC11, the wafer stage WS is moved by the servo motors XM and YM in the X and Y directions so as to locate the first shot area 1 of the wafer WS at a position under the projection lens system PO. At this time, the amount of movement of the wafer stage in each of the X and Y directions is determined by adding a predetermined value to the deviation, in a corresponding one of the X and Y directions, of the wafer prealignment marks WPR1 and WPL1 from the position of the reference line KSL. At the same time, the $\theta$Z-stage is rotationally moved by the pulse motor $\theta$M (Step SC12) by an amount calculated from the X and Y deviations. Also, the $\theta$Z-stage is moved upwardly by the pulse motor Zm and by a preset amount (Step SC13). Subsequently, at Step SC2, the focus, i.e. the surface position, of the first shot area is detected by the air-sensors AG1-AG4 and an average of the outputs of the air-sensors is calculated. The $\theta$Z-stage is moved upwardly or downwardly by the pulse motor ZM and/or the piezoelectric device PZ until the surface position of the first shot area reaches the target position (target focus). Then, the objective lenses 11R and 11L and the objective mirrors 12R and 12L are moved to positions opposed to the reticle marks WSR1 and WSL1 of the reticle RT2, respectively (Step SC3), in preparation for the TTL alignment. Then, the laser shutter BS is opened (Step SC4), so that the laser beams provided by the laser source 1S are reflected by the objective mirrors 12R and 12L, respectively, to the reticle marks WSR1 and WSL1. At Step SC5, the scan with the laser beams is initiated to detect, in a well-known manner, first X and Y deviations of the alignment marks WKR11 and WKL11 of the wafer WF from the marks WSR1 and WSL1 of the reticle RT2. At Step SC6, whether or not each of the first X and Y deviations is within an acceptable tolerance, e.g. a range of 0.1 micron, is discriminated.

If the X and Y deviations of the right-hand and left-hand alignment marks of a particular shot area of the wafer, with respect to the reticle, are denoted by XR, YR, XL and YL, then average X and Y deviations SX and SY are given by the following equations:

$$SX=(XR+XL)/2$$

$$SY=(YR+YL)/2$$

Also, as described hereinbefore, the rotational deviation $\tan S\theta$ is given by:

$$\tan S\theta = (YL-YR)/L$$

where L is a constant corresponding to the distance between the right-hand and left-hand alignment marks of the particular shot area.

If the result of discrimination at Step SC6 shows that each of the average deviations SX and SY of the first shot area is within the tolerance, the laser shutter BS is closed (Step SC12) because the alignment is satisfactory. So, the sequence proceeds to the succeeding steps. If, on the other hand, at least one of the average deviations SX and SY is out of the tolerance, the sequence proceeds to Step SC7 to effect fine alignment. As for the tolerance, any other value such as 0.3 micron, 0.5 micron, etc. may be set from the console of the apparatus. At Step SC7, the $\theta$-deviation $S\theta$ is calculated from the above-described deviations YL and YR. If, at this time, the $\theta$Z-stage is rotationally moved in accordance with the calculated $\theta$-deviation $S\theta$ in a direction eliminating the $\theta$-deviation, there will occur additional deviations in the X and Y directions. This is because the center of each shot are deviates from the center of the wafer. These additional or second X and Y deviations can be preparatively detected by calculation. So, at Step SC8, these second X-and Y deviations are calculated. Then, at Step SC9, whether or not each of the thus calculated second X and Y deviations is within a second tolerance, e.g. a range of 3 microns, is discriminated. If within the tolerance, the sequence proceeds to Steps SC101 and SC102. If not within the tolerance, the sequence proceeds to Steps SC111–113. At Steps 101 and 102, the reticle stage RS is moved in the X and Y directions by the pulse motors PX and PY in accordance with the values corresponding to the sum of the first and second X deviations and the sum of the first and second Y deviations, respectively, so as to locate the alignment marks WSR1 and WSL1 of the reticle RT2 at positions each between the mark elements of corresponding one of the alignment marks WKR11 and WKL11 of the first shot area of the wafer WF. At the same time, the pulse motor $\theta$M is driven to rotate the $\theta$Z-stage by an amount corresponding to $\Delta\theta$.

At Step SC111, on the other hand, the reticle stage RS is moved in the X and Y directions by the pulse motors PX and PY in accordance with the first X and Y deviations, so as to locate the alignment marks WSR1 and WSL1 of the reticle RT2 at positions between the mark elements of the alignment marks WKR11 and WKL11 of the first shot area of the wafer WF. At the same time, the wafer stage WS is moved in the X and Y directions by the servo motors XM and YM in accordance with the second X and Y deviations, similarly so as to locate the marks WSR1 and WSL1 at positions each between the mark elements of corresponding one of the wafer alignment marks WKR11 and WKL11 (Step SC112). Also, at the same time, the pulse motor $\theta$M is driven to rotationally move the $\theta$Z-stage by an amount corresponding to $\theta$ (Step 113), like Step SC102.

In this manner, depending on whether or not the tolerance is satisfied, the reticle and the wafer are selectively displaced to achieve the reticle-and-wafer alignment. This assures high-speed alignment as well as high-accuracy alignment. That is, the displacement with a pulse motor requires a relatively long time for the movement, although higher accuracies are attainable. On the other hand, high speed displacement is attainable with a servo motor, but the accuracy is less satisfactory. Also, the range of displacement of the reticle is inherently narrower than that of the wafer. In view of the foregoing, if the deviation is within the tolerance, the reticle stage is precisely driven by the pulse motor because the displacement necessary for the correction is small. If out of the tolerance, on the other hand, the wafer stage is driven at a higher speed by the servo motor, because the displacement necessary for the correction of the deviation is large. At this time, the reticle stage is also displaced to correct the deviation. Therefore, satisfactory accuracies are attainable.

The above-described operations are repeated until the first tolerance is satisfied (Step SC6). When the high speed and high-accuracy alignment is completed, the sequence proceeds to Step SC13 at which the objective lenses 11R and 11L and the objective mirrors 12R and 12L are moved back to predetermined positions, respectively, so as not to interfere with the exposure light. Also, each of the objective mirrors 12R and 12L is pivotably displaced to eliminate its inclination, so that it extends vertically. Subsequently, the shutter ST is opened for a predetermined period of time to effect exposure (Step SC14). After completion of exposure, whether or not the current shot area is the last shot area is discriminated at Step SC15. If not the last shot area, the sequence proceeds to Steps SC161–SC164. At Step SC161, the wafer stage WS is moved to the next-shot exposure position by the motors XM and YM in the X and/orc Y directions by a predetermined amount or amounts, so as to locate the next shot area at a position under the projection lens PO. At the same time, on the basis of an output from one of the air-sensors which is related to or is at a position closest to the "next" shot area (which is now going to be exposed), the $\theta$Z-stage is moved upwardly or downwardly by the motor ZM and/or the piezoelectric device PZ (Step SC162). Also, the objective lenses 11R and 11L and the objective mirrors 12R and 12L is moved to the positions opposed to the alignment marks WSR1 and WSL1 of the reticle RT2, while the objective mirrors 12R and 1L are inclined into the 45-degree positions, respectively (Step SC163). Further, the reticle stage is moved back to its initial position, in the X and Y directions, which position is the position that the reticle stage has assumed at the time of exposure of the first shot area (Step SC164).

When these operations are completed, the sequence returns to Step SC3 and the alignment and exposure operation as described above is repeated relative to each of the remaining shot areas in the "die-by-die" alignment mode until the last shot area is exposed. When the exposure of the last shot area is completed, it is discriminated at Step SC15. So, the sequence returns to Step SA12 (FIG. 23C), and similar operations are repeated until the exposure of the wafers of one lot is completed.

The apparatus of the present embodiment is operable manually. That is, the above-described particular manual alignment mode or any of other manual alignment modes can be accessed at any stage of the automatic alignment operation, by interruption. This is very effective in a case where the automatic alignment is difficult to achieve due to the material of the wafer, the property of the resist material, etc. When the TTL optical system as shown in FIG. 5 is used to achieve the alignment, the light sources 19R and 19L are energized. Alternatively, a diffusing plate DF is inserted into the optical path of the laser source 1S. When the off-axis optical system 0A is used, the light sources R11 and L11 are energized, and the selection of one of the dark-field detection and the bright-field detection is made by selecting the aperture stops R13A and L13A; R13B and L13B.

The selection of the alignment marks are effected in a manner illustrated in FIGS. 15A-15C.

Figure 26A:
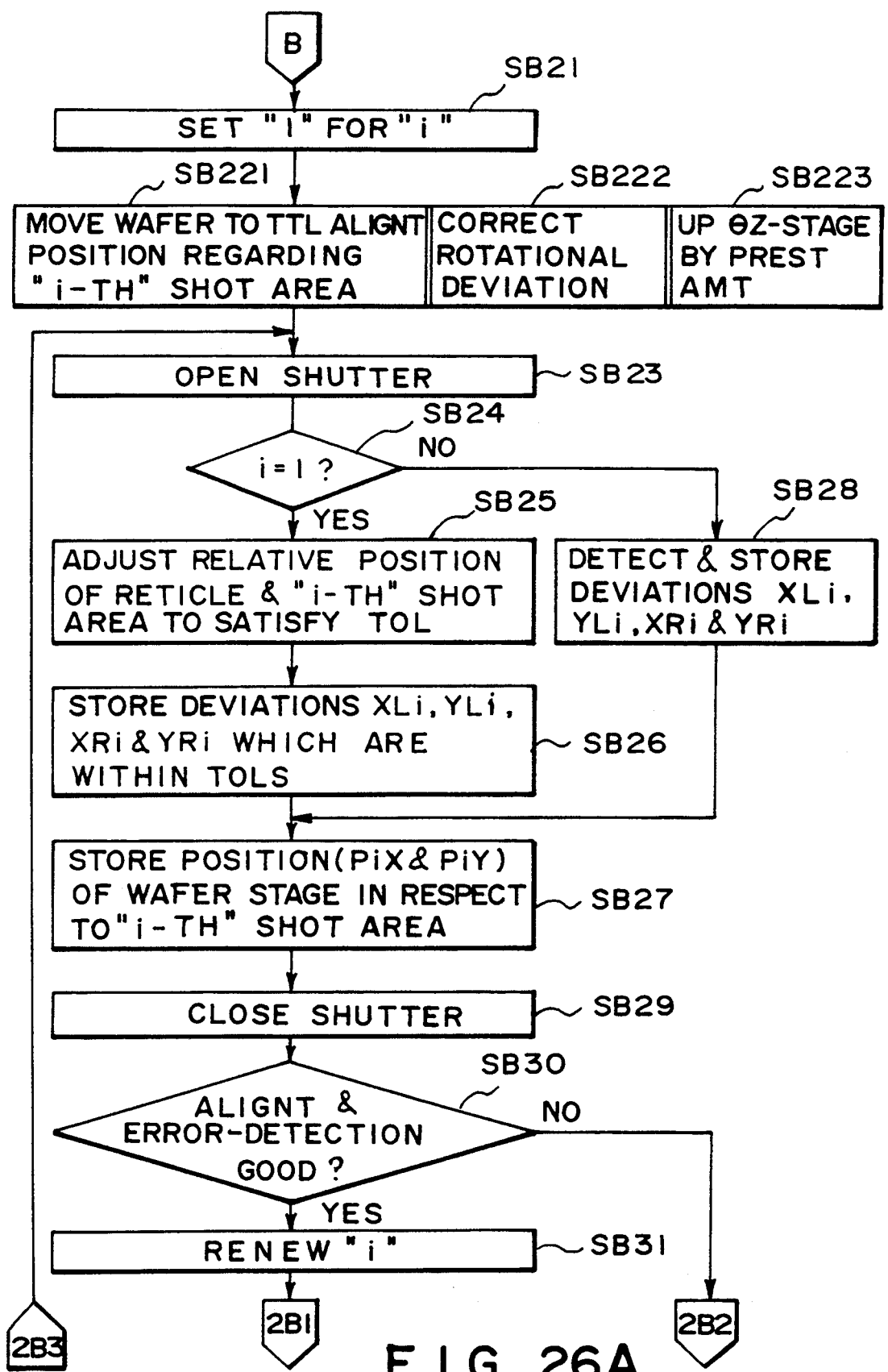
Figure 26B:
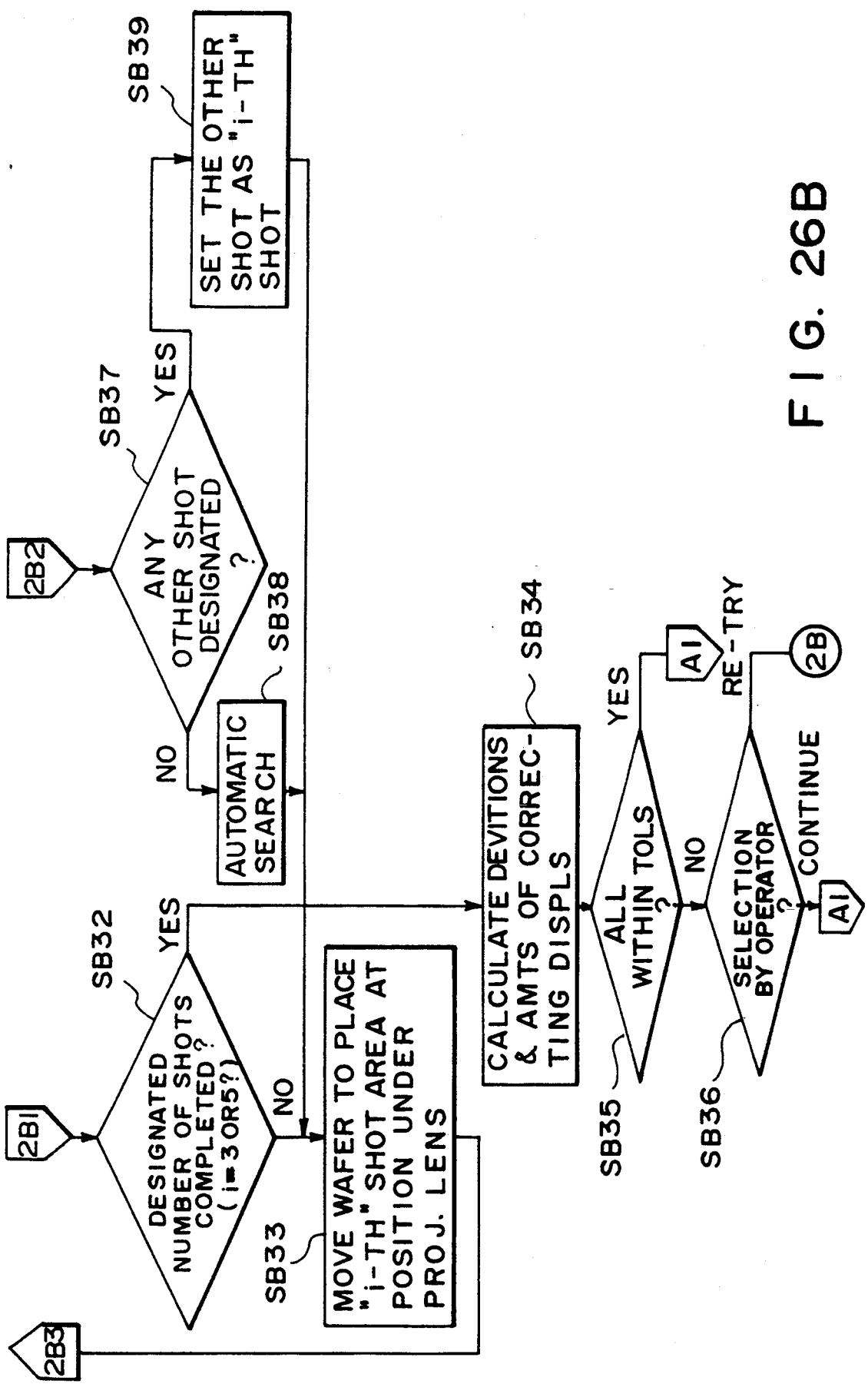

FIGS. 26A and 26B are flow charts showing a modification of the alignment mode B described with reference to FIGS. 24A-24C. FIGS. 27A, 27C and 28 are explanatory views, respectively. One of the distinctive features of this embodiment is reduction in the process time as compared with the alignment mode B described in the foregoing.

Figure 27B:
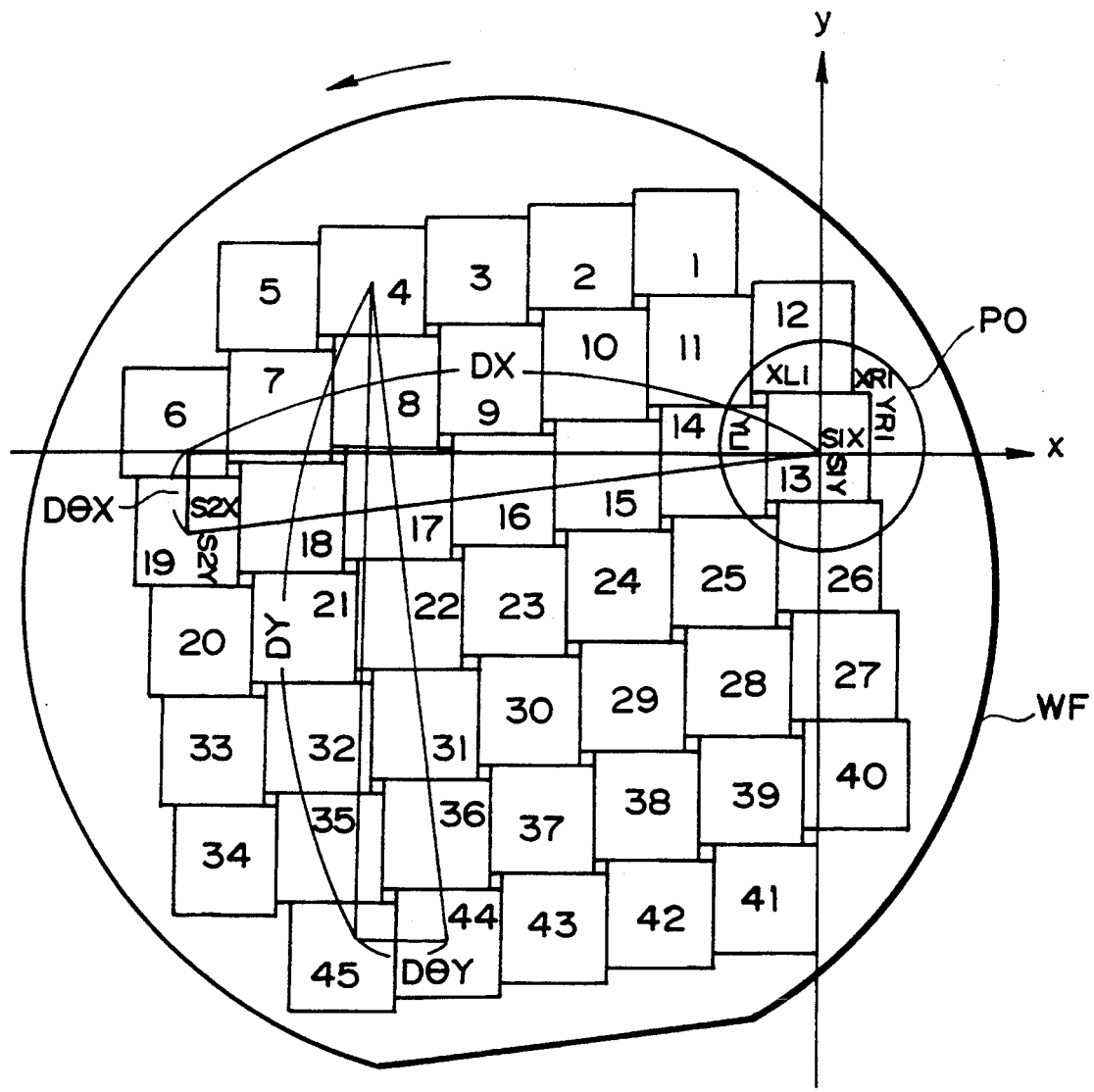

In the alignment mode B described before, the X and Y deviations of each of the right-hand side and the left-hand side alignment marks of each of a pair of designated shot areas on the wafer WF are detected and, thereafter, the correcting movement is effected on the basis of the results of detection. In the present embodiment, as compared therewith, a first particular shot area is selected and, just after the X and Y deviations of right-hand side and left-hand side alignment marks of that shot area and the θ deviation are detected and calculated, the correcting movement relative to the first designated shot area is effected on the basis of the results of detection and calculation. Description will be made in more detail in conjunction with the drawings. If, for example, a circuit pattern should be superposingly printed on each of plural shot areas which have already been defined on the wafer WF surface in a manner such as shown in FIG. 27A, it is, of course, possible to effect the alignment and exposure operations in accordance with the above-described alignment mode B or C. In any of these alignment modes, however, a relatively long time, as compared with that of this embodiment, is required. According to this embodiment, a particular shot area, e.g. a shot area 13, is selected such as shown in FIG. 27A and, with respect to this selected shot area, the detection of the X, Y and θ deviations and the correcting movement therefor are first carried out (FIG. 27B). Subsequently, any deviation or deflection components DθX and DθY of the arrays of the shot areas relative to the X and Y directions, which deflection components have been caused by the correcting movement with respect to the shot area 13, are detected. On the basis of the result of detection, the succeeding movement of the wafer stage WS for the step-and-repeat exposure will be controlled.

First, a particular shot area such as the shot area 13 is specified or designated, and a counter is set in the random access memory shown in FIG. 14. Then, at Step SB21, a numeral "1" is set for the content "i" of the counter. The subsequent Steps SB221–SB223 and SB23 are similar to Steps SB11–SB 13 and SB2 described with reference to FIG. 24A. Since "i"=1, Step SB24 is followed by Step SB25 at which the operations similar to those of Step SC5–SC 102 and SC111–SC113 described with reference to FIG. 25B are effected. As a result, the wafer is moved into the state shown in FIG. 27B. Subsequently, at Step SB26, minute X and Y deviations XL1, YL1, XR1 and YR1, at two points, of the shot area 13 of the wafer WF, which is now in the FIG. 27B position, are stored in the random access memory RAM. Also, the X-Y co-ordinates P1X and P1Y of the center of the wafer stage (see part A of FIG. 28) is stored in the random access memory RAM (Step SB27). Next, the laser shutter BS is closed (Step SB29), and the sequence proceeds to Step SB30. At Step 30, whether or not the alignment of the reticle with the designated shot area through the TTL optical system and the detection of the positional deviations are good is discriminated. If not good, the sequence proceeds to Step SB37 which will be described later. If good, the sequence proceeds to Step SB31, so that the content "i" of the counter is renewed (i.e. numeral "1" is added). Therefore, "i"=2. Thus, the sequence proceeds to Step SB33 by way of Step SB32. At Step SB33, the wafer stage WS is moved in the X and Y directions by the motors XM and YM by a predetermined amounts, so as to locate a second designated shot area, e.g. shot area 19 in FIG. 13 or 27, at a position under the projection lens PO such as shown in a part (B) of FIG. 28. Subsequently, the sequence returns to Step SB23, whereby the laser shutter BS is opened again. Since, now, "i"=2, the sequence proceeds to Step SB28 in accordance with the result of discrimination at Step SB24. At Step SB28, X and Y deviations XL2, YL2, XR2 and YR2, at two points, of the second designated shot area 19 with respect to the reticle are detected and stored into the random access memory RAM. Also, at Step SB27, the X-Y coordinates P2X and P2Y of the center of the wafer stage WS when it is in the position shown in the part (B) of FIG. 28 are detected and stored into the random access memory RAM, as in the case of P1X and P1Y. It is to be noted that, in respect to the designated second shot area and any other designated shot areas following the second shot area, the correcting movement described with reference to Step SB25 is not effected.

Subsequently, the sequence proceeds to Steps SB29-SB31 which have already been described. If the number of shot areas, to be designated, has been preset as "2", then the sequence proceeds to Step SB34 in accordance with the discrimination at Step SB32 (since the content "i" has been renewed at Step SB31 so that, now, "i"=3). If, on the other hand, the number of shot areas to be designated has been preset as "4", the operations at Steps SB33, SB23, SB24 and SB28-SB31 are repeated twice with respect to two additional shot areas, e.g. shot areas 4 and 44, located substantially along the Y direction, such as shown in parts (C) and (D) of FIG. 28. As in the case of second designated shot area 19, only the detection of positional deviations is effected with respect to these shot areas 4 and 44. More particularly, the X and Y deviations XL3, YL3, XR3 and YR3, at two points, of the third designated shot area 4 and the X-Y coordinates P3X and P3Y of the center of the stage WS with respect to the detection of the third designated shot area 4; and the X and Y deviations XL4, YL4, XR4 and YR4, at two points, of the fourth designated shot area 44 and the X-Y co-ordinates P4X and P4Y of the center of the stage when it is at a position with respect to the detection of the fourth designated shot area 44 are detected and are all stored into the random access memory RAM. When this is completed, the sequence proceeds to Step SB34 in accordance with the discrimination at Step SB32.

If the operation at Step SB25 for aligning the first designated shot area with the reticle and/or the operation at Step SB28 for detecting deviations is not good for any reason, the sequence proceeds to Step 37 in accordance with the discrimination at Step SB30, as described in the foregoing. Step 37 is a step for discriminating whether or not there is any other shot area which has been designated by the operator. If there is, the sequence proceeds to Step SB39. if not so, the sequence proceeds to Step SB38. At Step SB39, the aforesaid other shot area is set as the "i-the" designated shot area. Subsequently, the sequence proceeds to Step SB33 and, therefore, the operation of Step SB25 or SB28 is repeated. Accordingly, the positioning and the detection of deviation are certainly carried out relative to all the desired two or four shot areas. Regarding Step SB39, as an example, a shot area 26 shown in FIG. 13 or 27 can be preselected by the operator, as the shot area to which the above-described positioning and detecting operation is to be made in a case where the positioning and detecting operation relative to the first designated shot area 13 is not good. At Step SB38, on the other hand, such a shot area that can be used as the TTL global alignment is automatically searched irrespective of that no shot area has been preselected by the operator as the aforesaid other shot area. This is achieved by selecting an arbitrary shot area and by discriminating at Step SB30 the state of "GOOD" or "NO GOOD". Thus, even if any errors occur, it is still possible to continue the sequence without delay.

After the positioning and/or detecting operation relative to each of all the designated shot areas is completed, the sequence proceeds to Step SB34 in accordance with the discrimination at Step SB32. At Step SB34, the following values are calculated:

(1) Averages of X and Y deviations of each of the designated shot areas:

$$SiX = (XLi + XRi)/2$$

$$SiY = (YLi + YRi)/2$$

(2) Expansion rate of the wafer as a whole in the X and Y directions:

$$MGX = (S2X - SiX)/DX = (S2X - S1X)/(P2X - P1X)$$

$$MGY = (S4Y - S3Y)/DY = (S4Y - S3Y)/(P4Y - P3Y)$$

(3) X and Y inclinations of a preset pair of designated shot areas:

$$OTX = D\theta X/DX = (S2Y - S1Y)/(P2X - P1X)$$

$$OTY = D\theta Y/DY = (S4Y - S3Y)/(P4Y - P3Y)$$

(4) Amount of correction relative to each of reference stepwise displacements STX and STY:

$$RSTX = STX \cdot MGX + STY \cdot OTY$$

$$RSTY = STY \cdot MGY + STX \cdot OTX$$

(5) X and Y deviations of each of the designated shot areas, calculated in view of the expansion/contraction rate and the inclination detected as above:

$$GLiX = SiX - (PiX \cdot MGX + PiY \cdot OTY)$$

$$GLiY = SiY - (PiY \cdot MGY + PiX \cdot OTY) \qquad (i=1-4)$$

(6) Averages of global X and Y deviations:

$$GLX = (GL1X + GL2X + GL3X + GL4X)/4$$

$$GLY = (GL1Y + GL2Y + GL3Y + GL4Y)/4$$

(7) Difference or deviation between the designated shot areas:

$$GLX - GLiX$$

$$GLY - GLiY \qquad (i=1-4)$$

(8) $\theta$ deviation of each of the designated shot areas:

$$\tan S\theta i = (YLi - YRi)/K \qquad (i=1-4)$$

where K is the distance between the right-hand side and the left-hand side alignment marks of each of the designated shot areas.

Among these calculations, equation (4) provides the amounts of correction for the stepwise movement in the X and Y directions for the sake of exposure of each of the shot areas, in the case of FIG. 27B. Equation (6) provides the amounts of correction necessary for locating the first shot area at a position under the projection lens PO.

More specifically, in order to obtain values of equation (4), the values of equations (1), (2) and (3) are calculated. Equation (1) is one for detecting the average X and Y deviations of one shot, similarly to the alignment modes B and C. For example, the average X and Y deviations of the first designated shot area 13 in FIG. 27B, in a case where "i"=1, are given by the following equations:

$$S1X = (XL1 + XR1)/2$$

$$S1Y = (YL1 + YR1)/2$$

Similar calculations are effected with respect to the cases "i"=2, "i"=3 and "i"=4, to thereby detect averages S2X, S2Y, S3X, S3Y, S4X and S4Y.

Subsequently, the expansion/contraction rates MGX and MGY of the wafer as a whole in the X and Y directions, due to the heat expansion or the like, are detected by equation (2). For example, the value MGX is obtainable by dividing, by the distance DX between the centers of a preset pair of designated shot areas (13 and 19), the amount of expansion/contraction of the wafer WF in the X direction which amount is obtained by subtracting an average X deviation S1X of the first designated shot area 13 from an average X deviation S2X of the second designated shot area 19 as detected by equation (1). The value DX is given by the difference "P2X-

P1X" in the position of the center of the wafer stage in the X direction, shown in the parts (A) and (B) of FIG. 28. Namely, the amount of displacement of the wafer stage from a position in which the first designated shot area 13 is placed under the projection lens PO (the FIG. 28A position) to a position in which the second designated shot area 19 is placed under the projection lens PO (the FIG. 28B position) corresponds to the distance DX of FIG. 27B. Similarly, the expansion/contraction rate MGY in the Y direction is obtainable from the results of detection with respect to the third and the fourth designated shot areas 4 and 44.

Subsequently, by equation (3), the inclination components OTX and OTY with respect to the X-axis and the Y-axis, respectively, of the pair of designated shot areas 13 and 19 and the pair of designated shot areas 4 and 44, respectively, are detected. For example, the value OTX denotes the inclination or gradient which is expressed by "D$\theta$X/DX" in FIG. 27B. The value D$\theta$X is equal to the difference of the Y deviations S1Y and S2Y of the pair of designated shot areas 13 and 19, so it is given by "S2Y-S1Y". The inclination component OTY with respect to the Y-axis is detectable in a similar manner. From the expansion/contraction rates MGX and MGY and from the inclination components OTX and OTY detected by equations (2) and (3), the amounts of correction RSTX and RSTY in the X and Y direction for the wafer stage movement are obtainable, in accordance with equation (4). Namely, the amounts of correcting displacements in the X and Y directions required for the overlay exposure of the wafer WF which is in the state of FIG. 27B are given by equation (4). The values STX and STY in equation (4) correspond respectively to the amounts of reference stepwise movement of the wafer stage in the X and Y directions necessary for achieving the step-and-repeat movement for the sake of sequential exposures of the shot areas on the wafer WF when it is in the state of FIG. 13. By controlling the stepwise movement of the wafer stage WS in the sequential manner and in accordance with equation (4), the shot areas 1–45 of the wafer WF shown in FIG. 27B can be exposed in sequence with high pattern overlay accuracies.

Further, by using equation (6), the center or optical axis of the objective lens PO can be correctly aligned with the center of each shot area. That is, according to equation (5), the X and Y deviations GLiX and GLiY of each of the designated shot areas, having considered the expansion/contraction rates and the inclination components described in the foregoing, are calculated. For example, If "i"=1, then:

$$GL1X=S1X-(P1X.MGX+P1Y.OTY)$$

Similarly, the deviations GL2X, GL3X and GL4X with respect to the second, third and fourth designated shot areas, respectively, are detected. An average of these deviations is detected according to equation (6). An average global Y deviation, GLY, is detectable in a similar manner.

The wafer stage WS is moved in accordance with values obtained by adding the thus detected deviations GLX and GLY respectively to predetermined values, i.e. the distances in the X and Y directions necessary for displacing the wafer stage from the FIG. 28D position to the FIG. 27B position (the first shot exposure position). By this, the center of the first shot area 1 can be aligned with the center of the projection lens PO.

Equation (7) is one for detecting the deviation or declination of the designated shot areas. For example, in respect to the first shot area 13, it "i"=1, then:

$$GLX-GL1X$$

is obtained.

Equation (8) is one for detecting the $\theta$ deviation of each of the designated shot areas and, if "i"=1, then, $$\tan S\theta 1=(YL1-YR1)/K$$

These values obtained by calculations, including those obtained from equations (2), (3), (7) and (8), are compared with respective tolerances (Step SB35). If all within respective tolerances, the sequence proceeds to Steps SA61 and SA62 described with reference to FIG. 23B. The amounts of movement of the wafer stage WS to be effected at Step SA61 are those including the global deviations GLX and GLY detected by equation (6). Also, the amounts of movement of the wafer stage to be effected at Step SA112 are those including RSTX and RSTY detected by equation (4). If the result of discrimination at Step SB35 shows that at least one of the above-mentioned values detected is out of a corresponding one of the tolerances, the sequence proceeds to Step SB36 which is a step of the operator's judgement. That is, by the operator's judgement, "RE-TRY" or "CONTINUE" is selected. If "RE-TRY" is selected, all the above-described operations, beginning at those related to the first designated shot area 13, are repeated. That is, the sequence returns to Step SB21. If, on the other hand, "CONTINUE" is selected, the sequential operations beginning from Steps SA61 and SA62 described with reference to FIG. 23B are forcibly selected. For the sake of the operator's judgement, the values detected as aforesaid are displayed in the TV monitor or outputted by the printer.

While the foregoing description has been made with respect to a case where two pairs, i.e. four, shot areas are designated such as shown in FIG. 28, this is not limitative. If, for example, the tendency of the Y deviation is generally or substantially the same as that of the X deviation, the alignment operation may be effected on the basis of:

$$MGY=MGX, \quad OTY=OTX, \quad \text{"i"}=2$$

Figure 29:
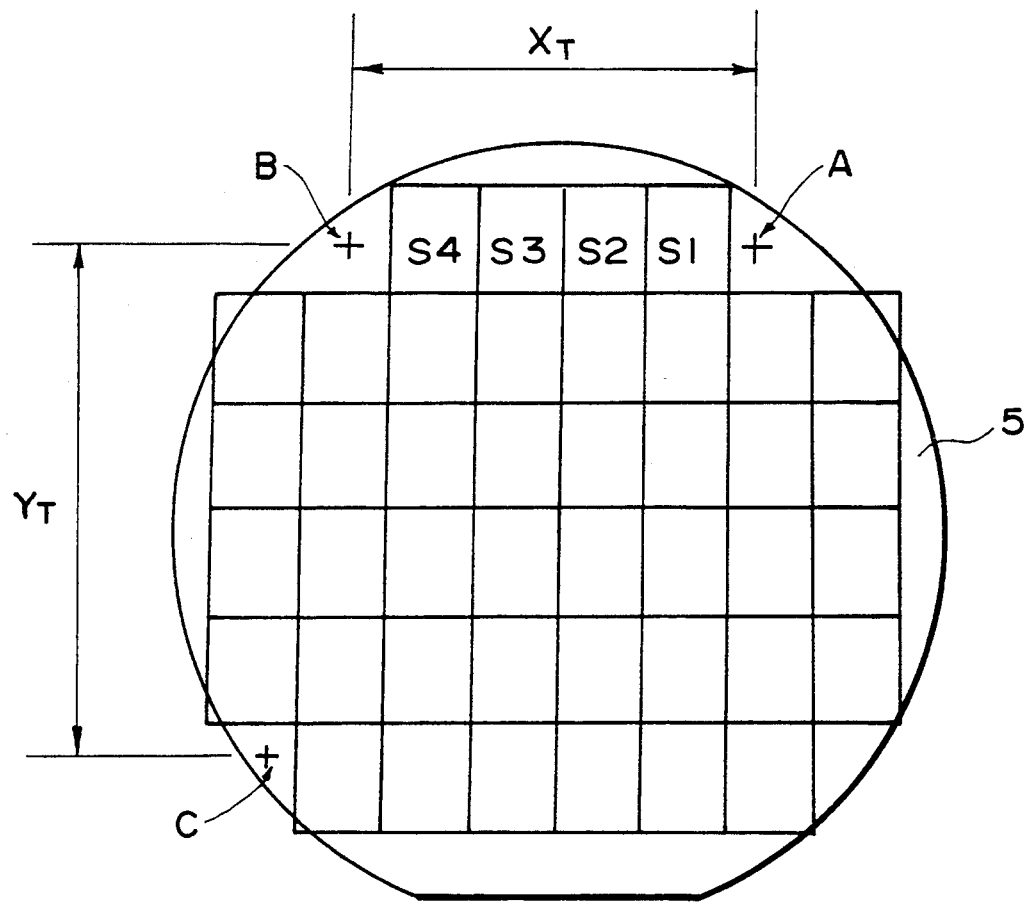
FIG. 29 is a plan view of a wafer, schematically showing an example of off-axis alignment operation according to the present invention.
Figure 30:
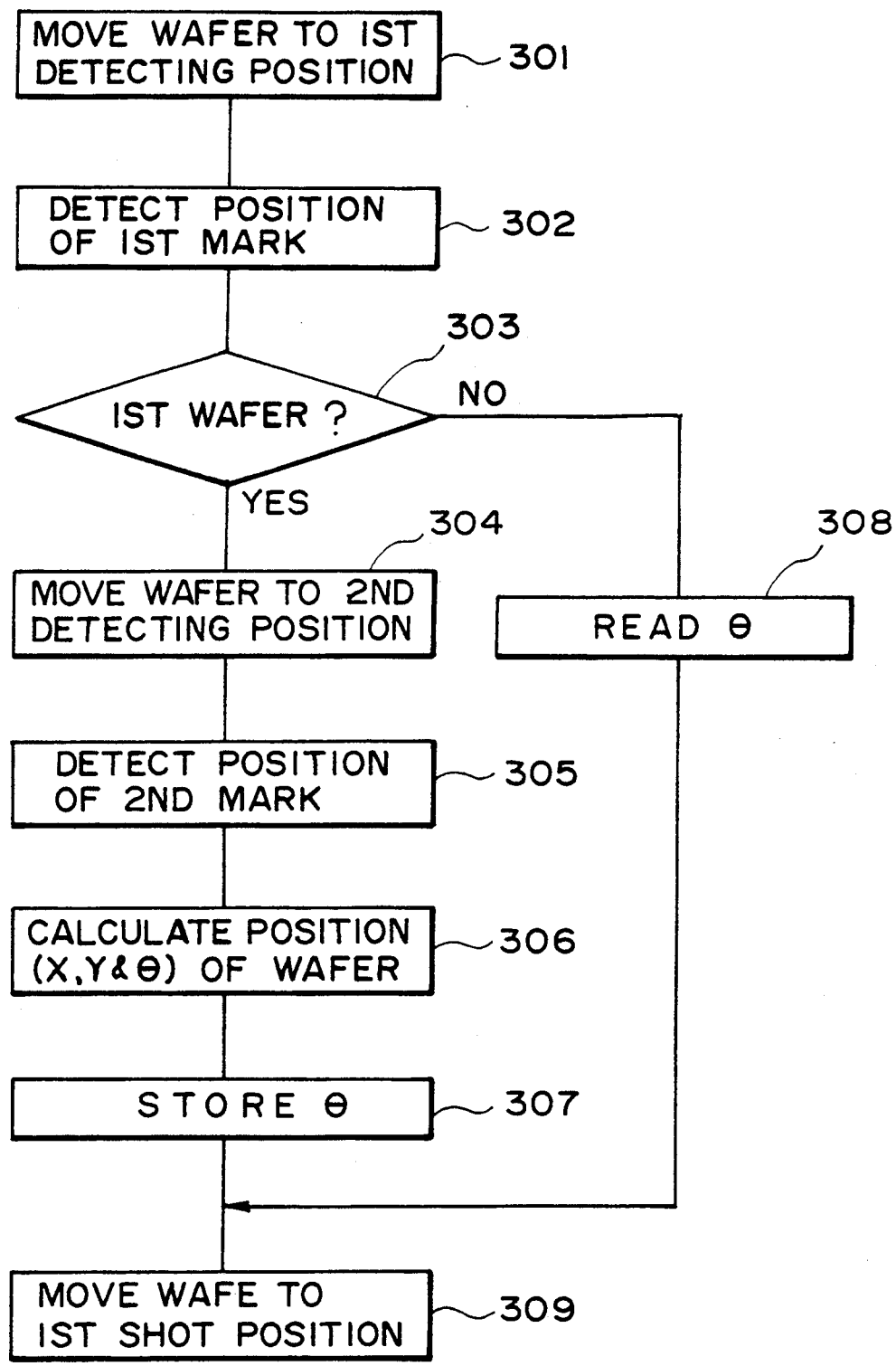
FIG. 30 is a flow chart showing the off-axis alignment operation on the basis of alignment marks shown in FIG. 29.

Referring now to FIGS. 29 and 30, another embodiment will be described.

As shown in FIG. 29, two, first and second alignment marks A and B are formed on the wafer WF at two spaced positions. First, the wafer stage WS is moved so that one of the two alignment marks, e.g. the first alignment mark A, is located within the view field of one of the optical systems OAR and OAL of the off-axis alignment system OA (FIG. 5). Hereinafter, the view field of each of the optical systems OAR and OAL will be referred to as the "TV view field". Subsequently, the position of the alignment mark A with respect to the X and Y directions is detected. Next, the wafer stage WS is moved in the X direction by a predetermined amount XT, so as to move the other alignment mark, i.e. the second alignment mark B, into the TV view field of the aforesaid one optical system OAR or OAL. Then, the position of the second alignment mark B with respect to the X and Y directions is detected similarly.

If the position of the alignment mark A in the X and Y directions is denoted by X1 and Y1, and when the position of the alignment mark B in the X and Y directions is denoted by X2 and Y2, then the inclination component $\theta$ of the wafer can be given by:

$$\theta = \tan^{-1}[(Y2-Y1)/(XT+X2-X1)] \quad (10)$$

wherein XT is the amount of movement of the wafer stage.

If the amount of movement XT is sufficiently large, the inclination component $\theta$ can be detected highly accurately. That is, the above-described method effectively assures high-accuracy detection of the inclination component $\theta$, simply by the movement of the wafer stage.

In the above-described example, the detection of the inclination component $\theta$ is based on detection of the two alignment marks A and B which are spaced from each other only in the X direction (the Y-component is the same). However, the inclination $\theta$ can of course be detected on the basis of detection of another pair of alignment marks, such as the alignment mark A and an alignment mark C, which are spaced from each other in the Y direction by an amount YT, as well as in the X direction. The inclination component in such case can be given by:

$$\theta = \tan^{-1}[(YT+Y2-Y1)/(XT+X2-X1)] \quad (11)$$

Usually, the off-axis alignment operation comprises a series of: a detecting operation for detecting the position of one alignment mark, such as the alignment mark A; an operation for moving the wafer stage to a position effective to detect another alignment mark, such as the alignment mark B; and a detecting operation for detecting the position of the other alignment mark such as the alignment mark B. Actually, such alignment operation requires a few seconds. Further, this alignment operation is necessary for each of plural wafers.

According to this embodiment of the present invention, only for the first one of a lot of wafers to be processed, the position detecting operation is effected on the basis of two alignment marks. However, relative to each of the subsequent wafers, the position detecting operation is effected on the basis of one alignment mark only. And, the correction of the inclination component $\theta$ is controlled on the basis of the information about the inclination component $\theta$ obtained with respect to the first wafer.

This will be described in more detail in conjunction with the flow chart of FIG. 30.

After the wafer WF is placed on the wafer stage WS, the wafer stage WS is moved to a predetermined position for detecting a first off-axis alignment mark, such as the alignment mark A in FIG. 29. Next, at Step 302, the position of the first alignment mark A on the wafer WF, more particularly the deviations X1 and Y1 in the X and Y directions of the position of the alignment mark A from an origin or reference which is defined at the center of the TV view field are detected. These X and Y deviations X1 and Y1 correspond to errors, in the X and Y directions, of the positioning of the wafer WF on the stage WS.

After completion of detection of the position of the first alignment mark A, the sequence proceeds to Step 303 at which whether or not the wafer WF carried by the wafer stage WS is the first wafer Is discriminated. If it is the first wafer, the sequence proceeds to Step 304.

At Step 304, the wafer stage WS is moved to a position for detecting a second off-axis alignment mark, such as the alignment mark B in FIG. 29. In the example of FIG. 29, the wafer stage WS is moved in the X direction by an amount XT. Subsequently, at Step 305, the position of the second alignment mark B, more particularly the X and Y deviations X2 and Y2 of the second alignment mark B are detected.

Next, at Step 306, the position of the wafer with respect to the X, Y and $\theta$ directions is calculated. At this time, the inclination component $\theta$ is detected in accordance with the above-described equation (10), while the X and Y deviations (X and Y) are obtained by averaging the X and Y deviations of the first and second alignment marks. That is:

$$X=(X1+X2)/2$$

$$Y=(Y1+Y2)/2$$

The inclination component $\theta$ detected at Step 306 is stored into the random access memory RAM (Step 307), for the sake of correction of the inclination component $\theta$ with respect to each of the wafers subsequent to the first wafer.

These errors in the positioning of the wafer on the wafer stage, detected in the manner described above, are added to the amounts of movement of the wafer stage in the X and Y directions, which amounts are determined by: the positional relation of the first and second alignment marks A and B with the first shot area S1 (FIG. 29); the positional relation between the off-axis alignment optical system OA and the projection lens PO; etc. So, at Step 309, the wafer stage WS is moved in the X and Y directions by the thus controlled amounts to a position for exposure of the first shot area S1.

After the movement of the wafer stage to the first-shot exposure position, the wafer WF and the reticle RT are aligned with each other in the above-described TTL die-by-die alignment manner, and exposures of the shot areas are effected in sequence.

When each of the wafers subsequent to the first wafer is to be processed, the operations of Steps 301 and 302 are carried out to detect the position of the first alignment mark A (FIG. 29) and, thereafter, the sequence proceeds to Step 308 in accordance with the result of discrimination at Step 303. At Step 308, the value of the inclination component $\theta$ which has been obtained with respect to the first wafer is read out from the memory RAM. On the basis of the thus obtained inclination component $\theta$ and the X and Y deviations X1 and Y1 of the first alignment mark A, the wafer stage WS is moved to the first-shot exposure position (Step 309).

The positioning of the first wafer at the fist-shot exposure position requires approximately 2–3 sec. due to the two-point detection and the required stage movement. However, as for the positioning of each of the wafers other than the first wafer, it only requires approximately one sec. to complete the detection in accordance with the present embodiment. Effectively, this leads to a substantial improvement of the throughput. It has been found by the present inventors that the value of inclination $\theta$ is generally determined by the difference in diameter of the wafers or by the type of the alignment process to which the wafer has been subjected during the preceding steps, so that the variation of inclination $\theta$ is relatively narrow with respect to the wafers in the same lot. This is why a sufficient position detecting accuracy is attainable despite that the data on the inclination $\theta$ with respect to the first wafer is used for the sake of positioning of the wafers subsequent to the first wafer. Particularly, in a case where a higher-accuracy alignment operation follows the off-axis alignment operation of the present embodiment, such as in the case of FIG. 5 arrangement, any error in the position detection which may be caused during the alignment process of this embodiment can be completely eliminated. Therefore, only the advantageous effects, i.e. the improvements in the throughput due to the reduction in time for the position detection, become very notable.

As for the position of the off-axis alignment mark to be defined on the wafer, the position of the alignment mark A is preferable as compared with those of the alignment marks B and C. This is because, among the alignment marks A–C, the alignment mark A is at a position closest to the first shot area S1. This means that the data on the position of the alignment mark A is less liable to include the inclination component $\theta$. Also, the amount of movement to the alignment mark A is small which leads to further improvements in the throughput. Accordingly, it is preferable to locate the first alignment mark at a position in the vicinity of the first shot area.

The concept of the present invention with reference to this embodiment is not limited to the disclosed form, and various modifications are possible. For example, the two-point detection may be effected once for each plural-number of wafers, as well as for the first wafer. As a further alternative, the two-point detection may be effected to one wafer, after the inclination component $\theta$, detected by the die-by-die alignment operation for the first shot area of the preceding wafer, becomes greater than a predetermined value, independently of the number of wafers having been treated.

While the above description has been made to an embodiment in which the result of the two-point detection is used as the data for correcting the inclination component $\theta$ which is not detected at the time of the one-point detection, this is not restrictive. For example, the data on the inclination component $\theta$ which has been obtained during the die-by-die alignment with respect to the first shot area of the preceding wafer, to which the one-point detection has been effected, may be used.

While, in the foregoing, the invention has been described with reference to a semiconductor device manufacturing alignment and exposure apparatus, this is not restrictive and the invention is applicable, for example, also to a wafer inspecting apparatus, a probing apparatus.

While the invention has been described with reference to the structures disclosed herein, it is not confined to the details set forth and this application is intended to cover such modifications or changes as may come within the scope of the following claims.

What is claimed is:

1. An exposure apparatus for exposing different zones of a workpiece to a pattern of an original with radiation, in a predetermined sequence, said apparatus comprising:
    first driving means for moving the workpiece along two orthogonal directions, relative to the original, to allow sequential exposures of the zones of the workpiece to the pattern of the original;
    detecting means for detecting an alignment mark of the original and for detecting alignment marks of particular zones of the workpiece through the original to determine a positional relationship of the workpiece with respect to the original, wherein said detecting means is effective to determine an overall rotational error of the workpiece with respect to the original;
    second driving means for moving the workpiece relative to the original in a rotational direction in accordance with the determined overall rotational error of the workpiece; and
    control means for controlling said first driving means when said first driving means moves the workpiece in said two orthogonal directions for the sequential exposure of the different zones of the workpiece, to substantially eliminate any remainder of the overall rotational error of the workpiece.

2. An apparatus according to claim 1, further comprising a projection optical system for projecting the pattern of the original onto the workpiece, wherein said detecting means detects the alignment mark of the original and the alignment marks of the workpiece by using said projection optical system.

3. An alignment method usable in an exposure apparatus for exposing different zones of a workpiece to a pattern of an original with radiation, in a predetermined sequence, while moving the workpiece along two orthogonal directions, relative to the original, to allow sequential exposure of the zones of the workpiece to the pattern of the original, said method comprising the steps of:
    detecting an alignment mark of the original and detecting alignment marks of particular zones of the workpiece through the original to determine a positional error of each of the particular zones of the workpiece with respect to the original and also to determine an overall rotational error of the workpiece with respect to the original;
    moving the workpiece relative to the original in a rotational direction in accordance with the determined overall rotational error of the workpiece; and
    controlling, when the workpiece is moved in the two orthogonal directions for the sequential exposure of the different zones of the workpiece, the movement of the workpiece in the two orthogonal directions so as to substantially eliminate the positional error of each of the particular zones of the workpiece and to substantially eliminate any remainder of the overall rotational error of the workpiece.

4. An alignment method usable in an exposure apparatus for exposing different zones of a workpiece to a pattern of an original with radiation, in a predetermined sequence, while moving the workpiece along two orthogonal directions, relative to the original, to allow sequential exposure of the zones of the workpiece to the pattern of the original, said method comprising the steps of:
    setting the original on a first stage of the exposure apparatus, by using a setting mark provided on the original;
    setting the workpiece on a second stage of the exposure apparatus, by using a pre-alignment mark provided on the workpiece;
    detecting an alignment mark of the original and detecting alignment marks of particular zones of the workpiece through the original to determine a positional error of each of the particular zones of the workpiece with respect to the original and also to determine an overall rotational error of the workpiece with respect to the original;

moving the workpiece relative to the original in a rotational direction in accordance with the determined overall rotational error of the workpiece; and moving the second stage in the two orthogonal directions for the sequential exposure of the different zones of the workpiece so as to substantially eliminate the positional error of each of the particular zones of the workpiece and also to substantially eliminate any remainder of the overall rotational error of the workpiece.

5. A method according to claim 4, wherein the exposure apparatus includes a projection lens system for projecting the pattern of the original to the workpiece, and wherein said original setting step comprises the step of setting the original while using the projection lens system as a reference, and wherein said detecting step comprises the step of detecting the alignment mark of the original and the alignment marks of the workpiece through the projection lens system for a determination of the overall rotational error of the workpiece.

6. A method according to claim 5, wherein the exposure apparatus further includes an off-axis optical system, and wherein said method further comprises the step of detecting the pre-alignment mark of the workpiece through the off-axis optical system for the setting of the workpiece on the second stage.

7. A method according to claim 6, wherein the exposure apparatus includes a laser interferometer for measuring the position of the second stage in the orthogonal directions, and wherein said second stage moving step comprises the step of controlling the movement of the second stage by using the laser interferometer.

8. A semiconductor device manufacturing method usable with a workpiece having different zones, comprising the steps of:

detecting positional errors of at least two zones, respectively, with respect to a reference mark, by using respective alignment marks of said at least two zones;

calculating an overall rotational error of the workpiece in a $\theta$ direction, by using the detected positional errors;

rotationally moving the workpiece in the $\theta$ direction to substantially correct the overall rotational error; and printing, after said rotational moving step, a pattern of an original on each zone of the workpiece while controlling movement of the workpiece in X and Y directions so as to correct any remainder of the overall rotational error of the workpiece.

9. A method according to claim 8, wherein said method further comprises the step, prior to said detecting step, of adjusting the position of the original by using a set mark provided on the original while the position of the workpiece is adjusted by using a prealignment mark provided on the workpiece.

10. A method according to claim 9, wherein said printing step comprises the step of printing the pattern of the original on each zone of the workpiece through a projection lens system and, with respect to the projection lens system, adjusting the position of the original.

11. A method according to claim 10, further comprising the step of detecting the prealignment mark of the workpiece through a detection optical system different from the projection lens system.

12. A method according to claim 11, wherein said controlling movement of the workpiece step comprises the step of controlling the movement of the workpiece in the X and Y directions on the basis of measurement through a laser interferometer.

13. An exposure apparatus usable with a workpiece having different zones, comprising:

detecting means for detecting positional errors of at least two zones, respectively, with respect to a reference mark, by using respective alignment marks provided in these zones;

processing means for determining an overall rotational error of the workpiece in a $\theta$ direction, by using the detected positional errors;

driving means for rotationally moving the workpiece in the $\theta$ direction to substantially correct the overall rotational error; and X–Y stage means for moving the workpiece in X and Y directions, when a pattern of an original is to be printed on each zone of the workpiece, so as to correct any remainder of the overall rotational error of the workpiece.

14. An apparatus according to claim 13, further comprising a projection lens system for projecting the pattern of the original on the workpiece, wherein the position of the original is adjusted with respect to said projection lens system.

15. An apparatus according to claim 14, further comprising an off-axis optical system different from said projection lens system, for detecting a prealignment mark provided on the workpiece.

16. An apparatus according to claim 15, further comprising a laser interferometer for measuring the position of the workpiece with respect to the X and Y directions, wherein the movement of the workpiece in the X and Y directions is controlled on the basis of the measurement through said laser interferometer.

17. An exposure method for exposing a workpiece having different zones, comprising the steps of:

detecting positional errors of at least two zones, respectively, with respect to a reference mark, by using respective alignment marks of at least two zones;

determining an overall rotational error of the workpiece in a $\theta$ direction, by using the detected positional errors;

rotationally moving the workpiece in the $\theta$ direction to substantially correct the overall rotational error; and printing, after said rotational moving step, a pattern of an original on each zone of the workpiece while controlling movement of the workpiece in X and Y directions so as to correct any remainder of the overall rotational error of the workpiece.

18. A method according to claim 17, wherein said method further comprises the step of adjusting, prior to said detecting step, the position of the original by using a set mark provided on the original while the position of the workpiece is adjusted by using a prealignment mark provided on the workpiece.

19. A method according to claim 18, wherein said printing step comprises the step of printing the pattern of the original on each zone of the workpiece through a projection lens system and wherein, with respect to the projection lens system, adjusting the position of the original.

20. A method according to claim 19, further comprising the step of detecting the prealignment mark of the workpiece through a detection optical system different from the projection lens system.

21. A method according to claim 20, wherein said controlling movement of the workpiece step comprises the step of controlling the movement of the workpiece in the X and Y directions on the basis of measurement through a laser interferometer.

* * * * *

UNITED STATES PATENT AND TRADEMARK OFFICE
CERTIFICATE OF CORRECTION

PATENT NO. : 5,365,342  
DATED : November 15, 1994  
INVENTOR(S) : Naoki Ayata, et al.

Page 1 of 5

It is certified that error appears in the above-indentified patent and that said Letters Patent is hereby corrected as shown below:

[57] Abstract

Line 8, "which" should be deleted.

SHEET 10 OF THE DRAWINGS

Figure 11

"TARGE" should read --TARGET--.

SHEET 24 OF THE DRAWINGS

Figure 21

"DETECK" should read --DETECT--.

SHEET 29 OF THE DRAWINGS

Figure 22E

"DARK-FIELED" should read --DARK-FIELD--.

SHEET 41 OF THE DRAWINGS

Figure 25C

"MIRROS" should read --MIRRORS--.

SHEET 43 OF THE DRAWINGS

Figure 26B

"DEVITIONS" should read --DEVIATIONS--.

UNITED STATES PATENT AND TRADEMARK OFFICE
CERTIFICATE OF CORRECTION

PATENT NO. : 5,365,342

DATED : November 15, 1994

INVENTOR(S) : Naoki Ayata, et al.

Page 2 of 5

It is certified that error appears in the above-indentified patent and that said Letters Patent is hereby corrected as shown below:

COLUMN 2

Figure 20C:
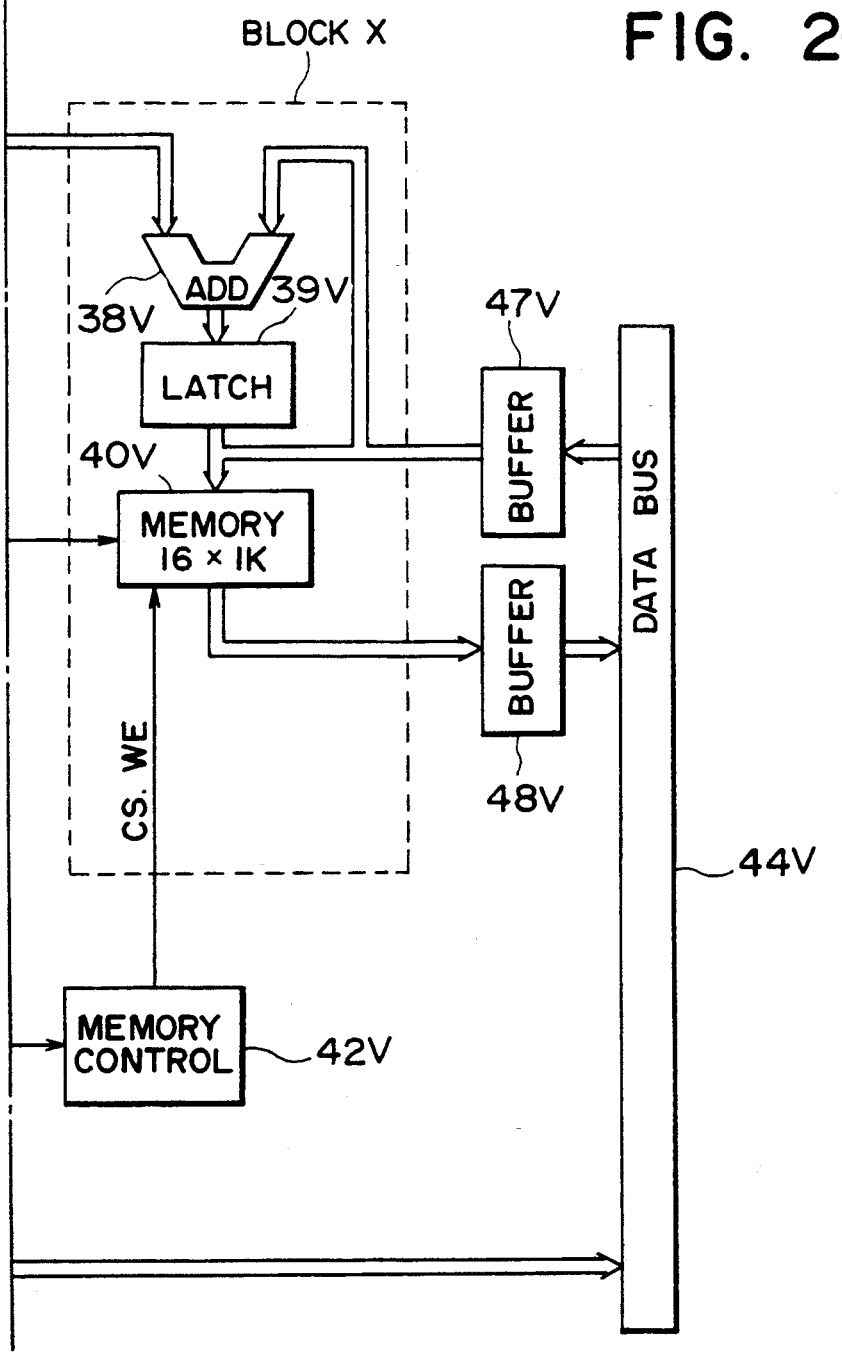

Line 26, "FIGS. 17(a-d)" should read --FIGS. 17A-17D--.
Line 31, "FIG. 19" should read --FIGS. 19A-19E--.
Line 33, "FIGS. 20(a-c)" should read --FIGS. 20A-20C--.
Line 45, "FIGS. 28(a-d)" should read --FIGS. 28A-28D--.

COLUMN 6

Line 12, "reflected" should read --being reflected--.

COLUMN 8

Line 43, "Thus, the" should read --Thus, if the--.

COLUMN 19

Line 49, "unpreferable" should read --undesirable--.
Line 57, "is" should read --are--.

COLUMN 21

Line 22, "therein data" should read --Therein the data--.

COLUMN 23

Line 21, "of" (first occurrence) should read --or--.

COLUMN 24

Line 10, "not." should read --not--.

UNITED STATES PATENT AND TRADEMARK OFFICE
CERTIFICATE OF CORRECTION

PATENT NO. : 5,365,342
DATED : November 15, 1994
INVENTOR(S) : Naoki Ayata, et al.

It is certified that error appears in the above-indentified patent and that said Letters Patent is hereby corrected as shown below:

COLUMN 27

Line 64, ". alignment" should read --alignment--.

COLUMN 29

Line 37, "Dr" should read --or--.
Line 44, "light-hand" should read --right-hand--.

COLUMN 30

Line 10, "of" should be deleted.
Line 60, "O direction" should read --$\theta$ direction--.

COLUMN 32

Line 50, "$\div$ K" should read --$\dot{=}$ K--.
Line 68, "servo." should read --servo--.

COLUMN 34

Line 2, "is" should read --are--.
Line 41, "is" should read --are--.

COLUMN 35

Line 46, "are" should read --area--.

COLUMN 36

Line 53, "and/orc" should read --and/or--.

UNITED STATES PATENT AND TRADEMARK OFFICE
CERTIFICATE OF CORRECTION

PATENT NO. : 5,365,342
DATED : November 15, 1994
INVENTOR(S) : Naoki Ayata, et al.

It is certified that error appears in the above-indentified patent and that said Letters Patent is hereby corrected as shown below:

COLUMN 38

Line 19, "co-ordinates" should read --coordinates--.
Line 34, "a" (first occurrence) should be deleted.

COLUMN 39

Line 24, "i-the" should read --i-th--.
Line 60, "(S4Y $\div$ S3Y)" should read --S4Y-S3Y--.

COLUMN 43

Line 67, "Is" should read --is--.

COLUMN 44

Line 22, "{Step" should read --(Step --.

UNITED STATES PATENT AND TRADEMARK OFFICE
CERTIFICATE OF CORRECTION

PATENT NO. : 5,365,342
DATED : November 15, 1994
INVENTOR(S) : Naoki Ayata, et. al.

It is certified that error appears in the above-indentified patent and that said Letters Patent is hereby corrected as shown below:

Column 45

Line 32, "ral-number" should read --ral number--.

Signed and Sealed this

Eighteenth Day of April, 1995

Attest:

BRUCE LEHMAN

Attesting Officer

Commissioner of Patents and Trademarks